United States Patent
Shiina et al.

(10) Patent No.: US 12,035,063 B2
(45) Date of Patent: Jul. 9, 2024

(54) SOLID-STATE IMAGING DEVICE AND ELECTRONIC APPARATUS

(71) Applicants: Sony Group Corporation, Tokyo (JP); Sony Semiconductor Solutions Corporation, Kanagawa (JP)

(72) Inventors: Kimiyasu Shiina, Tokyo (JP); Kei Nakagawa, Kanagawa (JP); Atsushi Suzuki, Kanagawa (JP); Shuntaro Izumi, Kanagawa (JP); Kohei Yamada, Kanagawa (JP)

(73) Assignees: Sony Group Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/017,526

(22) PCT Filed: Sep. 2, 2021

(86) PCT No.: PCT/JP2021/032248
§ 371 (c)(1),
(2) Date: Jan. 23, 2023

(87) PCT Pub. No.: WO2022/059499
PCT Pub. Date: Mar. 24, 2022

(65) Prior Publication Data
US 2023/0362518 A1    Nov. 9, 2023

(30) Foreign Application Priority Data
Sep. 16, 2020   (JP) ................................. 2020-155715

(51) Int. Cl.
*H04N 25/79* (2023.01)
*H04N 25/13* (2023.01)
(Continued)

(52) U.S. Cl.
CPC .......... *H04N 25/79* (2023.01); *H04N 25/131* (2023.01); *H04N 25/134* (2023.01); *H04N 25/65* (2023.01);
(Continued)

(58) Field of Classification Search
CPC ........ H04N 25/77; H04N 25/78; H04N 25/79; H04N 25/131; H04N 25/134
See application file for complete search history.

(56) References Cited

U.S. PATENT DOCUMENTS

2018/0109750 A1* 4/2018 Sukegawa ............. H04N 25/79
2019/0110686 A1  4/2019 Kato
(Continued)

FOREIGN PATENT DOCUMENTS

JP    2013051674 A    3/2013
JP    2013070030 A    4/2013
(Continued)

OTHER PUBLICATIONS

International Search Report (PCT/ISA/210), International Application No. PCT/JP2021/032248, dated Oct. 5, 2021.

*Primary Examiner* — Thanh Luu
(74) *Attorney, Agent, or Firm* — Michael Best & Friedrich LLP

(57) ABSTRACT

Accuracy of results obtained by integrally processing information acquired by different sensors is improved. A solid-state imaging device according to an embodiment includes: a first sensor that detects light in a first wavelength band; and a second sensor that detects light of a second wavelength band different from the first wavelength band, in which the first sensor includes a first pixel (110) that detects light of the first wavelength band in incident light, and the second sensor (Continued)

includes a second pixel (110) that detects light in the second wavelength band that has transmitted through the first pixel among the incident light.

16 Claims, 42 Drawing Sheets

(51) Int. Cl.
  *H04N 25/131* (2023.01)
  *H04N 25/65* (2023.01)
  *H04N 25/766* (2023.01)
  *H04N 25/77* (2023.01)
  *H04N 25/78* (2023.01)

(52) U.S. Cl.
  CPC .......... *H04N 25/766* (2023.01); *H04N 25/77* (2023.01); *H04N 25/78* (2023.01)

(56) References Cited

U.S. PATENT DOCUMENTS

| | | | |
|---|---|---|---|
| 2020/0236312 A1* | 7/2020 | Murata | H01L 27/14645 |
| 2022/0020794 A1* | 1/2022 | Heo | H01L 27/14618 |

FOREIGN PATENT DOCUMENTS

| | | |
|---|---|---|
| JP | 2016058532 A | 4/2016 |
| JP | 2016058866 A | 4/2016 |
| JP | 2018037479 A | 3/2018 |
| JP | 2018085645 A | 5/2018 |
| JP | 2018125848 A | 8/2018 |
| JP | 2020021855 A | 2/2020 |
| WO | 2013145753 A1 | 10/2013 |
| WO | 2019131965 A1 | 7/2019 |
| WO | WO-2019220897 A1 | 11/2019 |
| WO | 2019240121 A1 | 12/2019 |
| WO | 2020080327 A1 | 4/2020 |

* cited by examiner

SOLID-STATE IMAGING DEVICE AND ELECTRONIC APPARATUS

FIELD

The present disclosure relates to a solid-state imaging device and an electronic apparatus.

BACKGROUND

In recent years, development of a sensor fusion technology for integrally processing information acquired by a plurality of types of sensors has been strongly demanded along with the autonomous operation of mobile bodies such as automobiles and robots and the spread of Internet of Things (IoT) and the like. For example, Patent Literatures 1 and 2 disclose a technique of acquiring a color image of visible light and a monochrome image of infrared light using an image sensor that detects visible light and an image sensor that detects infrared light.

CITATION LIST

Patent Literature

Patent Literature 1: JP 2020-21855 A
Patent Literature 2: JP 2018-125848 A

SUMMARY

Technical Problem

However, in the related art, since simultaneity and coaxiality are not secured between pieces of information acquired by different sensors, there is a possibility that accuracy of a result obtained by integrally processing these pieces of information deteriorates. For example, in a case where separate sensor chips are used for an image sensor that acquires a color image and an image sensor that acquires a monochrome image, there is a case where a spatial deviation occurs between the color image and the monochrome image, deteriorating accuracy of a processing result. In addition, in a case an image sensor that acquires a color image and an image sensor that acquires a monochrome image are used at different timings, there is a case where a temporal deviation occurs between the color image and the monochrome image, deteriorating accuracy of a processing result.

Therefore, the present disclosure proposes a solid-state imaging device and an electronic apparatus capable of improving accuracy of a result obtained by integrally processing information acquired by different sensors.

Solution to Problem

To solve the problems described above, a solid-state imaging device according to an embodiment of the present disclosure includes: a first sensor that detects light in a first wavelength band; and a second sensor that detects light of a second wavelength band different from the first wavelength band, wherein the first sensor includes a first pixel that detects light of the first wavelength band in incident light, and the second sensor includes a second pixel that detects light in the second wavelength band that has transmitted through the first pixel among the incident light.

DESCRIPTION OF EMBODIMENTS

Figure 1:
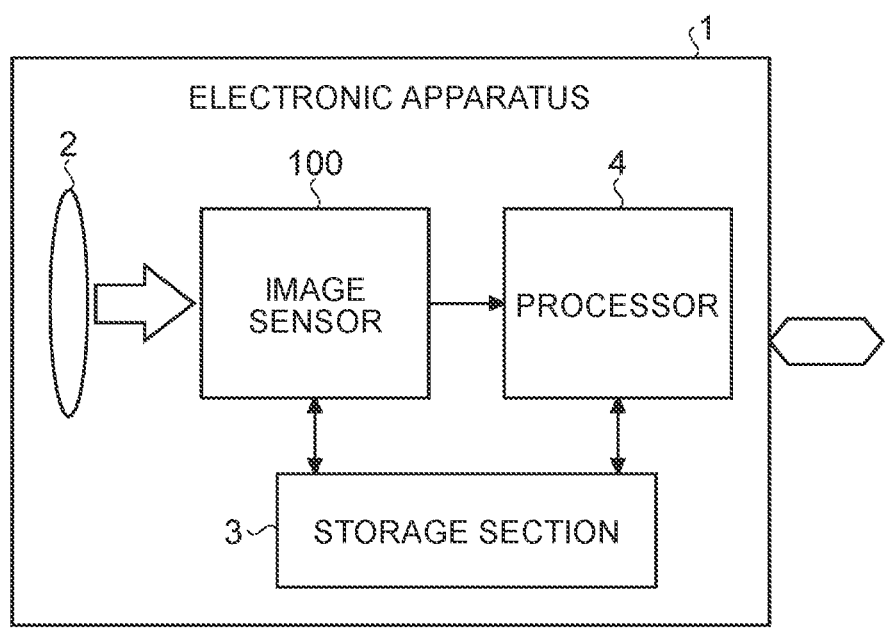
FIG. 1 is a block diagram depicting a schematic configuration example of an electronic apparatus equipped with an image sensor according to a first embodiment.

Hereinafter, embodiments of the present disclosure will be described in detail with reference to the drawings. Note that, in each of the following embodiments, the same parts are denoted by the same reference numerals, and redundant description will be omitted.

In addition, the present disclosure will be described according to the following item order.

1. First Embodiment
  1.1 Configuration example of electronic apparatus
  1.2 Configuration example of image sensor
  1.3 Configuration example of pixel array section
  1.4 Circuit configuration example of unit pixel
  1.5 Modification of circuit configuration
    1.5.1 First modification
    1.5.2 Second modification
    1.5.3 Third modification
  1.6 Cross-sectional structure example of unit pixel
  1.7 Organic material
  1.8 Planar structure example
  1.9 Wiring example of pixel drive line
  1.10 Stacked structure example of image sensor
  1.11 Pixel drive and readout method
    1.11.1 First example
    1.11.2 Second example
    1.11.3 Third example
    1.11.4 Fourth example
    1.11.5 Fifth example
    1.11.6 Sixth example
    1.11.7 Seventh example
    1.11.8 Eighth example
    1.11.9 Ninth example
    1.11.10 10th example
    1.11.11 11th example
  1.12 Action and effect
2. Second Embodiment
  2.1 Configuration example of pixel array section
  2.2 Circuit configuration example of unit pixel
  2.3 Cross-sectional structure example of unit pixel
  2.4 Planar structure example
  2.5 Modification of on-chip lens
  2.6 Modification of color filter array
  2.7 Action and effect
3. Application example to mobile body 1. First Embodiment First, a solid-state imaging device (hereinafter, referred to as an image sensor) and an electronic apparatus according to a first embodiment will be described in detail with reference to the drawings. Note that, in the present embodiment, a case where the technology according to the present embodiment is applied to a complementary metal-oxide semiconductor (CMOS) image sensor will be exemplified, but the present invention is not limited to this. For example, the technology according to the present embodiment can be applied to various sensors including a photoelectric conversion element, such as a charge-coupled device (CCD) image sensor, a time-of-flight (ToF) sensor, and an event vision sensor (EVS).

1.1 Configuration Example of Electronic Apparatus

FIG. 1 is a block diagram depicting a schematic configuration example of an electronic apparatus equipped with an image sensor according to a first embodiment. As depicted in FIG. 1, an electronic apparatus 1 includes, for example, an imaging lens 2, an image sensor 100, a storage section 3, and a processor 4.

The imaging lens 2 is an example of an optical system that condenses incident light and forms its image on a light receiving surface of the image sensor 100. The light receiving surface may be a surface on which photoelectric conversion elements in the image sensor 100 are arranged. The image sensor 100 photoelectrically converts the incident light to generate image data. In addition, the image sensor 100 executes predetermined signal processing such as noise removal and white balance adjustment on the generated image data.

The storage section 3 includes, for example, a flash memory, a dynamic random access memory (DRAM), a static random access memory (SRAM), and the like, and records image data and the like input from the image sensor 100.

The processor 4 is configured using, for example, a central processing unit (CPU) and the like, and may include an application processor that executes an operating system, various application software, and the like, a graphics processing unit (GPU), a baseband processor, and the like. The processor 4 executes types of processing as necessary on the image data input from the image sensor 100, the image data read out from the storage section 3, and the like, executes display to the user, and transmits the image data to the outside via a predetermined network.

In addition, the processor 4 integrally processes a color image read out from an RGB pixel 10 and a monochrome image (IR image) read out from an IR pixel 20 to be described later, executing various types of processing such as a distance measuring processing and a recognition processing.

1.2 Configuration Example of Image Sensor

Figure 2:
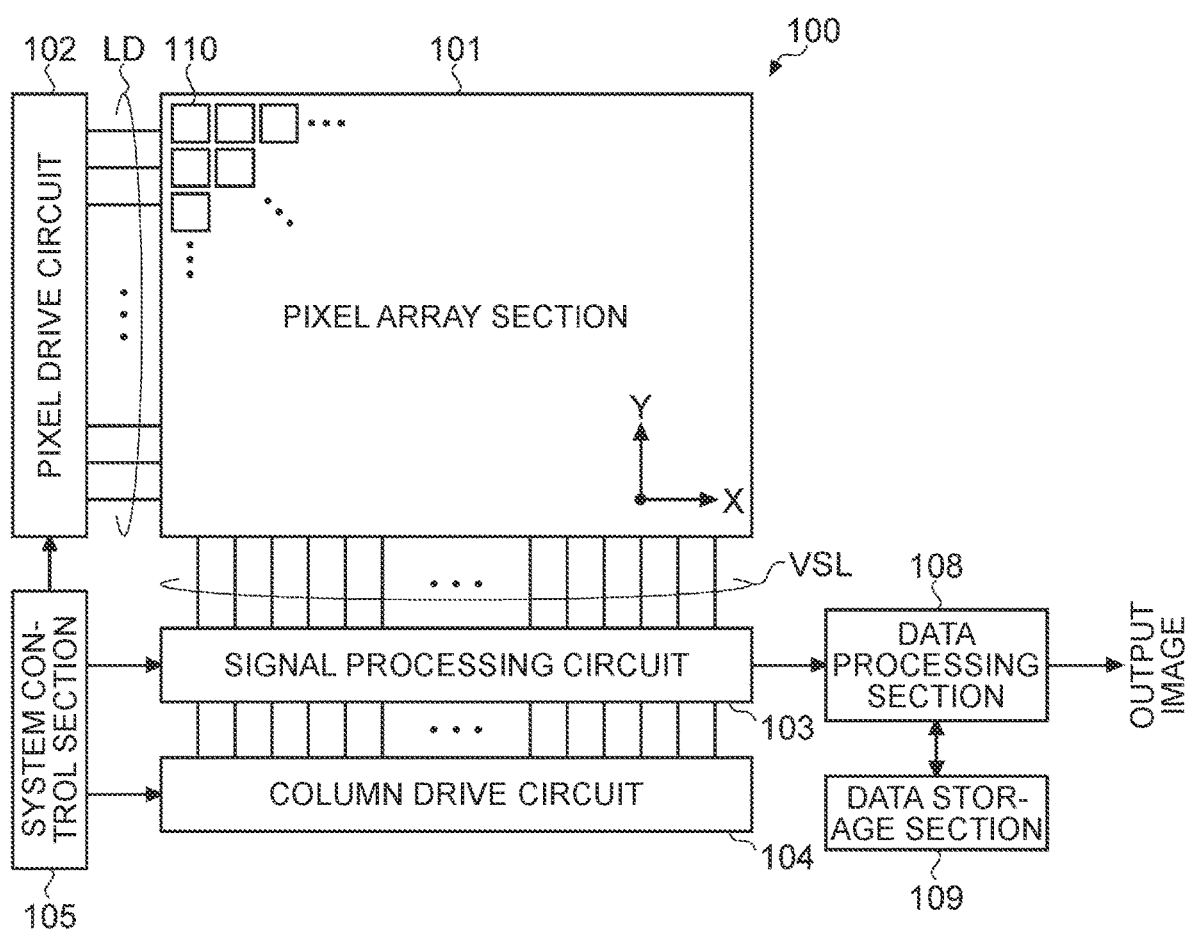
FIG. 2 is a block diagram depicting a schematic configuration example of a CMOS image sensor according to the first embodiment.

FIG. 2 is a block diagram depicting a schematic configuration example of a CMOS image sensor according to the first embodiment.

The image sensor 100 according to the present embodiment has, for example, a stack structure in which a semiconductor chip on which a pixel array section 101 is formed and a semiconductor chip on which a peripheral circuit is formed are stacked. The peripheral circuit may include, for example, a pixel drive circuit 102, a signal processing circuit 103, a column drive circuit 104, and a system control unit 105.

The image sensor 100 further includes a data processing unit 108 and a data storage section 109. The data processing unit 108 and the data storage section 109 may be provided on the same semiconductor chip as the peripheral circuit, or may be provided on another semiconductor chip.

The pixel array section 101 has a configuration in which unit pixels (hereinafter, it may be simply described as "pixel") 110 each having a photoelectric conversion element that generates and accumulates charges according to the amount of received light are disposed in a row direction and a column direction, that is, in a two-dimensional lattice shape in a matrix. Here, the row direction refers to an arrangement direction of pixels in a pixel row (lateral direction in drawings), and the column direction refers to an arrangement direction of pixels in a pixel column (longitudinal direction in drawings). Specific circuit configurations and pixel structures of the unit pixels will be described later in detail.

In the pixel array section 101, a pixel drive line LD is wired along the row direction for each pixel row, and a vertical signal line VSL is wired along the column direction for each pixel column with respect to the matrix-like pixel array. The pixel drive line LD transmits a control signal for driving when a signal is read out from a pixel. In FIG. 2, the pixel drive lines LD are depicted as wiring lines one by one, but are not limited to wiring lines one by one. One end of the pixel drive line LD is connected to an output terminal corresponding to each row of the pixel drive circuit 102.

The pixel drive circuit 102 includes a shift register, an address decoder, and the like, and drives each pixel of the pixel array section 101 simultaneously for all pixels or in units of rows. That is, the pixel drive circuit 102 includes a driving unit that controls the operation of each pixel of the pixel array section 101 together with the system control unit 105 that controls the pixel drive circuit 102. Although a specific configuration of the pixel drive circuit 102 is not depicted, the pixel drive circuit 102 generally includes two scanning systems of a readout scanning system and a sweep scanning system.

In order to read out a signal from the unit pixel, the readout scanning system sequentially selects and scans the unit pixel of the pixel array section 101 in units of rows. The signal read out from the unit pixel is an analog signal. The sweep scanning system performs sweep scanning on a read row on which read scanning is performed by the readout scanning system prior to the readout scanning by an exposure time.

By the sweep scanning by the sweep scanning system, unnecessary charges are swept out from the photoelectric conversion element of the unit pixel of the read row, and the photoelectric conversion element is reset. Then, by sweeping out (resetting) unnecessary charges in the sweeping scanning system, a so-called electronic shutter operation is performed. Here, the electronic shutter operation refers to an operation of discarding charges of the photoelectric conversion element and newly starting exposure (starting accumulation of charges).

The signal read out by the readout operation by the readout scanning system corresponds to the amount of light received after the immediately preceding readout operation or electronic shutter operation. Then, a period from the readout timing by the immediately preceding readout operation or the sweep timing by the electronic shutter operation to the readout timing by the current readout operation is the charge accumulation period (exposure period) in the unit pixel.

The signal output from each unit pixel of the pixel row selectively scanned by the pixel drive circuit 102 is input to the signal processing circuit 103 through each of the vertical signal line VSL for each pixel column. The signal processing circuit 103 performs predetermined signal processing on the signal output from each unit pixel of the selected row through the vertical signal line VSL for each pixel column of the pixel array section 101, and temporarily holds the pixel signal after the signal processing.

Specifically, the signal processing circuit 103 performs at least noise removal processing, for example, correlated double sampling (CDS) processing as signal processing and double data sampling (DDS). For example, by the CDS processing, fixed pattern noise unique to pixels such as reset noise and threshold variation of the amplification transistor in the pixel is removed. The signal processing circuit 103 also has, for example, an analog-digital (AD) conversion function, converts an analog pixel signal read out from the photoelectric conversion element into a digital signal, and outputs the digital signal.

The column drive circuit 104 includes a shift register, an address decoder, and the like, and sequentially selects a readout circuit (hereinafter, referred to as a pixel circuit)

corresponding to the pixel column of the signal processing circuit 103. By the selective scanning by the column drive circuit 104, the pixel signals subjected to the signal processing for each pixel circuit in the signal processing circuit 103 are sequentially output.

The system control unit 105 includes a timing generator that generates various timing signals and the like, and performs drive control of the pixel drive circuit 102, the signal processing circuit 103, and the column drive circuit 104 based on various timings generated by the timing generator.

The data processing unit 108 has at least an arithmetic processing function, and performs various types of signal processing such as arithmetic processing on the image signal output from the signal processing circuit 103. The data storage section 109 temporarily stores data necessary for signal processing in the data processing unit 108.

Note that the image data output from the data processing unit 108 may be subjected to predetermined processing in the processor 4 and the like in the electronic apparatus 1 equipped with the image sensor 100, or may be transmitted to the outside via a predetermined network, for example.

1.3 Configuration Example of Pixel Array Section

Next, a configuration example of the pixel array section 101 will be described. Note that, here, a case where the unit pixel 110 includes an RGB pixel for acquiring a color image of three primary colors of RGB and an IR pixel for acquiring a monochrome image of infrared (IR) light will be described as an example. For example, an RGB pixel can correspond to an example of a first pixel in the claims, an IR pixel can correspond to an example of a second pixel in the claims, a sensor including the RGB pixel can correspond to an example of a first sensor in the claims, and a sensor including the IR pixel can correspond to an example of a second sensor in the claims. In addition, visible light including the three primary colors of RGB can correspond to, for example, an example of light in the first wavelength band in the claims, and IR light can correspond to, for example, an example of light in the second wavelength band in the claims.

Figure 3:
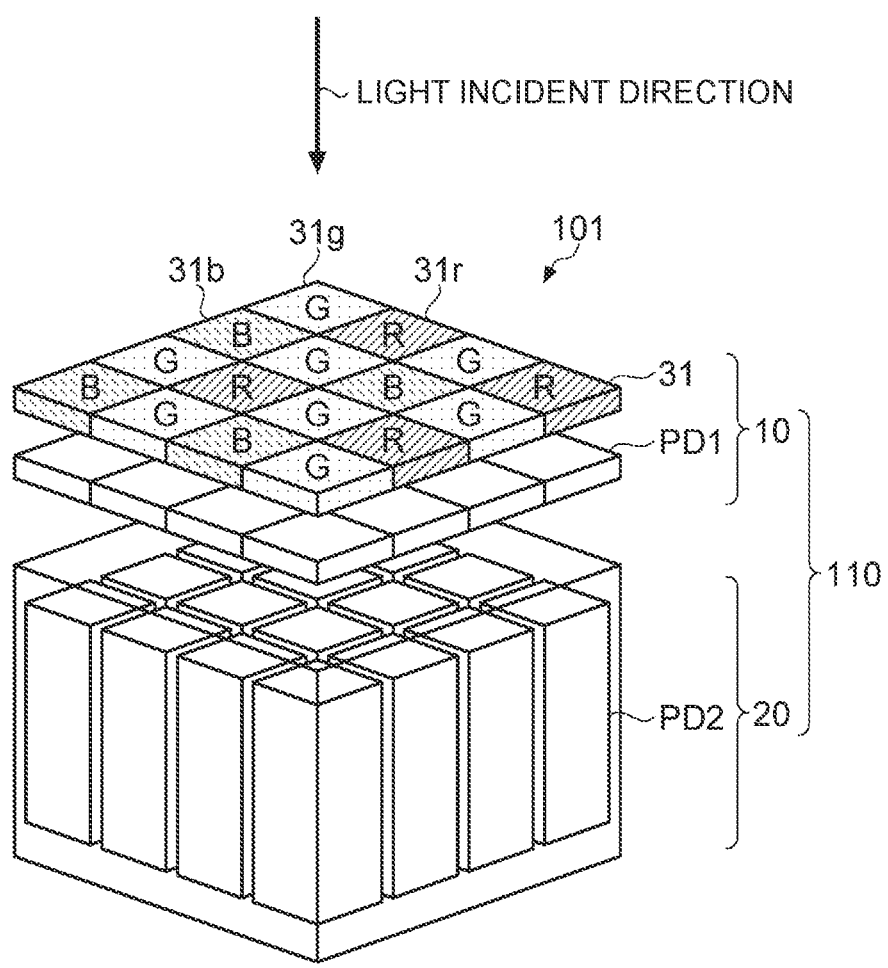
FIG. 3 is a schematic diagram depicting a schematic configuration example of a unit pixel according to the first embodiment.

In addition, in FIG. 3 and the following description, in a case where color filters 31r, 31g, and 31b that transmit the light of the respective color components constituting the three primary colors of RGB are not distinguished, the reference numeral is 31.

FIG. 3 is a schematic diagram depicting a schematic configuration example of the pixel array section according to the present embodiment. As depicted in FIG. 3, the pixel array section 101 has a configuration in which the unit pixels 110 having a structure in which the unit pixels 110 including the RGB pixels 10 and the IR pixels 20 are arranged along the light incident direction are arranged in a two-dimensional lattice shape. That is, in the present embodiment, the RGB pixels 10 and the IR pixels 20 are positioned in the direction vertical to the arrangement direction (plane direction) of the unit pixels 110, and the light transmitted through the RGB pixels 10 positioned on the upstream side in the optical path of the incident light is configured to be incident on the IR pixels 20 positioned on the downstream side of the RGB pixels 10. According to such a configuration, a photoelectric conversion section PD2 of the IR pixel 20 is disposed on the surface side opposite to the incident surface of the incident light in a photoelectric conversion section PD1 of the RGB pixel 10. As a result, in the present embodiment, the optical axes of the incident light of the RGB pixel 10 and the IR pixel 20 arranged along the light incident direction coincide or substantially coincide with each other.

Note that, in the present embodiment, a case where the photoelectric conversion section PD1 constituting the RGB pixel 10 is made of an organic material and the photoelectric conversion section PD2 constituting the IR pixel 20 is made of a semiconductor material such as silicon is exemplified, but the present invention is not limited to this. For example, both the photoelectric conversion section PD1 and the photoelectric conversion section PD2 may be made of a semiconductor material, both the photoelectric conversion section PD1 and the photoelectric conversion section PD2 may be made of an organic material, or the photoelectric conversion section PD1 may be made of a semiconductor material and the photoelectric conversion section PD2 may be made of an organic material. Alternatively, at least one of the photoelectric conversion section PD1 and the photoelectric conversion section PD2 may be made of a photoelectric conversion material different from the organic material and the semiconductor material.

1.4 Circuit Configuration Example of Unit Pixel

Figure 4:
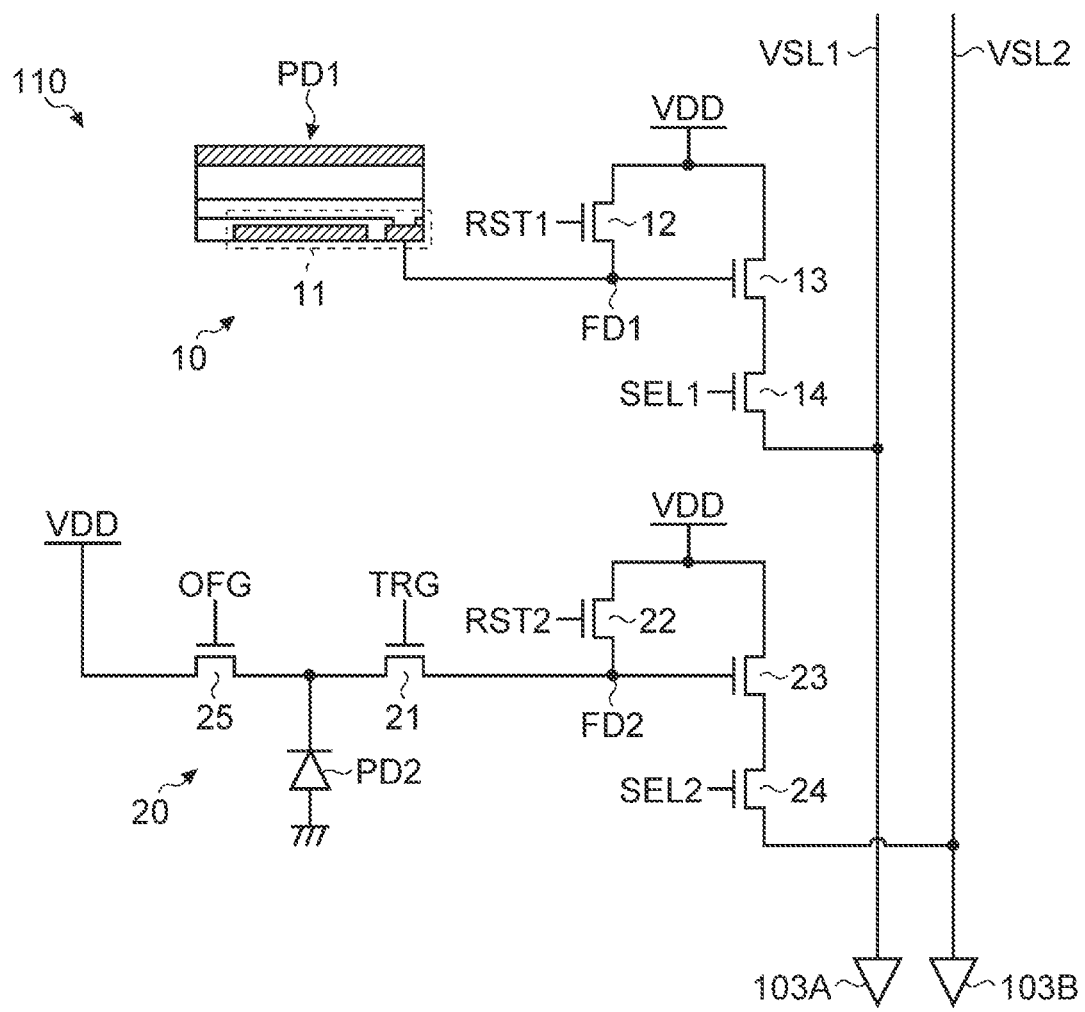
FIG. 4 is a circuit diagram depicting a schematic configuration example of a unit pixel according to the first embodiment.

Next, a circuit configuration example of the unit pixel 110 will be described. FIG. 4 is a circuit diagram depicting a schematic configuration example of the unit pixel according to the present embodiment. As depicted in FIG. 4, the unit pixel 110 includes one RGB pixel 10 and one IR pixel 20.

(RGB Pixel 10)

The RGB pixel 10 includes, for example, the photoelectric conversion section PD1, a transfer gate 11, a floating diffusion region FD1, a reset transistor 12, an amplification transistor 13, and a selection transistor 14.

A selection control line included in the pixel drive line LD is connected to the gate of the selection transistor 14, a reset control line included in the pixel drive line LD is connected to the gate of the reset transistor 12, and a transfer control line included in the pixel drive line LD is connected to an accumulation electrode (see an accumulation electrode 37 in FIG. 8) to be described later of the transfer gate 11. In addition, a vertical signal line VSL1 having one end connected to the signal processing circuit 103 is connected to the drain of the amplification transistor 13 via the selection transistor 14.

In the following description, the reset transistor 12, the amplification transistor 13, and the selection transistor 14 are also collectively referred to as a pixel circuit. The pixel circuit may include the floating diffusion region FD1 and/or the transfer gate 11.

The photoelectric conversion section PD1 is made of, for example, an organic material, and photoelectrically converts incident light. The transfer gate 11 transfers the charges generated in the photoelectric conversion section PD1. The floating diffusion region FD1 accumulates the charges transferred by the transfer gate 11. The amplification transistor 13 causes a pixel signal having a voltage value corresponding to the charges accumulated in the floating diffusion region FD1 to appear in the vertical signal line VSL1. The reset transistor 12 releases the charges accumulated in the floating diffusion region FD. The selection transistor 14 selects the RGB pixel 10 to be read out.

The anode of the photoelectric conversion section PD1 is grounded, and the cathode is connected to the transfer gate 11. The transfer gate 11 will be described later in detail with reference to FIG. 8, and includes, for example, an accumulation electrode 37 and a readout electrode 36. At the time of exposure, a voltage for collecting charges generated in the photoelectric conversion section PD1 to a semiconductor layer 35 near the accumulation electrode 37 is applied to the accumulation electrode 37 via the transfer control line. At the time of reading, a voltage for causing charges collected in the semiconductor layer 35 near the accumulation electrode 37 to flow out through the readout electrode 36 is applied to the accumulation electrode 37 through the transfer control line.

The charges flowing out through the readout electrode 36 are accumulated in the floating diffusion region FD1 including a wiring structure connecting the readout electrode 36, the source of the reset transistor 12, and the gate of the amplification transistor 13. Note that the drain of the reset transistor 12 may be connected to, for example, a power supply voltage VDD or a power supply line to which a reset voltage lower than the power supply voltage VDD is supplied.

The source of the amplification transistor 13 may be connected to a power supply line via, for example, a constant current circuit (not depicted) and the like. The drain of the amplification transistor 13 is connected to the source of the selection transistor 14, and the drain of the selection transistor 14 is connected to the vertical signal line VSL1.

The floating diffusion region FD1 converts the accumulated charges into a voltage of a voltage value corresponding to the charge amount. Note that the floating diffusion region FD1 may be, for example, a ground capacity. However, the present invention is not limited to this, and the floating diffusion region FD1 may be a capacity and the like added by intentionally connecting a capacitor and the like to a node where the drain of the transfer gate 11, the source of the reset transistor 12, and the gate of the amplification transistor 13 are connected.

The vertical signal line VSL1 is connected to an analog-to-digital (AD) conversion circuit 103A provided for each column (that is, for each vertical signal line VSL1) in the signal processing circuit 103. The AD conversion circuit 103A includes, for example, a comparator and a counter, and converts an analog pixel signal into a digital pixel signal by comparing a reference voltage such as a single slope or a ramp shape input from an external reference voltage generation circuit (digital-to-analog converter (DAC)) with the pixel signal appearing in the vertical signal line VSL1. Note that the AD conversion circuit 103A may include, for example, a correlated double sampling (CDS) circuit and the like, and may be configured to be able to reduce kTC noise and the like.

(IR Pixel 20)

The IR pixel 20 includes, for example, the photoelectric conversion section PD2, a transfer transistor 21, a floating diffusion region FD2, a reset transistor 22, an amplification transistor 23, a selection transistor 24, and a discharge transistor 25. That is, in the IR pixel 20, the transfer gate 11 in the RGB pixel 10 is replaced with the transfer transistor 21, and the discharge transistor 25 is added.

The connection relationship among the floating diffusion region FD2, the reset transistor 22, and the amplification transistor 23 with respect to the transfer transistor 21 may be similar to the connection relationship among the floating diffusion region FD1, the reset transistor 12, and the amplification transistor 13 with respect to the transfer gate 11 in the RGB pixel 10. In addition, the connection relationship among the amplification transistor 23, the selection transistor 24, and a vertical signal line VSL2 may be similar to the connection relationship among the amplification transistor 13, the selection transistor 14, and the vertical signal line VSL1 in the RGB pixel 10.

The source of the transfer transistor 21 is connected to, for example, the cathode of the photoelectric conversion section PD2, and the drain is connected to the floating diffusion region FD2. In addition, the transfer control line included in the pixel drive line LD is connected to the gate of the transfer transistor 21.

The source of the discharge transistor 25 may be connected to, for example, the cathode of the photoelectric conversion section PD2, and the drain may be connected to the power supply voltage VDD or a power supply line to which a reset voltage lower than the power supply voltage VDD is supplied. In addition, the discharge control line included in the pixel drive line LD is connected to the gate of the discharge transistor 25.

In the following description, the reset transistor 22, the amplification transistor 23, and the selection transistor 24 are also collectively referred to as a pixel circuit. The pixel circuit may include one or more of the floating diffusion region FD2, the transfer transistor 21, and the discharge transistor 25.

The photoelectric conversion section PD2 is made of, for example, a semiconductor material, and photoelectrically converts incident light. The transfer transistor 21 transfers the charges generated in the photoelectric conversion section PD2. The floating diffusion region FD2 accumulates the charges transferred by the transfer transistor 21. The amplification transistor 23 causes a pixel signal having a voltage value corresponding to the charges accumulated in the floating diffusion region FD2 to appear in the vertical signal line VSL2. The reset transistor 22 releases the charges accumulated in the floating diffusion region FD2. The selection transistor 24 selects the IR pixel 20 to be read out.

The anode of the photoelectric conversion section PD2 is grounded, and the cathode is connected to the transfer transistor 21. The drain of the transfer transistor 21 is connected to the source of the reset transistor 22 and the gate of the amplification transistor 23, and a wiring structure connecting these components constitutes the floating diffusion layer FD2. The charges flowing out from the photoelectric conversion section PD2 via the transfer transistor 21 are accumulated in the floating diffusion region FD2.

The floating diffusion region FD2 converts the accumulated charges into a voltage of a voltage value corresponding to the charge amount. Note that the floating diffusion region FD2 may be, for example, a ground capacity. However, the present invention is not limited to this, and the floating diffusion region FD2 may be a capacity and the like added by intentionally connecting a capacitor and the like to a node where the drain of the transfer transistor 21, the source of the reset transistor 22, and the gate of the amplification transistor 23 are connected.

The discharge transistor 25 is turned on when discharging the charges accumulated in the photoelectric conversion section PD2 and resetting the photoelectric conversion section PD2. As a result, the charges accumulated in the photoelectric conversion section PD2 flow out to the power supply line via the discharge transistor 25, and the photoelectric conversion section PD2 is reset to an unexposed state.

Similarly to the vertical signal line VSL1, the vertical signal line VSL2 is connected to an AD conversion circuit 103B provided for each column (that is, for each vertical signal line VSL2) in the signal processing circuit 103. The AD conversion circuit 103B may have a configuration similar to that of the AD conversion circuit 103A.

1.5 Modification of Circuit Configuration

Next, modifications of the circuit configuration of the unit pixel 110 depicted in FIG. 4 will be described with some examples.

1.5.1 First Modification

Figure 5:
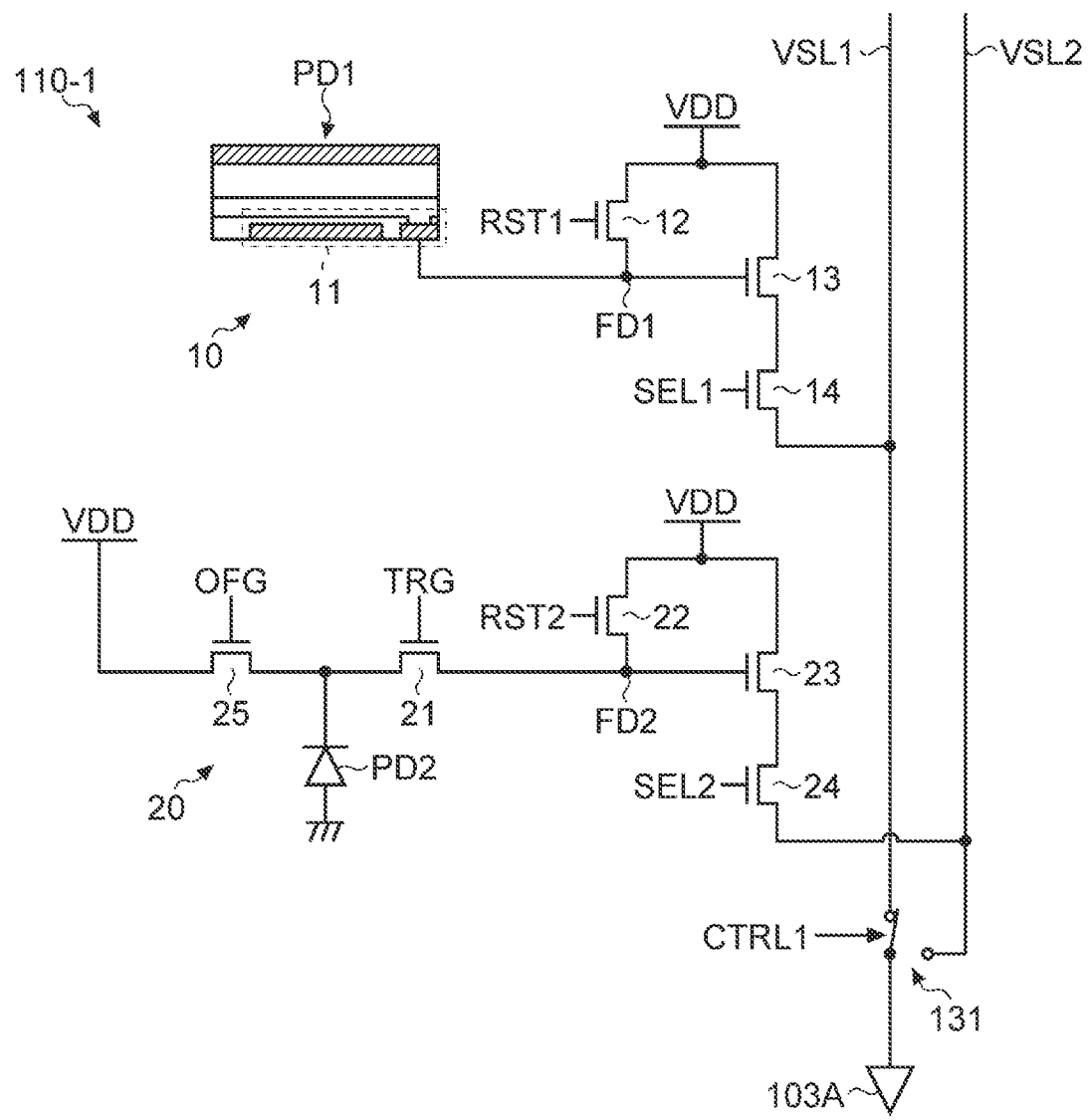
FIG. 5 is a circuit diagram depicting a schematic configuration example of a unit pixel according to a first modification of the first embodiment.

FIG. 5 is a circuit diagram depicting a schematic configuration example of a unit pixel according to the first modification of the present embodiment. As depicted in FIG. 5, a unit pixel 110-1 is configured in a manner that the vertical signal lines VSL1 and VSL2 are connected to a common AD conversion circuit 103A in the same configuration as the unit pixel 110 depicted in FIG. 4. Therefore, in the first modification, a switch circuit 131 that switches the vertical signal line connected to the AD conversion circuit 103A to any one of the vertical signal lines VSL1 and VSL2 is provided. For example, the switch circuit 131 may be provided on the same semiconductor substrate as the pixel circuit of the RGB pixel 10 and/or the IR pixel 20, may be provided on the semiconductor substrate on which the signal processing circuit 103 is disposed, or may be provided on a semiconductor substrate different from these. In addition, the control signal for controlling the switch circuit 131 may be supplied from the pixel drive circuit 102, may be supplied from the column drive circuit 104, or may be supplied from another configuration (for example, the processor 4 and the like in FIG. 1).

According to such a configuration, since the circuit scale of the signal processing circuit 103 can be reduced, it is possible to miniaturize the image sensor 100, increase the resolution, and the like by improving the area efficiency.

1.5.2 Second Modification

Figure 6:
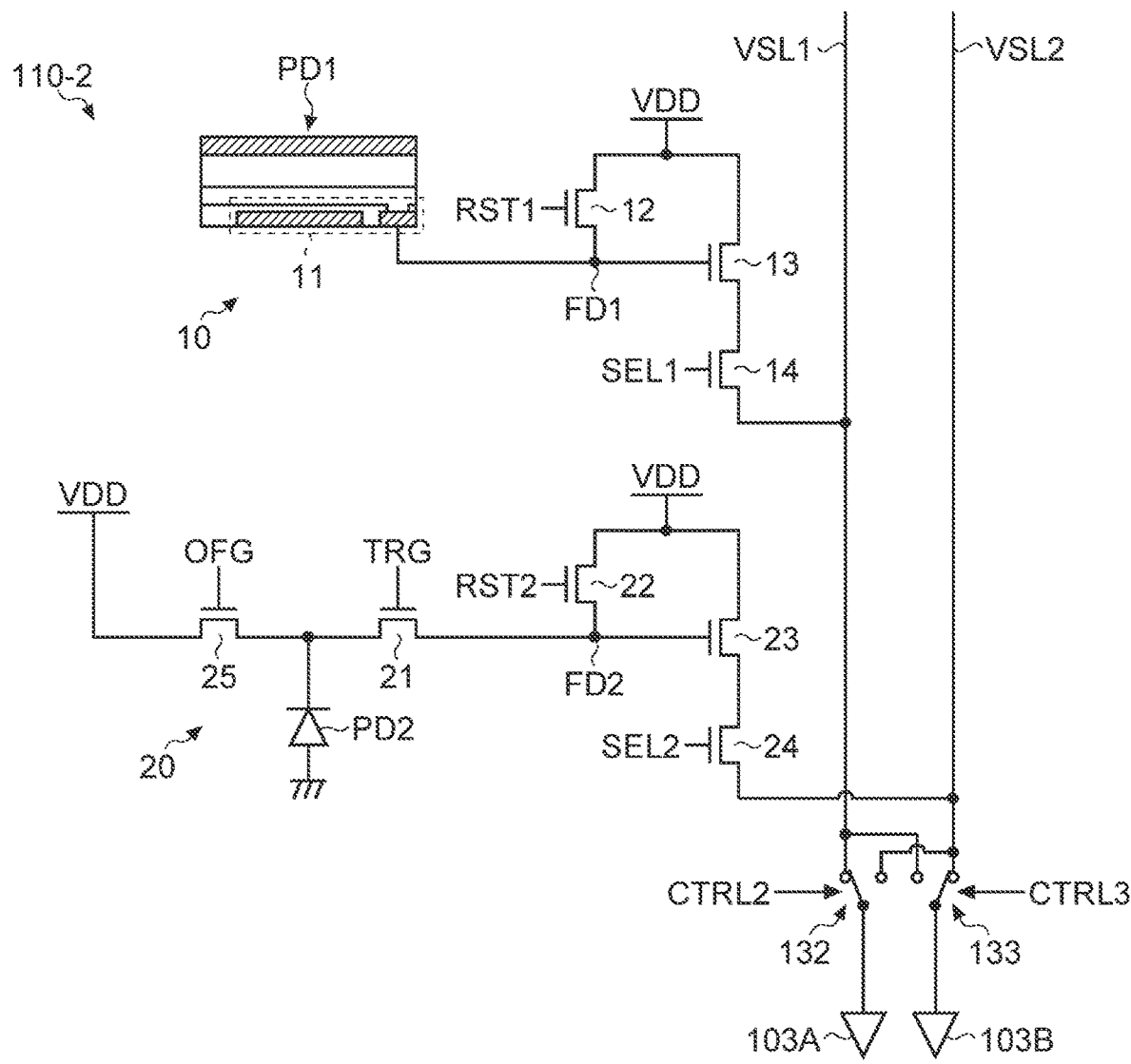
FIG. 6 is a circuit diagram depicting a schematic configuration example of a unit pixel according to a second modification of the first embodiment.

FIG. 6 is a circuit diagram depicting a schematic configuration example of a unit pixel according to a second modification of the present embodiment. As depicted in FIG. 6, a unit pixel 110-2 is configured in a manner that the vertical signal lines VSL1 and VSL2 can be connected to any one of the two AD conversion circuits 103A and 103B in the same configuration as the unit pixel 110 depicted in FIG. 4. Therefore, in the second modification, a switch circuit 132 that switches the vertical signal line connected to the AD conversion circuit 103A to any one of the vertical signal lines VSL1 and VSL2 and a switch circuit 133 that switches the vertical signal line connected to the AD conversion circuit 103B to any one of the vertical signal lines VSL1 and VSL2 are provided. For example, the switch circuits 132 and 133 may be provided on the same semiconductor substrate as the pixel circuit of the RGB pixel 10 and/or the IR pixel 20, may be provided on the semiconductor substrate on which the signal processing circuit 103 is disposed, or may be provided on a semiconductor substrate different from these. In addition, the control signal for controlling the switch circuits 132 and 133 may be supplied from the pixel drive circuit 102, may be supplied from the column drive circuit 104, or may be supplied from another configuration (for example, the processor 4 and the like in FIG. 1).

According to such a configuration, since it is possible to select the AD conversion circuits 103A and 103B to be used for each column, it is possible to suppress image quality degradation due to noise generation such as streaking, for example.

1.5.3 Third Modification

Figure 7:
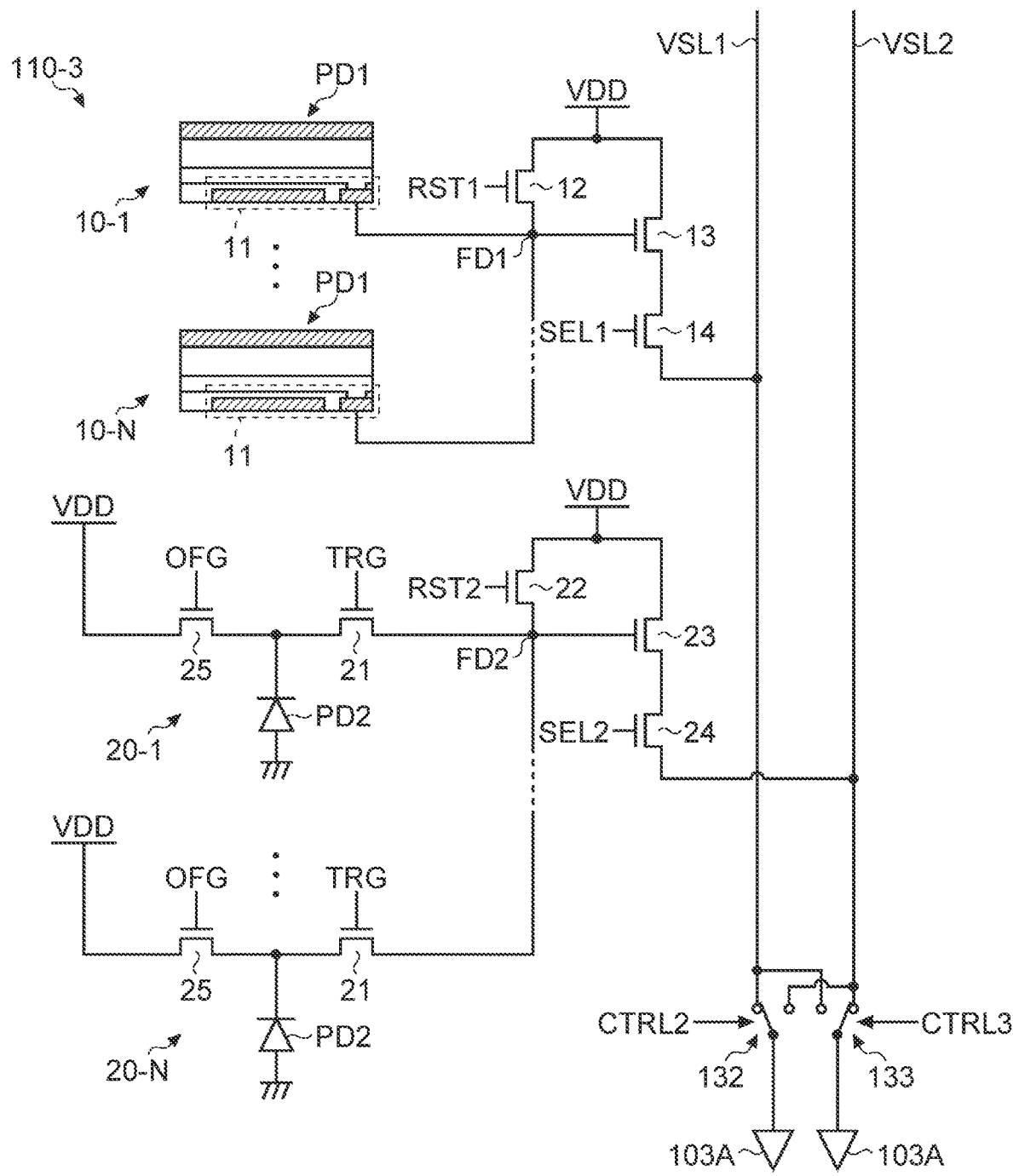
FIG. 7 is a circuit diagram depicting a schematic configuration example of a unit pixel according to a third modification of the first embodiment.

FIG. 7 is a circuit diagram depicting a schematic configuration example of a unit pixel according to a third modification of the present embodiment. As depicted in FIG. 7, regarding the RGB pixel 10, a unit pixel 110-3 has a so-called pixel sharing circuit structure in which a plurality of RGB pixels 10-1 to 10-N (N is an integer of 2 or more) shares the floating diffusion region FD1, the reset transistor 12, the amplification transistor 13, and the selection transistor 14 in the same configuration as the unit pixel 110-2 depicted in FIG. 6. In addition, similarly in the IR pixel 20, the unit pixel 110-3 has a so-called pixel sharing circuit structure in which a plurality of IR pixels 20-1 to 20-N shares the floating diffusion region FD2, the reset transistor 22, the amplification transistor 23, and the selection transistor 24 in the same configuration as the unit pixel 110-2 depicted in FIG. 6. Note that the numbers of the RGB pixels 10-1 to 10-N and the numbers of the IR pixels 20-1 to 20-N do not necessarily coincide with each other.

With such a configuration, it is possible to switch between readout in a high dynamic range (HDR) and readout in a low dynamic range (LDR) according to the situation, and thus, it is possible to suppress deterioration of image quality at the time of low illuminance or high illuminance. Note that, in the present description, a case where the second modification described with reference to FIG. 6 is used as a base has been exemplified, but the present invention is not limited to this, and the unit pixel 110 and the unit pixel 110-1 depicted in FIGS. 4 and 5 may be used as a base.

1.6 Cross-Sectional Structure Example of Unit Pixel

Figure 8:
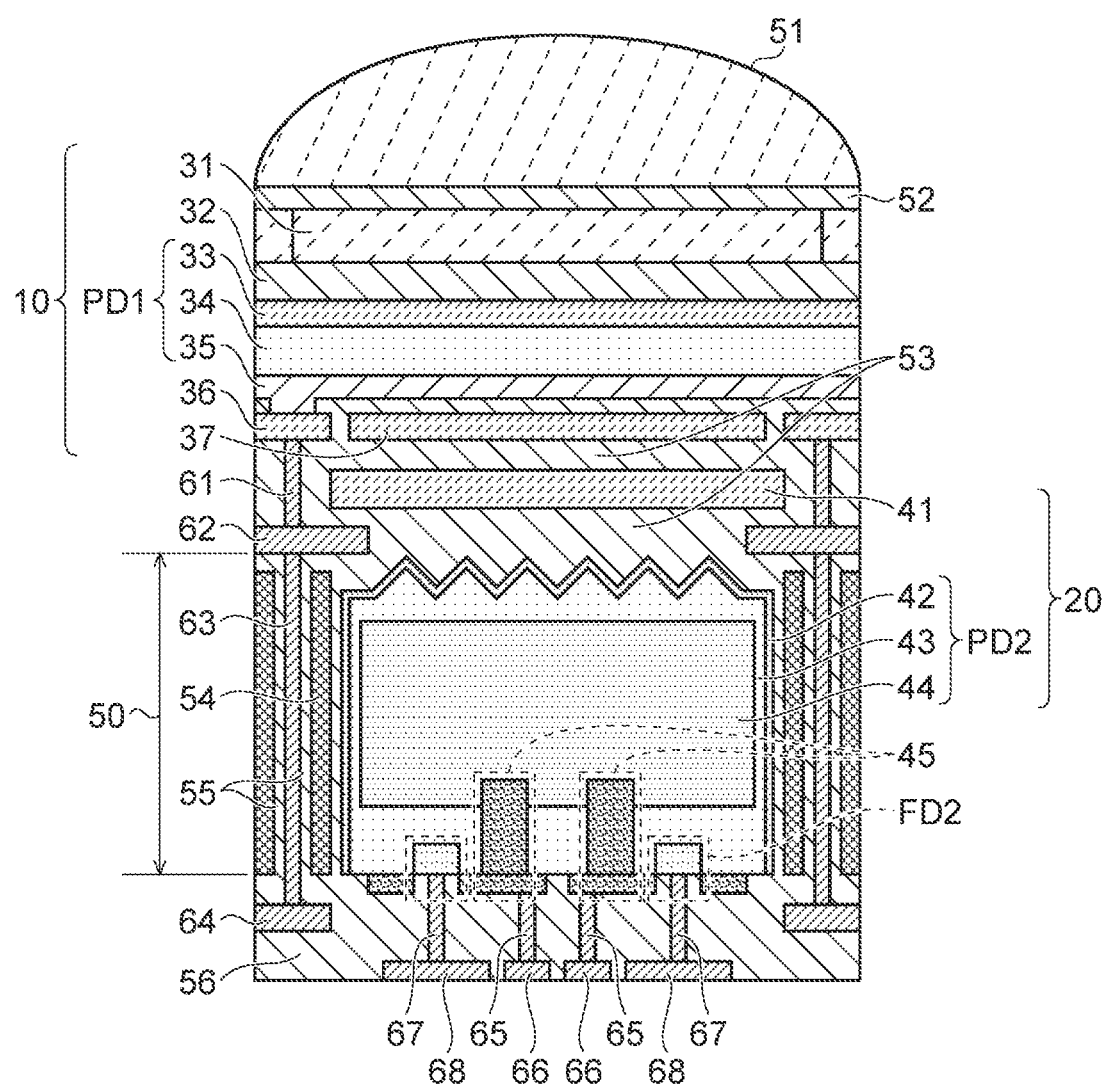
FIG. 8 is a cross-sectional diagram depicting a cross-sectional structure example of the image sensor according to the first embodiment.

Next, with reference to FIG. 8, a cross-sectional structure example of the image sensor 100 according to the first embodiment will be described. FIG. 8 is a cross-sectional diagram depicting a cross-sectional structure example of the image sensor according to the first embodiment. Here, a cross-sectional structure example will be described focusing on a semiconductor chip in which the photoelectric conversion sections PD1 and PD2 in the unit pixel 110 are formed.

In addition, in the following description, a so-called back surface irradiation type cross-sectional structure in which the light incident surface is on the back surface side (opposite side to the element formation surface) of a semiconductor substrate 50 is exemplified, but the present invention is not limited to this, and a so-called front surface irradiation type cross-sectional structure in which the light incident surface is on the front surface side (element formation surface side) of the semiconductor substrate 50 may be used. Furthermore, in the present description, a case where an organic material is used for the photoelectric conversion section PD1 of the RGB pixel 10 is exemplified, but as described above, one or both of an organic material and a semiconductor material (also referred to as an inorganic material) may be used as the photoelectric conversion material of each of the photoelectric conversion sections PD1 and PD2.

Note that, in a case where a semiconductor material is used for both the photoelectric conversion material of the photoelectric conversion section PD1 and the photoelectric conversion material of the photoelectric conversion section PD2, the image sensor 100 may have a cross-sectional structure in which the photoelectric conversion section PD1 and the photoelectric conversion section PD2 are built in the same semiconductor substrate 50, may have a cross-sectional structure in which a semiconductor substrate in which the photoelectric conversion section PD1 is built and a semiconductor substrate in which the photoelectric conversion section PD2 is built are bonded, or may have a cross-sectional structure in which one of the photoelectric conversion sections PD1 and PD2 is built in the semiconductor substrate 50 and the other is built in a semiconductor layer formed on the back surface or the front surface of the semiconductor substrate 50.

As depicted in FIG. 8, the present embodiment has a structure in which the photoelectric conversion section PD2 of the IR pixel 20 is formed on the semiconductor substrate 50, and the photoelectric conversion section PD1 of the RGB pixel is provided on the back surface side (opposite side to an element formation surface) of the semiconductor substrate 50. Note that, in FIG. 8, for convenience of description, the back surface of the semiconductor substrate 50 is positioned on the upper side in the plane of the drawing, and the front surface is positioned on the lower side.

For the semiconductor substrate 50, for example, a semiconductor material such as silicon (Si) may be used. However, the semiconductor material is not limited to this, and various semiconductor materials including compound semiconductors such as GaAs, InGaAs, InP, AlGaAs, InGaP, AlGaInP, and InGaAsP may be used.

(RGB Pixel 10)

The photoelectric conversion section PD1 of the RGB pixel 10 is provided on the back surface side of the semiconductor substrate 50 with the insulating layer 53 sandwiched between. The photoelectric conversion section PD1 includes, for example, a photoelectric conversion film 34 made of an organic material, and a transparent electrode 33 and the semiconductor layer 35 disposed to sandwich the photoelectric conversion film 34. The transparent electrode 33 provided on the upper side (hereinafter, the upper side in the plane of the drawing is an upper surface side, and the lower side is a lower surface side) in the plane of the drawing with respect to the photoelectric conversion film 34 functions as, for example, an anode of the photoelectric conversion section PD1, and the semiconductor layer 35 provided on the lower surface side functions as a cathode of the photoelectric conversion section PD1.

The semiconductor layer 35 functioning as a cathode is electrically connected to the readout electrode 36 formed in an insulating layer 53. The readout electrode 36 is electrically drawn out to the front surface (lower surface) side of the semiconductor substrate 50 by being connected to wirings 61, 62, 63, and 64 penetrating the insulating layer 53 and the semiconductor substrate 50. Note that, although not depicted in FIG. 8, the wiring 64 is electrically connected to the floating diffusion region FD1 depicted in FIG. 4.

the accumulation electrode 37 is provided on the lower surface side of the semiconductor layer 35 functioning as a cathode with the insulating layer 53 sandwiched between. Although not depicted in FIG. 8, the accumulation electrode 37 is connected to the transfer control line in the pixel drive line LD. As described above, at the time of exposure, a voltage for collecting charges generated in the photoelectric conversion section PD1 to the semiconductor layer 35 near the accumulation electrode 37 is applied, and at the time of readout, a voltage for causing charges collected in the semiconductor layer 35 near the accumulation electrode 37 to flow out via the readout electrode 36 is applied.

Similarly to the transparent electrode 33, the readout electrode 36 and the accumulation electrode 37 may be transparent conductive films. For example, a transparent conductive film such as indium tin oxide (ITO) or zinc oxide (IZO) may be used for the transparent electrode 33, the readout electrode 36, and the accumulation electrode 37. However, the present invention is not limited to this, and various conductive films may be used as long as the photoelectric conversion section PD2 is a conductive film capable of transmitting light in a wavelength band to be detected.

In addition, for the semiconductor layer 35, for example, a transparent semiconductor layer such as IGZO may be used. However, the present invention is not limited to this, and various semiconductor layers may be used as long as the photoelectric conversion section PD2 is a semiconductor layer capable of transmitting light in a wavelength band to be detected.

Furthermore, as the insulating layer 53, for example, an insulating film such as a silicon oxide film ($SiO_2$) or a silicon nitride film (SiN) may be used. However, the present invention is not limited to this, and various insulating films may be used as long as the photoelectric conversion section PD2 is an insulating film capable of transmitting light in a wavelength band to be detected.

A color filter 31 is provided on the upper surface side of the transparent electrode 33 functioning as an anode with a sealing film 32 sandwiched between. The sealing film 32 is made of, for example, an insulating material such as silicon nitride (SiN), and may include atoms of aluminum (Al), titanium (Ti), and the like in order to prevent the atoms from diffusing from the transparent electrode 33.

Although the arrangement of the color filters 31 will be described later, for example, a color filter 31 that selectively transmits light of a specific wavelength component is provided for one RGB pixel 10. However, in a case where a monochrome pixel that acquires luminance information is provided instead of the RGB pixel 10 that acquires color information, the color filter 31 may be omitted.

(IR Pixel 20)

The photoelectric conversion section PD2 of the IR pixel 20 includes, for example, a p-type semiconductor region 43 formed in a p-well region 42 in the semiconductor substrate 50 and an n-type semiconductor region 44 formed in the vicinity of the center of the p-type semiconductor region 43. The n-type semiconductor region 44 functions as, for example, a charge accumulation region that accumulates charges (electrons) generated by photoelectric conversion, and the p-type semiconductor region 43 functions as a region that forms a potential gradient for collecting the charges generated by photoelectric conversion into the n-type semiconductor region 44.

For example, an IR filter 41 that selectively transmits IR light is disposed on the light incident surface side of the photoelectric conversion section PD2. The IR filter 41 may be disposed, for example, in the insulating layer 53 provided on the back surface side of the semiconductor substrate 50. By disposing the IR filter 41 on the light incident surface of the photoelectric conversion section PD2, it is possible to suppress the incidence of visible light on the photoelectric conversion section PD2, and thus, it is possible to improve the S/N ratio of IR light to visible light. This makes it possible to obtain a more accurate detection result of IR light.

For example, a fine uneven structure is provided on the light incident surface of the semiconductor substrate 50 in order to suppress reflection of incident light (IR light in this example). This uneven structure may be a structure called a moth-eye structure, or may be an uneven structure having a size and a pitch different from those of the moth-eye structure.

A longitudinal transistor 45 functioning as the transfer transistor 21 and the floating diffusion region FD2 functioning as the charge accumulation section are provided on the front surface (lower surface in the plane of the drawing) side of the semiconductor substrate 50, that is, the element formation surface side. The gate electrode of the longitudinal transistor 45 reaches the n-type semiconductor region 44 from the surface of the semiconductor substrate 50, and is connected to the pixel drive circuit 102 via wirings 65 and 66 (a part of the transfer control line of the pixel drive line LD) formed in an interlayer insulating film 56.

The charges flowing out via the longitudinal transistor 45 are accumulated in the floating diffusion region FD2. The floating diffusion region FD2 is connected to the source of the reset transistor 22 and the gate of the amplification transistor 23 via wirings 67 and 68 formed in the interlayer insulating film 56. Note that the reset transistor 22, the amplification transistor 23, and the selection transistor 24 may be provided on the element formation surface of the semiconductor substrate 50, or may be provided on a semiconductor substrate different from the semiconductor substrate 50.

Note that FIG. 8 depicts a case where two longitudinal transistors 45 (transfer transistors 21) are provided for one photoelectric conversion section PD2, but the present invention is not limited to this, and one longitudinal transistor 45 may be provided, or three or more longitudinal transistors 45 may be provided. Similarly, a case where two floating diffusion regions FD2 are provided for one photoelectric conversion section PD2 is exemplified, but the present invention is not limited to this, and one floating diffusion region FD2 may be provided, or three or more floating diffusion regions FD2 may be provided.

(Pixel Isolation Structure)

The semiconductor substrate 50 is provided with a pixel isolation section 54 that electrically isolates the plurality of unit pixels 110 from each other, and the photoelectric conversion section PD2 is provided in each region partitioned by the pixel isolation section 54. For example, in a case where the image sensor 100 is viewed from the back surface (upper surface in the drawing) side of the semiconductor substrate 50, the pixel isolation section 54 has, for example, a lattice shape interposed between the plurality of unit pixels 110, and each photoelectric conversion section PD2 is formed in each region partitioned by the pixel isolation section 54.

For the pixel isolation section 54, for example, a reflection film that reflects light such as tungsten (W) or aluminum (Al) may be used. As a result, the incident light entering the photoelectric conversion section PD2 can be reflected by the pixel isolation section 54, in a manner that the optical path length of the incident light in the photoelectric conversion section PD2 can be increased. In addition, since the pixel isolation section 54 has a light reflection structure, it is possible to reduce leakage of light to adjacent pixels, and thus, it is also possible to further improve image quality, distance measurement accuracy, and the like. Note that the configuration in which the pixel isolation section 54 has the light reflection structure is not limited to the configuration using the reflection film, and can be realized, for example, by using a material having a refractive index different from that of the semiconductor substrate 50 for the pixel isolation section 54.

For example, a fixed charge film 55 is provided between the semiconductor substrate 50 and the pixel isolation section 54. The fixed charge film 55 is formed using, for example, a high dielectric having a negative fixed charge in a manner that a positive charge (hole) accumulation region is formed at an interface portion with the semiconductor substrate 50 and generation of a dark current is suppressed. Since the fixed charge film 55 is formed to have a negative fixed charge, an electric field is applied to the interface with a semiconductor substrate 138 by the negative fixed charge, and a positive charge (hole) accumulation region is formed.

The fixed charge film 55 can be formed of, for example, a hafnium oxide film ($HfO_2$ film). In addition, the fixed charge film 55 can be formed to contain at least one of oxides such as hafnium, zirconium, aluminum, tantalum, titanium, magnesium, yttrium, and lanthanoid elements, for example.

Note that FIG. 8 depicts a case where the pixel isolation section 54 has a so-called full trench isolation (FTI) structure reaching from the front surface to the back surface of the semiconductor substrate 50, but is not limited to this. For example, various element isolation structures such as a so-called deep trench isolation (DTI) structure in which the pixel isolation section 54 is formed from the back surface or the front surface of the semiconductor substrate 50 to the vicinity of the middle of the semiconductor substrate 50 can be adopted.

(Pupil Correction)

A planarization film 52 made of a silicon oxide film, a silicon nitride film, and the like is provided on the upper surface of the color filter 31. The upper surface of the planarization film 52 is planarized by, for example, chemical mechanical polishing (CMP), and an on-chip lens 51 for each unit pixel 110 is provided on the planarized upper surface. The on-chip lens 51 of each unit pixel 110 has such a curvature that incident light is collected in the photoelectric conversion sections PD1 and PD2. Note that the positional relationship among the on-chip lens 51, the color filter 31, the IR filter 41, and the photoelectric conversion section PD2 in each unit pixel 110 may be adjusted according to, for example, the distance (image height) from the center of the pixel array section 101 (pupil correction).

In addition, in the structure depicted in FIG. 8, a light shielding film for preventing obliquely incident light from leaking into the adjacent pixel may be provided. The light shielding film can be positioned above the pixel isolation section 54 provided inside the semiconductor substrate 50 (upstream side in the optical path of the incident light). However, in a case where pupil correction is performed, the position of the light shielding film may be adjusted according to, for example, the distance (image height) from the center of the pixel array section 101. Such a light shielding film may be provided, for example, in the sealing film 32 or the planarization film 52. In addition, as a material of the light shielding film, for example, a light shielding material such as aluminum (Al) or tungsten (W) may be used.

1.7 Organic Material

In the first embodiment, in a case where an organic semiconductor is used as the material of the photoelectric conversion film 34, the layer structure of the photoelectric conversion film 34 can have the following structure. However, in the case of the stacked structure, the stacking order can be appropriately changed.

(1) Single-layer structure of p-type organic semiconductor
(2) Single-layer structure of n-type organic semiconductor
(3-1) Stacked structure of p-type organic semiconductor layer/n-type organic semiconductor layer
(3-2) Stacked structure of p-type organic semiconductor layer/mixed layer (bulk heterostructure) of p-type organic semiconductor and n-type organic semiconductor/n-type organic semiconductor layer
(3-3) Stacked structure of p-type organic semiconductor layer/mixed layer (bulk heterostructure) of p-type organic semiconductor and n-type organic semiconductor
(3-4) Stacked structure of n-type organic semiconductor layer/mixed layer (bulk heterostructure) of p-type organic semiconductor and n-type organic semiconductor
(4) Mixed layer of p-type organic semiconductor and p-type organic semiconductor (bulk heterostructure)

Here, examples of the p-type organic semiconductor include a naphthalene derivative, an anthracene derivative, a phenanthrene derivative, a pyrene derivative, a perylene derivative, a tetracene derivative, a pentacene derivative, a quinacridone derivative, a thiophene derivative, a thienothiophene derivative, a benzothiophene derivative, a benzothienobenzothiophene derivative, a triallylamine derivative, a carbazole derivative, a perylene derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, a polyfluorene derivative, and the like.

Examples of the n-type organic semiconductor include fullerene and a fullerene derivative<for example, fullerene such as C60, C70, and C74 (higher fullerenes, endohedral fullerenes, etc.), or a fullerene derivative (for example, fullerene fluoride, PCBM fullerene compound, fullerene multimer, and the like)>, an organic semiconductor having a larger (deeper) HOMO and LUMO than a p-type organic semiconductor, and a transparent inorganic metal oxide.

Specific examples of the n-type organic semiconductor include an organic molecule, an organometallic complex, and a subphthalocyanine derivative having a part of the molecular skeleton containing heterocyclic compounds containing a nitrogen atom, an oxygen atom, and a sulfur atom, such as pyridine derivatives, pyrazine derivatives, pyrimidine derivatives, triazine derivatives, quinoline derivatives, quinoxaline derivatives, isoquinoline derivatives, acridine derivatives, phenazine derivatives, phenanthroline derivatives, tetrazole derivatives, pyrazole derivatives, imidazole derivatives, thiazole derivatives, oxazole derivatives, imidazole derivatives, benzimidazole derivatives, benzotriazole derivatives, benzoxazole derivatives, benzoxazole derivatives, carbazole derivatives, benzofuran derivatives, dibenzofuran derivatives, subporphyrazine derivatives, polyphenylenevinylene derivatives, polybenzothiadiazole derivatives, and polyfluorene derivatives.

Halogen atom as group and the like contained in fullerene derivative, the following derivatives can be mentioned: linear, branched, or cyclic alkyl or phenyl group; group having linear or condensed aromatic compound; group having halide; partial fluoroalkyl group; perfluoroalkyl group; silylalkyl group; silyl alkoxy group; arylsilyl group; arylsulfanyl group; alkylsulfanyl group; arylsulfonyl group; alkylsulfonyl group; aryl sulfide group; alkyl sulfide group; amino group; alkylamino group; arylamino group; hydroxy group; alkoxy group; acylamino group; acyloxy group; carbonyl group; carboxy group; carboxamide group; carboalkoxy group; acyl group; sulfonyl group; cyano group; nitro group; group having chalcogenide; phosphine group; and phosphon group.

The film thickness of the photoelectric conversion film 34 made of the organic material as described above is not limited to the following value, but may be, for example, $1 \times 10^{-8}$ m (meter) to $5 \times 10^{-7}$ m, preferably $2.5 \times 10^{-8}$ m to $3 \times 10^{-7}$ m, more preferably $2.5 \times 10^{-8}$ m to $2 \times 10^{-7}$ m, and still more preferably $1 \times 10^{-7}$ m to $1.8 \times 10^{-7}$ m. Note that the organic semiconductor is often classified into a p-type and an n-type, but the p-type means that holes are easily transported, and the n-type means that electrons are easily transported, and the organic semiconductor is not limited to the interpretation that it has holes or electrons as a majority carrier of thermal excitation like the inorganic semiconductor.

Examples of a material constituting the photoelectric conversion film 34 that photoelectrically converts light having a green wavelength include a rhodamine dye, a melacyanine dye, a quinacridone derivative, and a subphthalocyanine dye (subphthalocyanine derivative).

In addition, examples of a material constituting the photoelectric conversion film 34 that photoelectrically converts blue light include a coumaric acid dye, tris-8-hydroxyquinoline aluminum (Alq3), a melacyanine dye, and the like.

Furthermore, examples of a material constituting the photoelectric conversion film 34 that photoelectrically converts red light include a phthalocyanine dye and a subphthalocyanine dye (subphthalocyanine derivative).

Furthermore, as the photoelectric conversion film 34, a panchromatic photosensitive organic photoelectric conversion film that is sensitive to substantially all visible light from the ultraviolet region to the red region can be used.

1.8 Planar Structure Example

Figure 9:
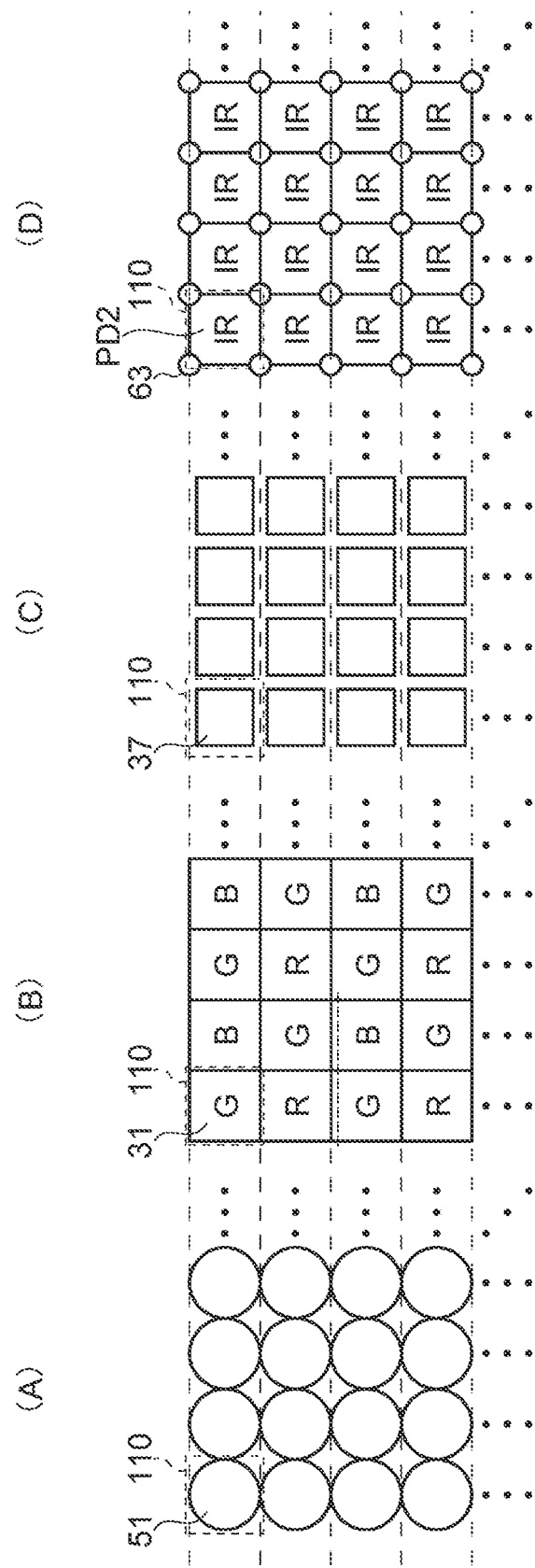
FIG. 9 is a diagram depicting a plan layout example of each layer of a pixel array section according to the first embodiment.

Next, a planar structure example of the pixel array section according to the present embodiment will be described. FIG. 9 is a diagram depicting a plan layout example of each layer of the pixel array section according to the present embodiment, in which (A) depicts a plan layout example of the on-chip lens 51, (B) depicts a plan layout example of the color filter 31, (C) depicts a plan layout example of the accumulation electrode 37, and (D) depicts a plan layout example of the photoelectric conversion section PD2. Note that, in FIG. 9, (A) to (D) depict plan layout examples of surfaces parallel to the element formation surface of the semiconductor substrate 50. In addition, in the present description, a case where a 2×2 pixel Bayer array including a pixel (hereinafter, referred to as an R pixel 10r) that selectively detects a red (R) wavelength component, a pixel (hereinafter, it is referred to as a G pixel 10g) that selectively detects a green (G) wavelength component, and a pixel (hereinafter, the pixel is referred to as a B pixel 10b) that selectively detects light of a blue (B) wavelength component is used as a unit array will be exemplified.

As depicted in (A) to (D) of FIG. 9, in the present embodiment, one on-chip lens 51, one color filter 31, one accumulation electrode 37, and one photoelectric conversion section PD2 are provided for one unit pixel 110. Note that, in the present description, one accumulation electrode 37 corresponds to one RGB pixel 10, and one photoelectric conversion section PD2 corresponds to one IR pixel 20.

As described above, in one unit pixel 110, by arranging one RGB pixel 10 and one IR pixel 20 along the traveling direction of the incident light, it is possible to improve coaxiality with respect to the incident light between the RGB pixel 10 and the IR pixel 20, and thus, it is possible to suppress spatial deviation occurring between the color image and the monochrome image. As a result, it is possible to improve accuracy of a result obtained by integrally processing information (color image and monochrome image) acquired by different sensors.

1.9 Wiring Example of Pixel Drive Line

Figure 10:
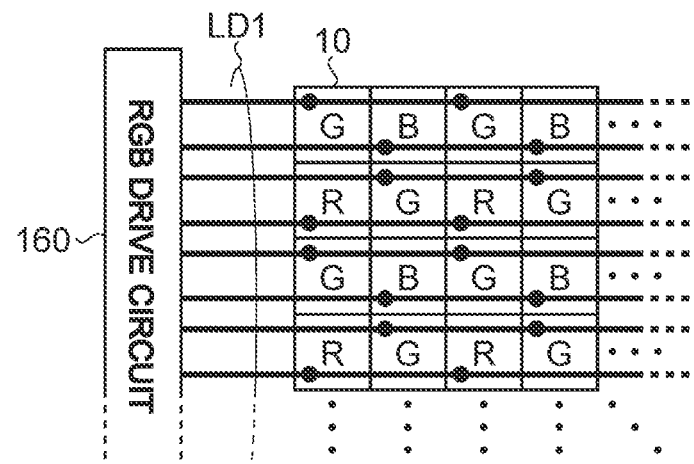
FIG. 10 is a plan diagram depicting a wiring example of pixel drive lines for RGB pixels according to the first embodiment.

Next, a wiring example of the pixel drive line LD connecting the unit pixel 110 and the pixel drive circuit 102 will be described. FIG. 10 is a plan diagram depicting a wiring example of pixel drive lines for RGB pixels according to the present embodiment, and FIG. 11 is a plan diagram depicting a wiring example of pixel drive lines for IR pixels according to the present embodiment.

Figure 11:
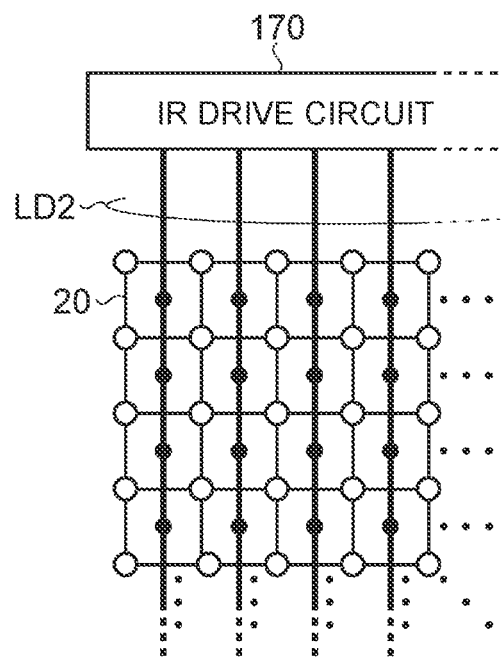
FIG. 11 is a plan diagram depicting a wiring example of pixel drive lines for IR pixels according to the first embodiment.

As depicted in FIGS. 10 and 11, the pixel drive circuit 102 according to the present embodiment includes an RGB drive circuit 160 that drives the RGB pixels 10 and an IR drive circuit 170 that drives the IR pixels 20. For example, an RGB drive line LD1 connecting the RGB drive circuit 160 and the transfer gate 11, the reset transistor 12, and the selection transistor 14 of the RGB pixel 10, and an IR drive line LD2 connecting the IR drive circuit 170 and the transfer transistor 21, the reset transistor 22, the selection transistor 24, and the discharge transistor 25 of the IR pixel 20 may be wired to be orthogonal to each other. However, the present invention is not limited to this, and the RGB drive line LD1 and the IR drive line LD2 may be wired in parallel. In this case, the RGB drive circuit 160 and the IR drive circuit 170 may supply various control signals to the pixel array section 101 from the same side or from different sides.

1.10 Stacked Structure Example of Image Sensor

Figure 12:
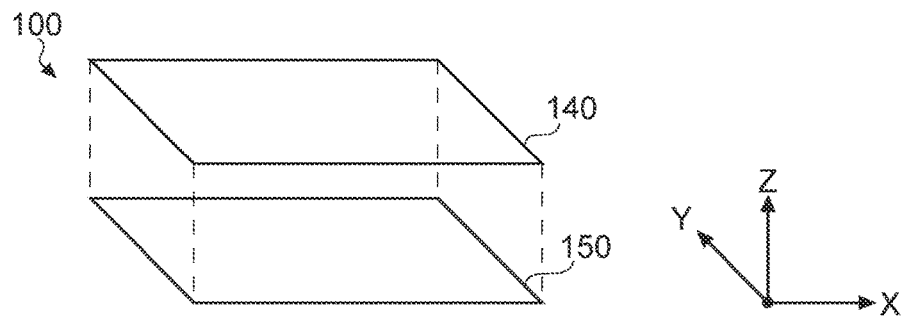
FIG. 12 is a diagram depicting a stacked structure example of the image sensor according to the first embodiment.

FIG. 12 is a diagram depicting a stacked structure example of the image sensor according to the present embodiment. As depicted in FIG. 12, the image sensor 100 has a structure in which a pixel chip 140 and a circuit chip 150 are vertically stacked. The pixel chip 140 is, for example, a semiconductor chip including the pixel array section 101 in which the unit pixels 110 including the RGB pixels 10 and the IR pixels 20 are arranged, and the circuit chip 150 is, for example, a semiconductor chip in which pixel circuits depicted in FIG. 3 are arranged. For example, the pixel chip 140 can correspond to an example of a first chip in the claims, and the circuit chip can correspond to an example of a second chip in the claims.

For bonding the pixel chip 140 and the circuit chip 150, for example, so-called direct bonding can be used, in which the bonding surfaces are planarized and both are bonded to each other by an electronic force. However, the present invention is not limited to this, and for example, so-called Cu—Cu bonding in which copper (Cu) electrode pads formed on the bonding surfaces are bonded to each other, bump bonding, and the like can also be used.

In addition, the pixel chip 140 and the circuit chip 150 are electrically connected via a connecting section such as a through-silicon via (TSV) penetrating the semiconductor substrate, for example. For the connection using the TSV, for example, a so-called twin TSV method in which two TSVs, that is, a TSV provided in the pixel chip 140 and a TSV provided from the pixel chip 140 to the circuit chip 150 are connected by an outer surface of the chip, a so-called shared TSV method in which both are connected by a TSV penetrating from the pixel chip 140 to the circuit chip 150, and the like can be adopted.

However, in a case where Cu—Cu bonding or bump bonding is used for bonding the pixel chip 140 and the circuit chip 150, both may be electrically connected via a Cu—Cu bonding portion or a bump bonding portion.

1.11 Pixel Drive and Readout Method

Next, a driving method and a readout method of the RGB pixel 10 and the IR pixel will be described with some examples together with a layout example of each semiconductor chip (the pixel chip 140 and the circuit chip 150) constituting the image sensor 100. Note that, in the following description, the column drive circuit 104, the system control unit 105, the data storage section 109, and the like in the configuration depicted in FIG. 2 are omitted for simplification of description. Each omitted configuration may be provided in the pixel chip 140, may be provided in the circuit chip 150, or may be provided in a semiconductor chip different from these. In addition, in the drawings used in the following description, #n (n is an integer of 1 or more) indicates a connection relationship of the pixel drive line LD and the vertical signal line VSL straddling the drawings. Furthermore, configurations, operations, and effects not specifically described in the following description may be similar to other examples.

In addition, in the following description, for example, a driving system for the RGB pixel 10 can correspond to an example of a first driving system in the claims, a driving system for the IR pixel 20 can correspond to an example of a second driving system in the claims, a readout system for the RGB pixel 10 can correspond to an example of a first readout section in the claims, and a readout system for the IR pixel 20 can correspond to an example of a second readout section in the claims.

1.11.1 First Example

Figure 13:
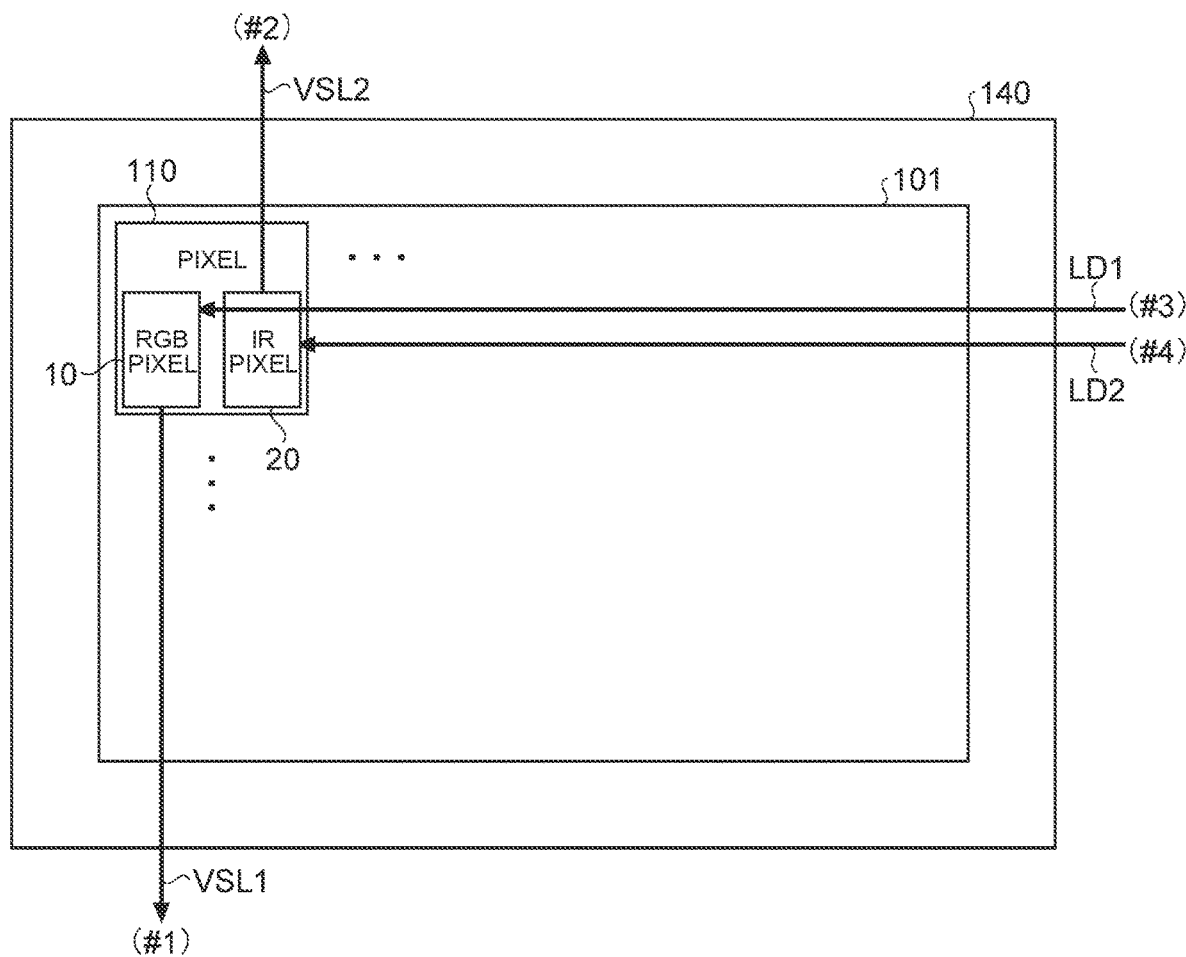
FIG. 13 is a diagram depicting a plan layout example of a pixel chip according to a first example the first embodiment.
Figure 14:
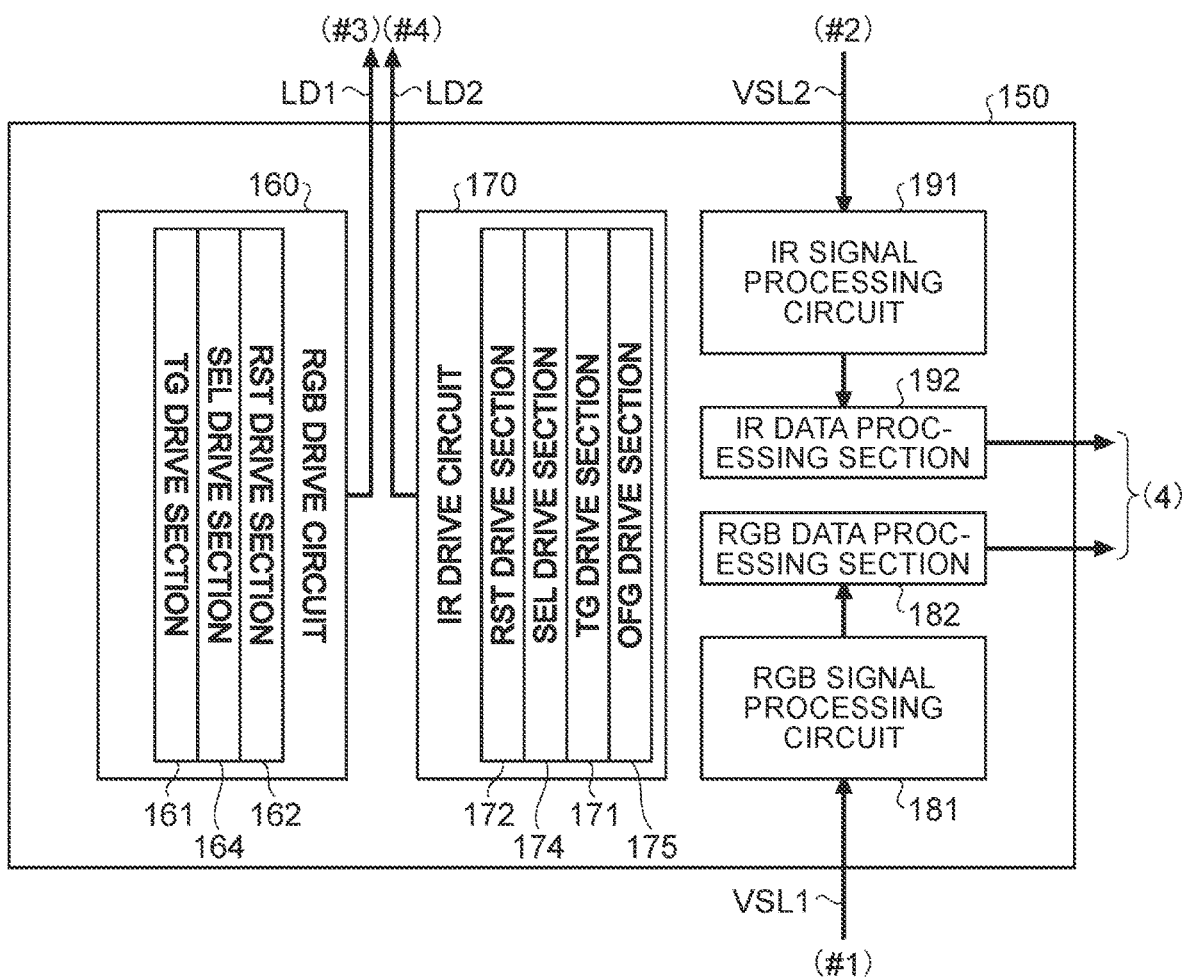
FIG. 14 is a diagram depicting a plan layout example of a circuit chip according to the first example the first embodiment.

In the first example, a case where a driving system for the RGB pixel 10 and a driving system for the IR pixel 20 are separately provided, and a readout system for the RGB pixel 10 and a readout system for the IR pixel 20 are separately provided will be described. FIGS. 13 and 14 are plan diagrams depicting layout examples according to the first example, FIG. 13 depicts a plan layout example of the pixel chip 140, and FIG. 14 depicts a plan layout example of the circuit chip 150.

(Pixel Chip 140)

As depicted in FIG. 13, in the first example, the pixel chip 140 has a layout in which the RGB drive line LD1 for the RGB pixel 10 and the IR drive line LD2 for the IR pixel 20 are separately wired for each unit pixel 110 of the pixel array section 101. The RGB drive line LD1 and the IR drive line LD2 may extend in the row direction as depicted in FIG. 13, or may extend in the column direction. In addition, the RGB drive line LD1 and the IR drive line LD2 may extend from the same direction or may extend from different directions. For example, the RGB drive line LD1 may extend in the lateral direction (row direction) from the right side in the plane of the drawing, and the IR drive line LD2 may extend in the longitudinal direction (column direction) from the upper side in the plane of the drawing.

In addition, in each unit pixel 110, the RGB pixel 10 is connected to the vertical signal line VSL1, and the IR pixel 20 is connected to the vertical signal line VSL2 different from the vertical signal line VSL1. The vertical signal lines VSL1 and VSL2 may extend in the column direction as depicted in FIG. 13, or may extend in the row direction. In addition, the vertical signal lines VSL1 and VSL2 may extend from the same direction or may extend from different directions.

(Circuit Chip 150)

As depicted in FIG. 14, in the first example, the pixel drive circuit 102 depicted in FIG. 1 includes the RGB drive circuit 160 and the IR drive circuit 170. In addition, the signal processing circuit 103 includes an RGB signal processing circuit 181 and an IR signal processing circuit 191, and the data processing unit 108 includes an RGB data processing unit 182 and an IR data processing unit 192.

The RGB drive circuit 160 is connected to the RGB pixel 10 of each unit pixel 110 in the pixel chip 140 via the RGB drive line LD1. The IR drive circuit 170 is connected to the IR pixel 20 of each unit pixel 110 in the pixel chip 140 via the IR drive line LD2.

The RGB drive circuit 160 includes a TG driving unit 161 that supplies a transfer control signal to the transfer gate 11, an RST driving unit 162 that supplies a reset control signal to the reset transistor 12, and an SEL driving unit 164 that supplies a selection control signal to the selection transistor 14. The RGB pixel 10 is driven by supplying the above control signal to the RGB pixel 10 via the RGB drive line LD1. As a result, the pixel signal appears in the vertical signal line VSL1 connected to the RGB pixel 10.

The IR drive circuit 170 includes a TG driving unit 171 that supplies a transfer control signal to the transfer transistor 21, an RST driving unit 172 that supplies a reset control signal to the reset transistor 22, an SEL driving unit 174 that supplies a selection control signal to the selection transistor 24, and an OFG driving unit 175 that supplies a discharge control signal to the discharge transistor 25. The IR pixel 20 is driven by supplying the above control signal to the IR pixel 20 via the IR drive line LD2. As a result, the pixel signal appears in the vertical signal line VSL2 connected to the IR pixel 20.

The RGB signal processing circuit 181 is connected to the vertical signal line VSL1. The RGB signal processing circuit 181 generates a digital color image signal by converting the pixel signal appearing in the vertical signal line VSL1 into a digital pixel signal.

The RGB data processing unit 182 executes various types of arithmetic processing described above as the processing of the data processing unit 108 on the digital color image signal output from the RGB signal processing circuit 181, and outputs the results to, for example, the processor 4.

The IR signal processing circuit 191 is connected to the vertical signal line VSL2. The IR signal processing circuit 191 generates a digital monochrome image signal by converting the pixel signal appearing in the vertical signal line VSL1 into a digital pixel signal.

The IR data processing unit 192 executes various types of arithmetic processing described above as the processing of the data processing unit 108 on the digital monochrome image signal output from the IR signal processing circuit 191, and outputs the results to, for example, the processor 4.

As described above, in the first example, the RGB drive circuit 160 for driving the RGB pixel 10 and the IR drive circuit 170 for driving the IR pixel 20 constitute different driving systems independent from each other, and the RGB signal processing circuit 181 and the RGB data processing unit 182 that read out a pixel signal from the RGB pixel 10 and execute various types of processing and the IR signal processing circuit 191 and the IR data processing unit 192 that read out a pixel signal from the IR pixel 20 and execute various types of processing constitute different readout systems independent from each other. According to such a configuration, it is possible to read out pixel signals from the RGB pixel 10 and the IR pixel 20 in the same unit pixel 110 simultaneously or substantially simultaneously, and thus, it is possible to suppress a temporal deviation between the color image obtained from the RGB pixel 10 and the monochrome image (IR image) obtained from the IR pixel 20. As a result, it is possible to improve accuracy of a result obtained by integrally processing information (color image and monochrome image) acquired by different sensors.

In addition, in the first example, the RGB drive circuit 160 and the IR drive circuit 170 constituting the driving system are disposed on one side (in FIG. 14, a region from the center to the left) in the circuit chip 150, and the RGB signal processing circuit 181 and the RGB data processing unit 182 constituting the readout system and the IR signal processing circuit 191 and the IR data processing unit 192 are disposed on the other side (in FIG. 14, a region on the right side of the center) in the circuit chip 150. As described above, by adopting a layout in which the driving system and the readout system are separately integrated, it is possible to use a layout of an existing circuit chip as a base, and thus, it is possible to improve layout design efficiency of the circuit chip 150.

1.11.2 Second Example

Figure 15:
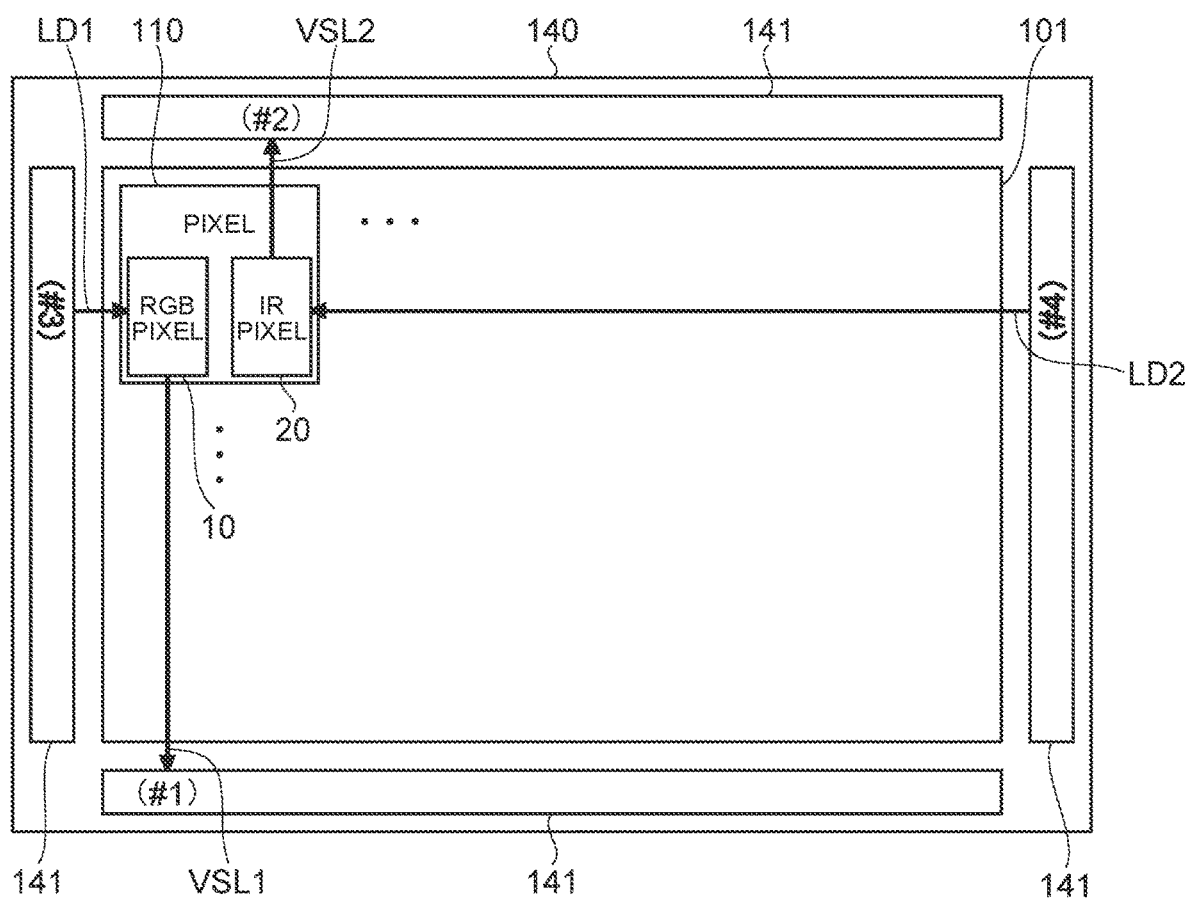
FIG. 15 is a diagram depicting a plan layout example of a pixel chip according to a second example the first embodiment.
Figure 16:
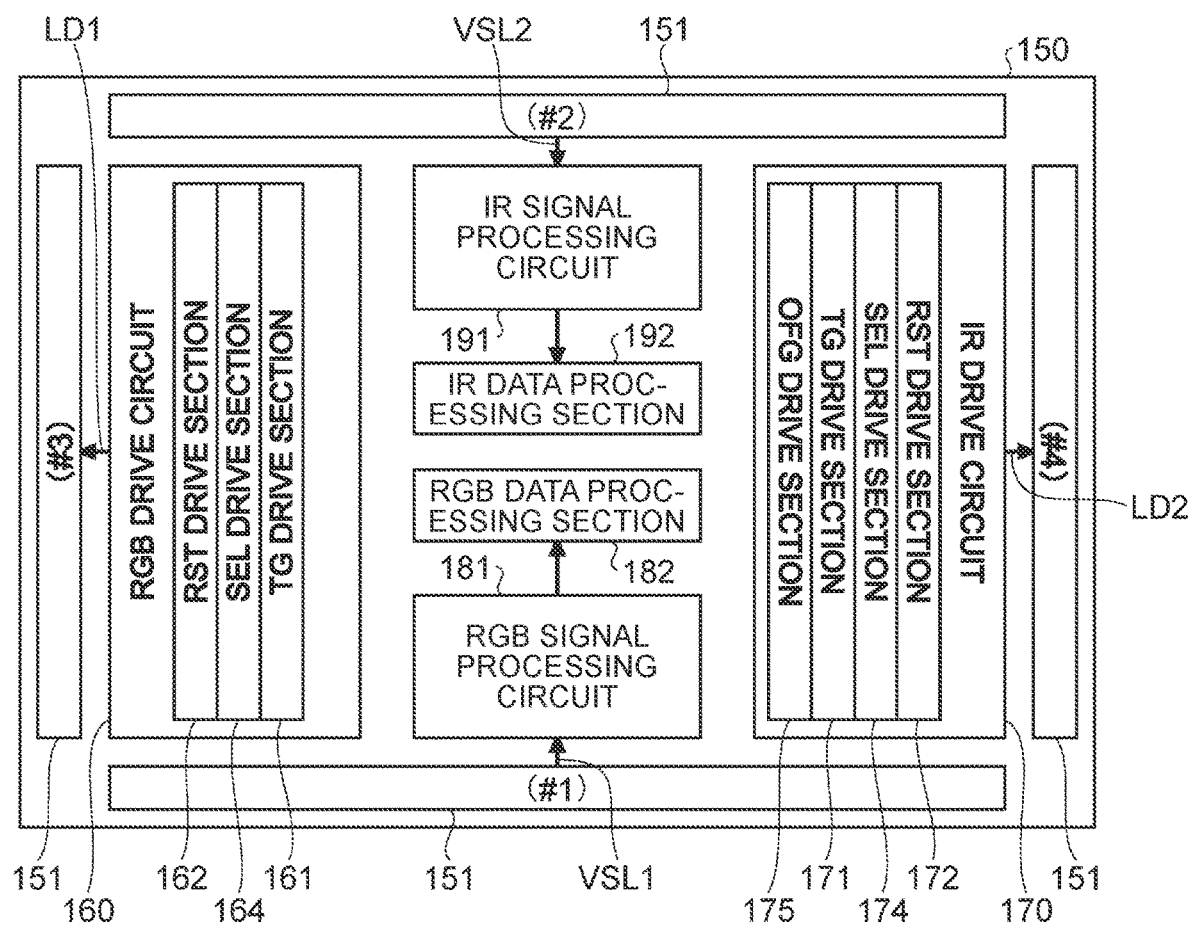
FIG. 16 is a diagram depicting a plan layout example of a circuit chip according to the second example the first embodiment.

In the second example, similarly to the first example, a case where a driving system for the RGB pixel 10 and a driving system for the IR pixel 20 are separately provided, and a readout system for the RGB pixel 10 and a readout system for the IR pixel 20 are separately provided will be described. FIGS. 15 and 16 are plan diagrams depicting layout examples according to the second example, FIG. 15 depicts a plan layout example of the pixel chip 140, and FIG. 16 depicts a plan layout example of the circuit chip 150.

(Pixel Chip 140)

As depicted in FIG. 15, the plan layout of the pixel chip 140 according to the second example may be similar to the plan layout example of the pixel chip 140 according to the first example depicted in FIG. 13. However, in FIG. 15, a connecting section 141 for electrically connecting various elements provided in the pixel chip 140 to an element on the side of the circuit chip 150 is depicted. In addition, in FIG. 15, in the drawing, the RGB drive line LD1 is connected to the connecting section 141 on the left end side, the IR drive line LD2 is connected to the connecting section 141 on the right end side, the vertical signal line VSL1 is connected to the connecting section 141 on the lower side, and the vertical signal line VSL2 is the connecting section 141 on the upper side.

(Circuit Chip 150)

As depicted in FIG. 16, in the second example, similarly to the first example, the pixel drive circuit 102 includes the RGB drive circuit 160 and the IR drive circuit 170, the signal processing circuit 103 includes the RGB signal processing circuit 181 and the IR signal processing circuit 191, and the data processing unit 108 includes the RGB data processing unit 182 and the IR data processing unit 192.

In the second example, the RGB drive circuit 160 is disposed on the left side of the circuit chip 150, for example, and is connected to a connecting section 151 at the left end of the circuit chip 150. On the other hand, the IR drive circuit 170 is disposed on the right side of the circuit chip 150, for example, and is connected to a connecting section 151 at the right end of the circuit chip 150. The readout system of the RGB signal processing circuit 181 and the RGB data processing unit 182, and the IR signal processing circuit 191 and the IR data processing unit 192 is disposed at the center of the circuit chip 150 and is connected to the connecting section 151 at the upper/lower end of the circuit chip 150. Note that the positions of the RGB drive circuit 160 and the IR drive circuit 170 may be switched. Similarly, the positions of the RGB signal processing circuit 181 and the RGB data processing unit 182, and the positions of the IR signal processing circuit 191 and the IR data processing unit 192 may be switched.

(Inter-Chip Connection Configuration)

As described above, the connecting section 141 of the pixel chip 140 and the connecting section 151 of the circuit chip 150 are electrically connected by, for example, TSV penetrating the semiconductor substrate, Cu—Cu bonding, bump bonding, and the like. The same may apply to other examples. Note that FIG. 16 depicts a case where the RGB signal processing circuit 181 is connected to the connecting section 151 at the lower end of the circuit chip 150 and the IR signal processing circuit 191 is connected to the connecting section 151 at the upper end of the circuit chip 150, but the present invention is not limited to this, and both the RGB signal processing circuit 181 and the IR signal processing circuit 191 may be connected to the connecting section 151 disposed at the upper end or the lower end of the circuit chip 150. In this case, the connecting section 151 that is not connected can be omitted.

As described above, in the second example, the RGB drive circuit 160 and the IR drive circuit 170 are separately disposed on the left and right sides of the circuit chip 150. According to such a configuration, since the connection configuration to the RGB pixels 10 and the connection configuration to the IR pixels 20 on the side of the pixel chip 140 can be dispersed to the left and right, it is possible to reduce the density of wirings and connection terminals. This makes it possible to suppress characteristic deterioration due to coupling between wirings and the like.

In addition, since the connecting section 151 of the RGB drive circuit 160 and the connecting section 151 of the IR drive circuit 170 are disposed at the left and right ends of the circuit chip 150, the average wiring length from the RGB drive circuit 160 to the RGB pixels 10 and the average wiring length from the IR drive circuit 170 to the IR pixels 20 can be made substantially the same, in a manner that more accurate control can be performed.

Furthermore, according to the second example, similarly to the first example, since the driving system and the readout system for the RGB pixel 10 and the driving system and the readout system for the IR pixel 20 have different configurations independent from each other, it is possible to read out pixel signals simultaneously or substantially simultaneously from the RGB pixel 10 and the IR pixel 20 in the same unit pixel 110. As a result, it is possible to suppress the temporal deviation between the color image obtained from the RGB pixel 10 and the monochrome image (IR image) obtained from the IR pixel 20, and thus, it is possible to improve the accuracy of a result obtained by integrally processing information acquired by different sensors.

1.11.3 Third Example

Figure 17:
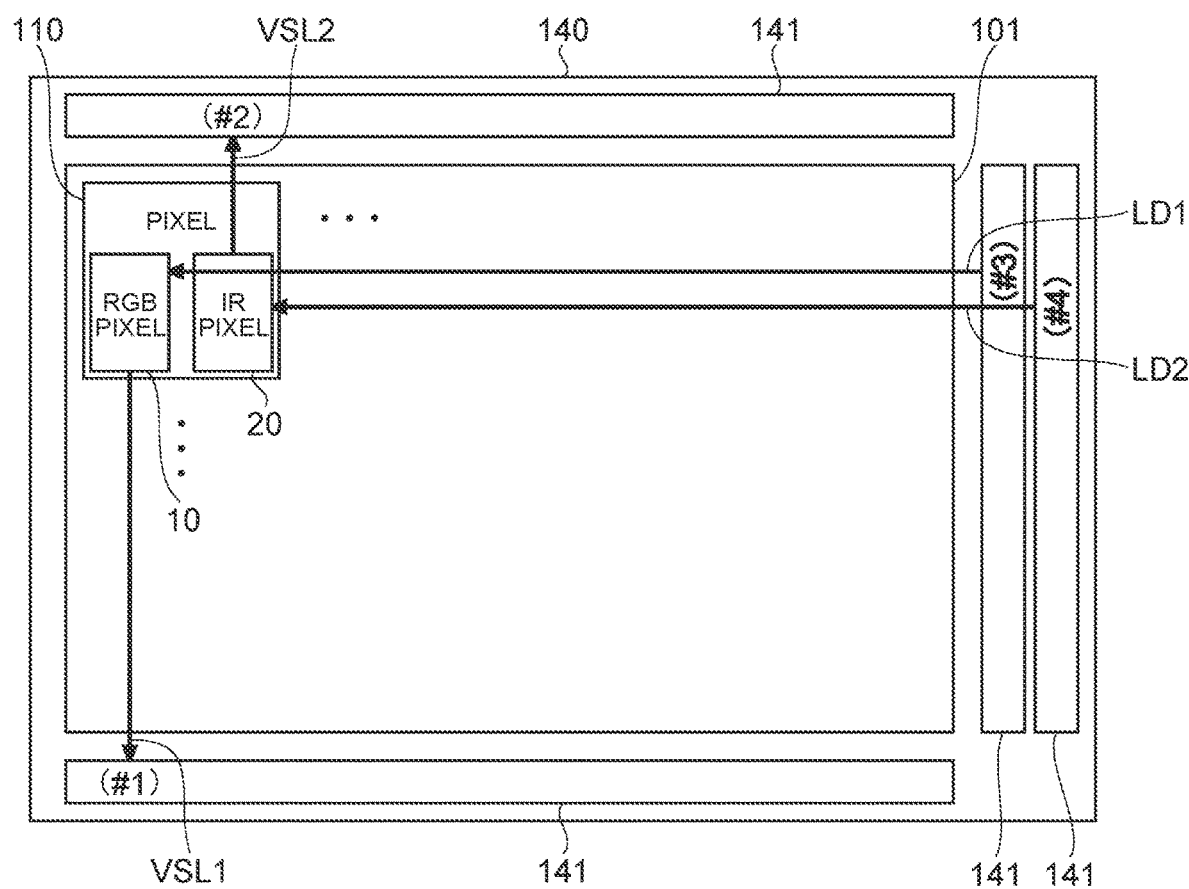
FIG. 17 is a diagram depicting a plan layout example of a pixel chip according to a third example the first embodiment.
Figure 18:
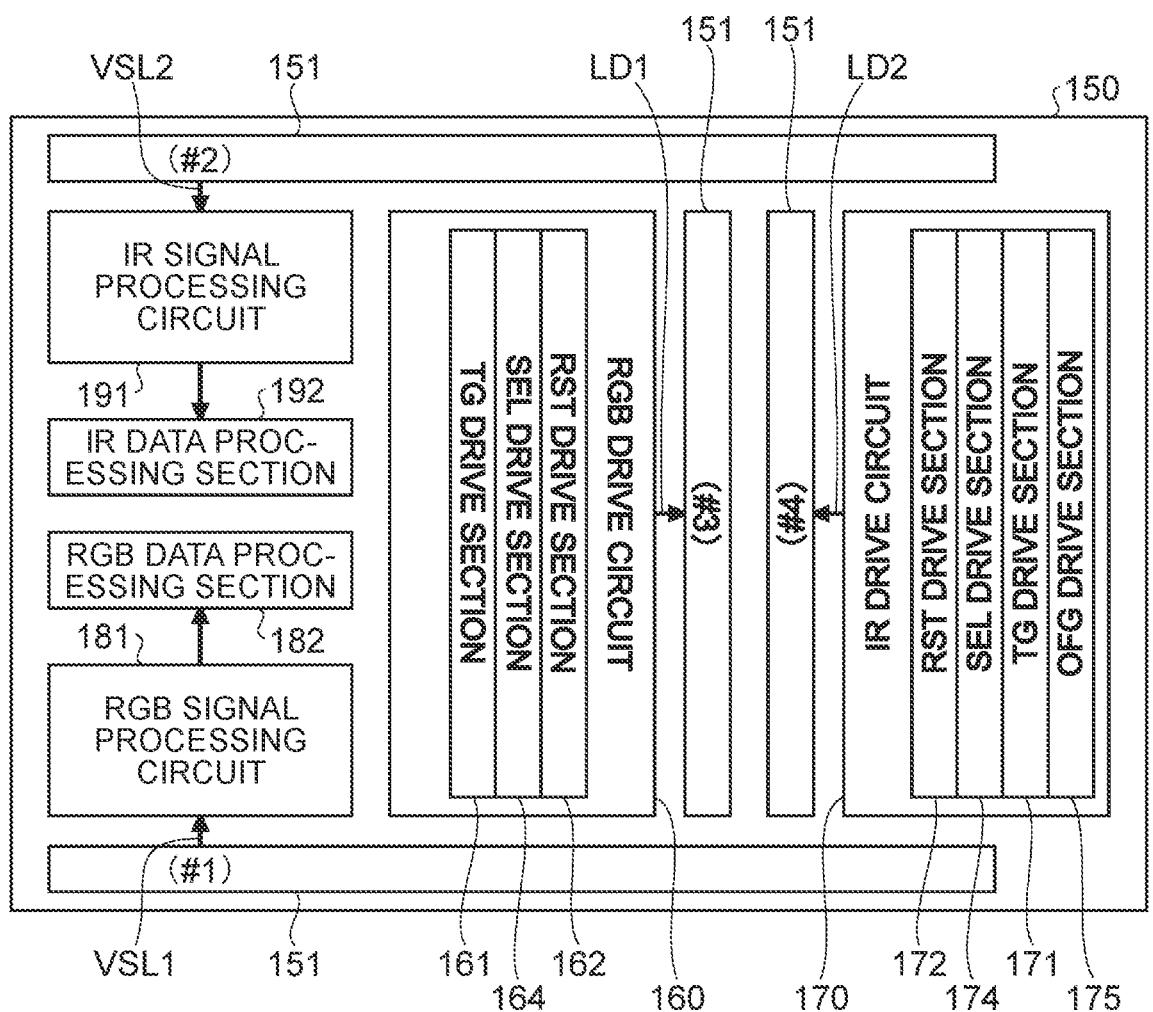
FIG. 18 is a diagram depicting a plan layout example of a circuit chip according to the third example the first embodiment.

In the third example, similarly to the first example and the second example, a case where a driving system for the RGB pixel 10 and a driving system for the IR pixel 20 are separately provided, and a readout system for the RGB pixel 10 and a readout system for the IR pixel 20 are separately provided will be described. FIGS. 17 and 18 are plan diagrams depicting layout examples according to the third example, FIG. 17 depicts a plan layout example of the pixel chip 140, and FIG. 18 depicts a plan layout example of the circuit chip 150.

(Pixel Chip 140)

As depicted in FIG. 17, in the plan layout of the pixel chip 140 according to the third example, in a layout similar to the plan layout according to the second example described with reference to FIG. 15, the RGB drive lines LD1 and the IR drive lines LD2 are connected to the connecting section 141 disposed on the same end side (in this example, the right end side) in the pixel chip 140.

(Circuit Chip 150)

As depicted in FIG. 18, in the plan layout of the circuit chip 150 according to the third example, in a layout similar to the plan layout according to the second example described with reference to FIG. 16, a readout system including the RGB signal processing circuit 181 and the RGB data processing unit 182, and the IR signal processing circuit 191 and the IR data processing unit 192 is disposed close to one end side (left end side in this example) of the circuit chip 150, and a driving system including the RGB drive circuit 160 and the IR drive circuit 170 is disposed close to the other end side (right end side in this example) of the circuit chip. The RGB drive circuit 160 and the IR drive circuit 170 are disposed in a manner that the connecting sections 151 face each other. Note that the positions of the RGB drive circuit 160 and the IR drive circuit 170 may be switched. Similarly, the positions of the RGB signal processing circuit 181 and the RGB data processing unit 182, and the positions of the IR signal processing circuit 191 and the IR data processing unit 192 may be switched.

As a result, in the third example, the RGB drive circuit 160 and the IR drive circuit 170 are disposed to face each other, in a manner that the connecting sections 151 are disposed close to each other. According to such a configuration, the wiring length from the RGB drive circuit 160 to the RGB pixel 10 and the wiring length from the IR drive circuit 170 to the IR pixel 20 can be made substantially the same, in a manner that control with higher accuracy can be performed.

In addition, according to the third example, similarly to the first example and the second example, since the driving system and the readout system for the RGB pixel 10 and the driving system and the readout system for the IR pixel 20 have different configurations independent from each other, it is possible to read out pixel signals simultaneously or substantially simultaneously from the RGB pixel 10 and the IR pixel 20 in the same unit pixel 110. As a result, it is possible to suppress the temporal deviation between the color image obtained from the RGB pixel 10 and the monochrome image (IR image) obtained from the IR pixel 20, and thus, it is possible to improve the accuracy of a result obtained by integrally processing information acquired by different sensors.

1.11.4 Fourth Example

Figure 19:
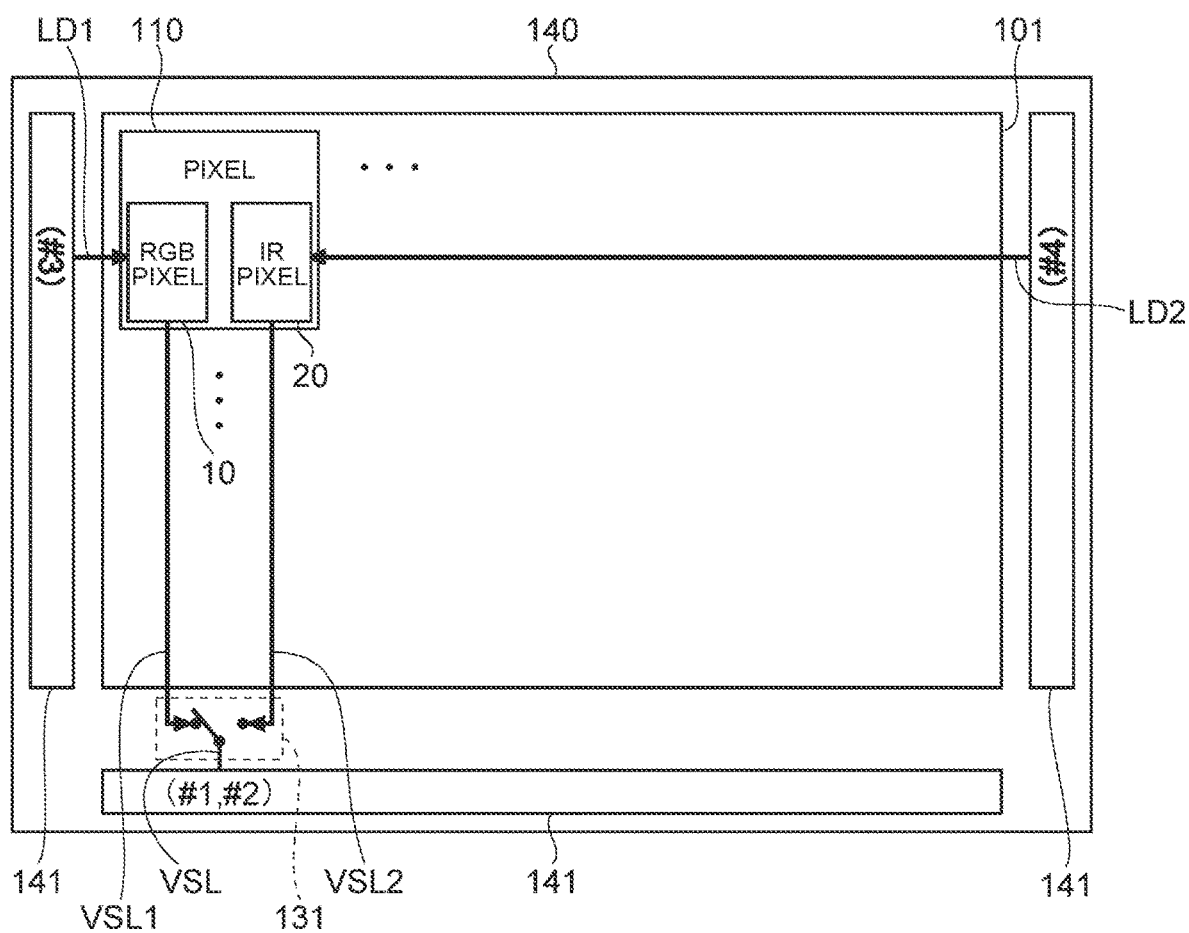
FIG. 19 is a diagram depicting a plan layout example of a pixel chip according to a fourth example the first embodiment.
Figure 20:
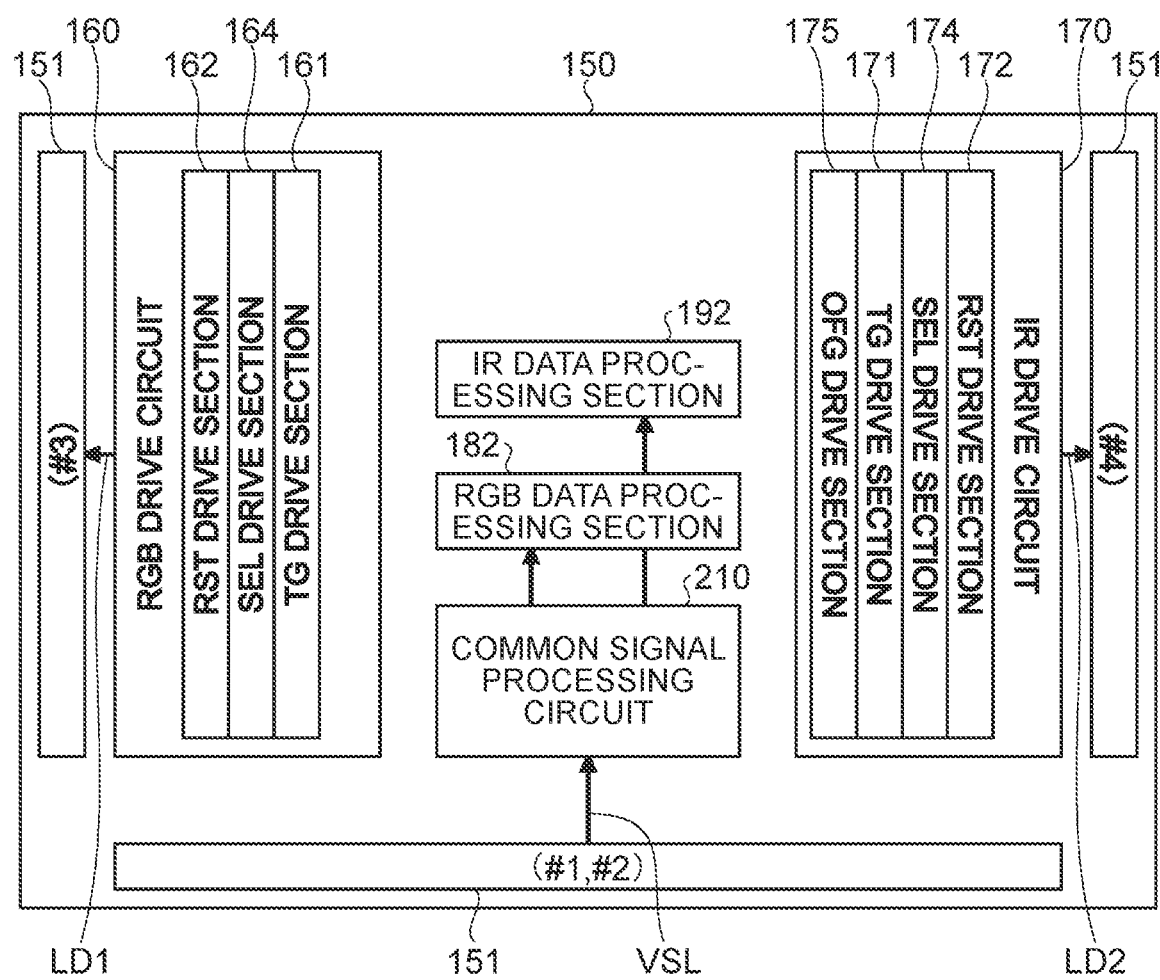
FIG. 20 is a diagram depicting a plan layout example of a circuit chip according to the fourth example the first embodiment.

In the fourth example, a case where a part of the readout system for the RGB pixel 10 and a part of the readout system for the IR pixel 20 are made common will be described. Note that, in the fourth example, the driving system for the RGB pixel 10 and the driving system for the IR pixel 20 may be provided separately similarly to the first example and the third example. In addition, in the fourth example, a case where the second example is used as a base is exemplified, but the present invention is not limited to this, and other examples can be used as a base. FIGS. 19 and 20 are plan diagrams depicting layout examples according to the fourth example, FIG. 19 depicts a plan layout example of the pixel chip 140, and FIG. 20 depicts a plan layout example of the circuit chip 150.

(Pixel Chip 140)

As depicted in FIG. 19, in the plan layout of the pixel chip 140 according to the fourth example, in a layout similar to the plan layout according to the second example described with reference to FIG. 15, the RGB drive lines LD1 and the IR drive lines LD2 are drawn out toward the same end (in this example, the lower end) in the pixel chip 140. The RGB drive line LD1 and the IR drive line LD2 that have been drawn out are connected to a common vertical signal line VSL via the switch circuit 131 provided outside the pixel array section 101. The vertical signal line VSL is connected to the connecting section 141 disposed on the lower end side of the pixel chip 140.

(Circuit Chip 150)

As depicted in FIG. 20, in the circuit chip 150 according to the fourth example, a common signal processing circuit 210 shared by the RGB pixel 10 and the IR pixel 20 is provided as the signal processing circuit 103. The common signal processing circuit 210 is connected to the connecting section 151 disposed on the lower end side of the circuit chip 150, generates a digital color image signal from the pixel signal read out from the RGB pixel 10 and inputs the digital color image signal to the RGB data processing unit 182, and generates a digital monochrome image signal from the pixel signal read out from the IR pixel 20 and inputs the digital monochrome image signal to the IR data processing unit 192.

As described above, in the fourth example, the RGB pixels 10 and the IR pixels 20 share the common signal processing circuit 210. As a result, the circuit scale of the signal processing circuit 103 can be reduced as compared with the case where the individual signal processing circuits 181 and 191 are provided, in a manner that the occupied area of the signal processing circuit 103 in the circuit chip 150 can be reduced.

In addition, by providing the switch circuit 131 for switching the vertical signal line connected to the common signal processing circuit 210 to either the vertical signal line VSL1 or the vertical signal line VSL2 in the pixel chip 140, it is possible to reduce the connecting sections 141 and 151 for electrically routing the vertical signal line of the pixel chip 140 to the circuit chip 150 to half, in a manner that it is possible to reduce the occupied area of the connecting section 141 in the pixel chip 140 and the occupied area of the connecting section 151 in the circuit chip 150.

Note that, in a case where the common signal processing circuit 210 is shared by the RGB pixels 10 and the IR pixels 20, reading from the RGB pixel 10 and reading from the IR pixel 20 may be executed in a time division manner, for example.

In addition, in the fourth example, the vertical signal line connected to the common signal processing circuit 210 is switched to either the vertical signal line VSL1 or the vertical signal line VSL2 by using the switch circuit 131. However, the present invention is not limited to this, and both the vertical signal line VSL1 and the vertical signal line VSL2 may be connected to the common signal processing circuit 210 on the side of the circuit chip 150 via the connecting section 151.

1.11.5 Fifth Example

Figure 21:
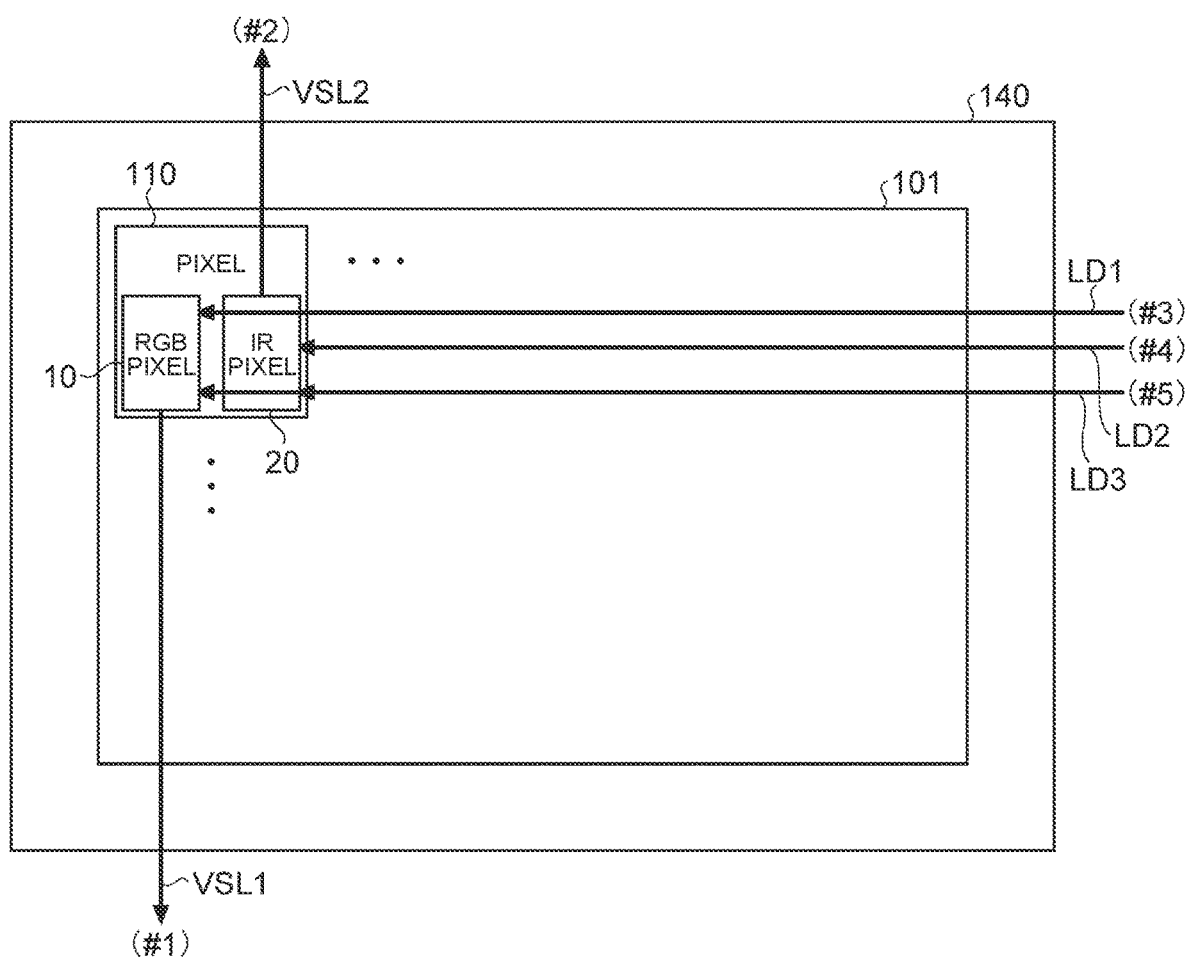
FIG. 21 is a diagram depicting a plan layout example of a pixel chip according to a fifth example the first embodiment.
Figure 22:
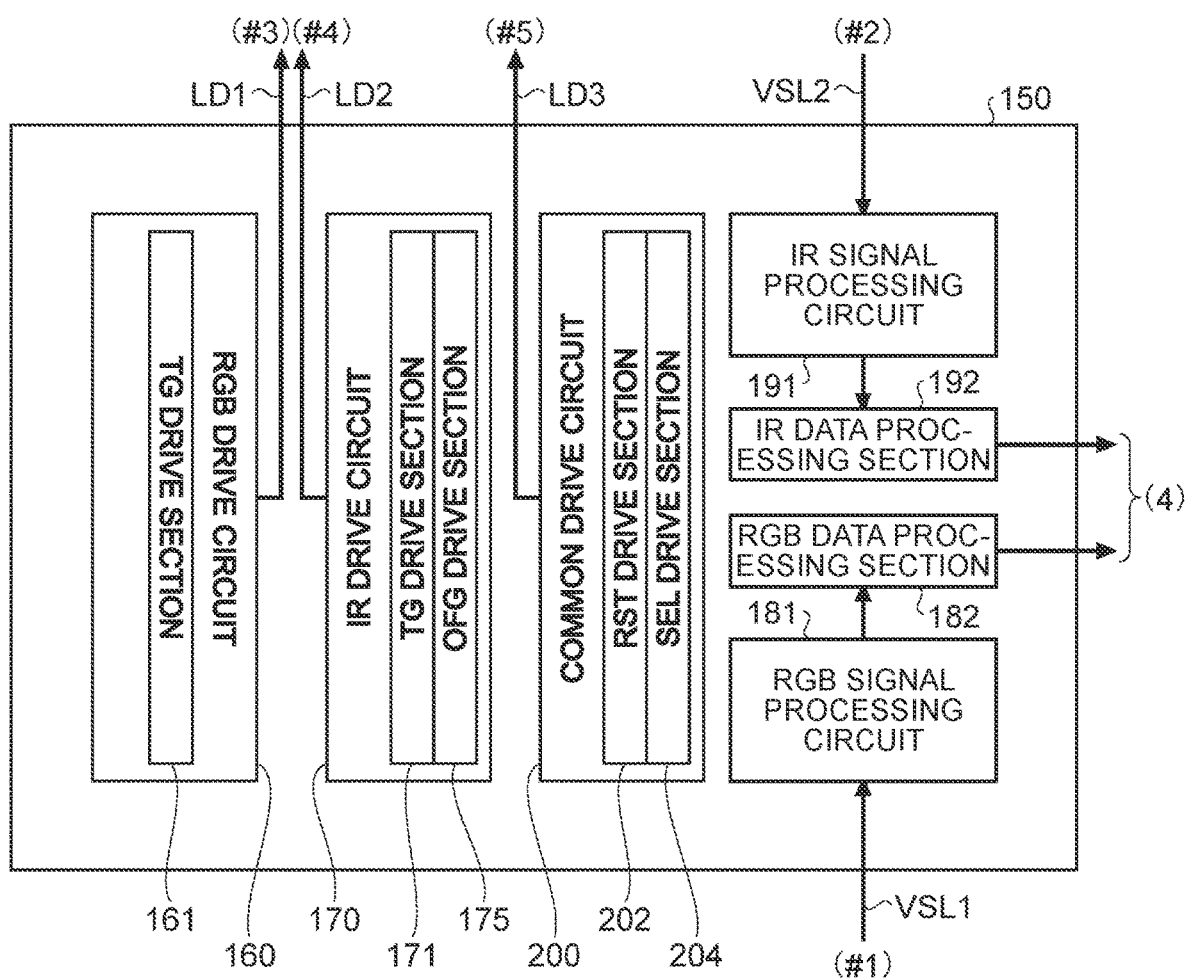
FIG. 22 is a diagram depicting a plan layout example of a circuit chip according to the fifth example the first embodiment.

In the fifth example, a case where a part of the driving system for the RGB pixel 10 and a part of the driving system for the IR pixel 20 are made common will be described. Note that, in the fifth example, the readout system for the RGB pixel 10 and the readout system for the IR pixel 20 may be provided separately similarly to the first example and the third example. In addition, in the fifth example, a case where the first example is used as a base is exemplified, but the present invention is not limited to this, and other examples can be used as a base. FIGS. 21 and 22 are plan diagrams depicting layout examples according to the fifth example, FIG. 21 depicts a plan layout example of the pixel chip 140, and FIG. 22 depicts a plan layout example of the circuit chip 150.

(Pixel Chip 140)

As depicted in FIG. 21, in the fifth example, in a layout similar to the plan layout according to the first example, the RGB drive line LD1 and a common drive line LD3 are connected to the RGB pixel 10 of each unit pixel 110, and the IR drive line LD2 and the common drive line LD3 are connected to the IR pixel 20. That is, in the fifth example, the common drive line LD3 is shared by the RGB pixels 10 and the IR pixels 20. Similarly to the RGB drive line LD1 and the IR drive line LD2, the common drive line LD3 may extend in the row direction or may extend in the column direction. In addition, the RGB drive line LD1, the IR drive line LD2, and the common drive line LD3 may extend from the same direction or may extend from different directions.

(Circuit Chip 150)

As depicted in FIG. 22, in the fifth example, the pixel drive circuit 102 includes the RGB drive circuit 160, the IR drive circuit 170, and a common drive circuit 200. The common drive circuit 200 includes an RST driving unit 202 in which the RST driving unit 162 in the RGB drive circuit 160 and the RST driving unit 172 in the IR drive circuit 170 are made common, and an SEL driving unit 204 in which the SEL driving unit 164 in the RGB drive circuit 160 and the SEL driving unit 174 in the IR drive circuit 170 are made common. Therefore, the RST driving unit 162 and the SEL driving unit 164 are omitted from the RGB drive circuit 160, and the RST driving unit 172 and the SEL driving unit 174 are omitted from the IR drive circuit 170. The common drive circuit 200 can correspond to, for example, an example of a third driving unit in the claims.

The RST driving unit 202 of the common drive circuit 200 supplies a reset control signal to both the reset transistor 12 of the RGB pixel 10 and the reset transistor 22 of the IR pixel 20 via the common drive line LD3. In addition, the SEL driving unit 204 supplies the selection control signal to both the selection transistor 14 of the RGB pixel 10 and the selection transistor 24 of the IR pixel 20 via the common drive line LD3.

As described above, in the fifth example, some of the RGB drive circuit 160 and the IR drive circuit 170 are made common. As a result, it is possible to improve the simultaneity between the drive control for the RGB pixels 10 and the drive control for the IR pixels, and thus, it is possible to suppress the temporal deviation between the color image obtained from the RGB pixel 10 and the monochrome image (IR image) obtained from the IR pixel 20.

In addition, since a part of the RGB drive circuit 160 and a part of the IR drive circuit 170 are made common, the circuit scale of the pixel drive circuit 102 can be reduced as compared with a case where the RGB drive circuit 160 and the IR drive circuit 170 are individually provided. This makes it possible to reduce the occupied area of the pixel drive circuit 102 in the circuit chip 150.

1.11.6 Sixth Example

Figure 23:
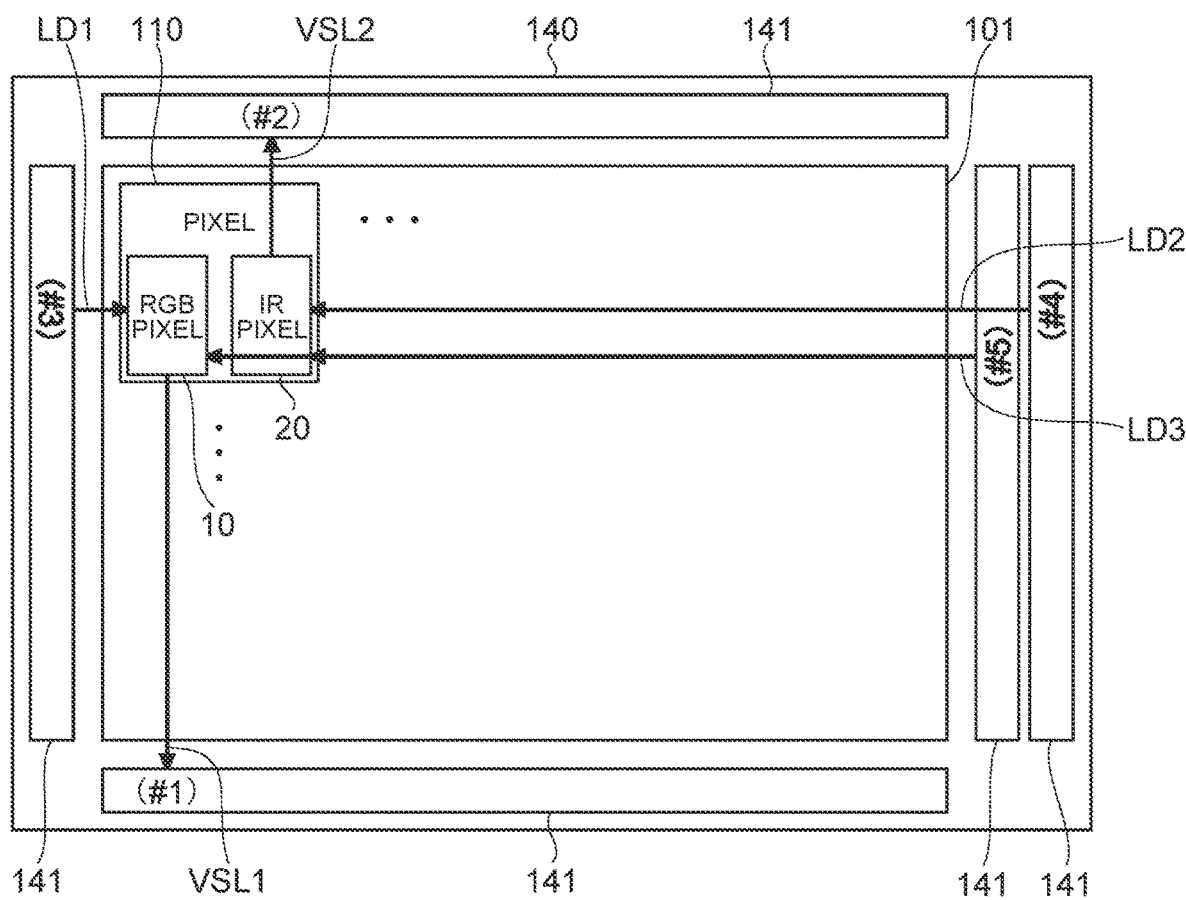
FIG. 23 is a diagram depicting a plan layout example of a pixel chip according to a sixth example the first embodiment.
Figure 24:
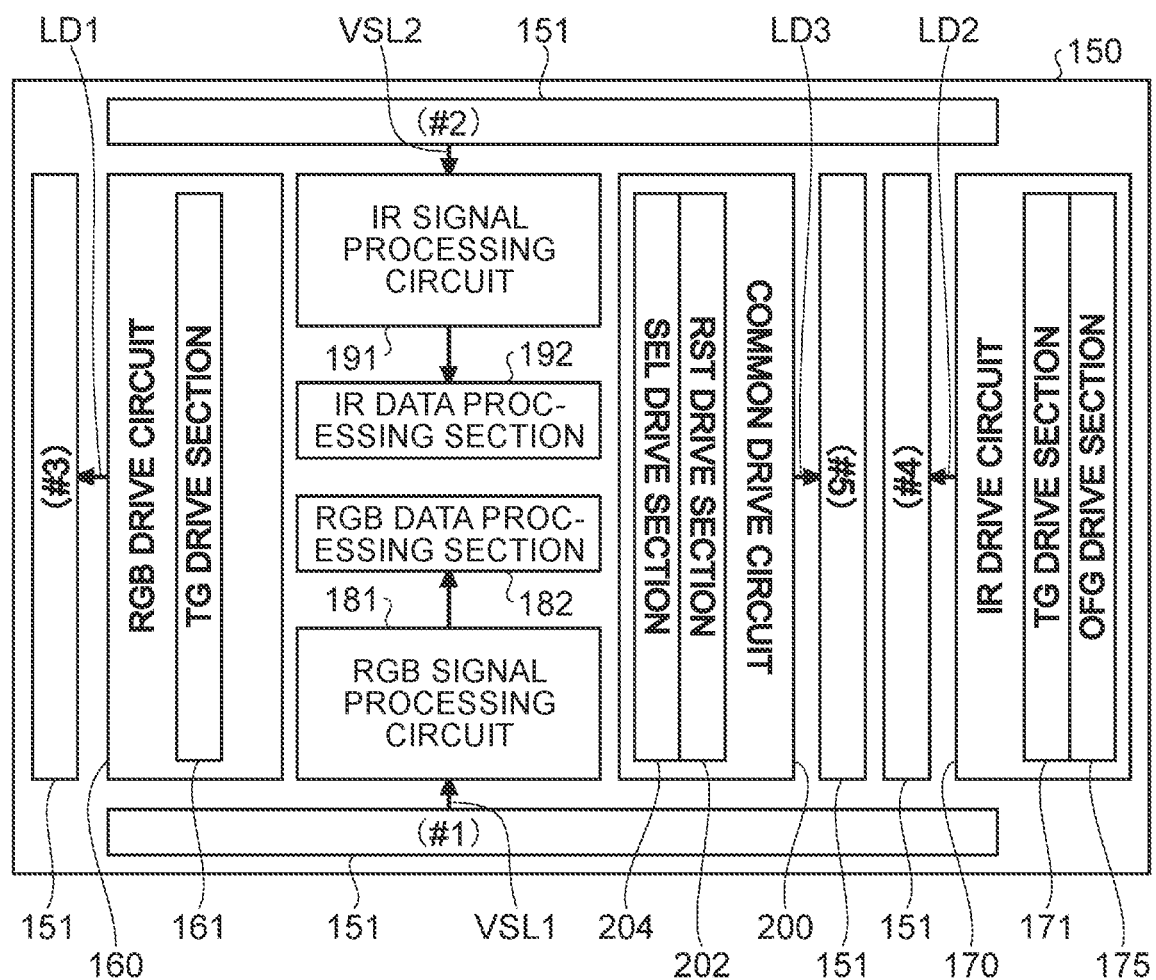
FIG. 24 is a diagram depicting a plan layout example of a circuit chip according to the sixth example the first embodiment.

In the sixth example, similarly to the fifth example, a case where a part of the driving system for the RGB pixel 10 and a part of the driving system for the IR pixel 20 are made common will be described. Note that in the sixth example, a case where the fifth example is used as a base is exemplified, but the present invention is not limited to this, and other examples can be used as a base. FIGS. 23 and 24 are plan diagrams depicting layout examples according to the sixth example, FIG. 23 depicts a plan layout example of the pixel chip 140, and FIG. 24 depicts a plan layout example of the circuit chip 150.

(Pixel Chip 140)

As depicted in FIG. 23, the plan layout of the pixel chip 140 according to the sixth example may be similar to the plan layout example of the pixel chip 140 according to the fifth example depicted in FIG. 21. However, in FIG. 23, a connecting section 141 for electrically connecting various elements provided in the pixel chip 140 to an element on the side of the circuit chip 150 is depicted. In addition, in FIG. 23, in the drawing, the RGB drive line LD1 is connected to the connecting section 141 on the left side, the IR drive line LD2 and the common drive line LD3 are connected to the connecting section 141 on the right end side, the vertical signal line VSL1 is connected to the connecting section 141 on the lower side, and the vertical signal line VSL2 is the connecting section 141 on the upper side.

(Circuit Chip 150)

As depicted in FIG. 24, in the sixth example, similarly to the fifth example, the pixel drive circuit 102 includes the RGB drive circuit 160, the IR drive circuit 170, and the common drive circuit 200, the signal processing circuit 103 includes the RGB signal processing circuit 181 and the IR signal processing circuit 191, and the data processing unit 108 includes the RGB data processing unit 182 and the IR data processing unit 192.

In the sixth example, the RGB drive circuit 160 is disposed on the left side of the circuit chip 150, for example, and is connected to the connecting section 151 at the left end of the circuit chip 150. On the other hand, the IR drive circuit 170 and the common drive circuit 200 are disposed on the right side of the circuit chip 150, for example, and are connected to the connecting section 151 at the right end of the circuit chip 150. The IR drive circuit 170 and the common drive circuit 200 are disposed in a manner that the connecting sections 151 face each other. Note that the positions of the RGB drive circuit 160, the IR drive circuit 170, and the common drive circuit 200 may be switched.

As described above, in the sixth example, the RGB drive circuit 160, the IR drive circuit 170, and the common drive circuit 200 are separately disposed on the left and right sides of the circuit chip 150. According to such a configuration, since the connection configuration to the RGB pixels 10 and the connection configuration to the IR pixels 20 on the side of the pixel chip 140 can be dispersed to the left and right, it is possible to reduce the density of wirings and connection terminals similarly to the second example described above. This makes it possible to suppress characteristic deterioration due to coupling between wirings and the like.

In addition, since the connecting section 151 of the RGB drive circuit 160, the connecting section 151 of the IR drive circuit 170, and the connecting section 151 of the common drive circuit 200 are disposed at the left and right ends of the circuit chip 150, the average wiring length from the RGB drive circuit 160 and the common drive circuit 200 to the RGB pixels 10 and the average wiring length from the IR drive circuit 170 and the common drive circuit 200 to the IR pixels 20 can be made substantially the same, in a manner that more accurate control can be performed.

Furthermore, according to the sixth example, similarly to the fifth example, since a part of the RGB drive circuit 160 and the IR drive circuit 170 is made common, it is possible to improve the simultaneity between the drive control for the RGB pixels 10 and the drive control for the IR pixels, and thus, it is possible to suppress the temporal deviation between the color image obtained from the RGB pixel 10 and the monochrome image (IR image) obtained from the IR pixel 20.

Furthermore, since a part of the RGB drive circuit 160 and a part of the IR drive circuit 170 are made common, the occupied area of the pixel drive circuit 102 in the circuit chip 150 can be reduced.

1.11.7 Seventh Example

Figure 25:
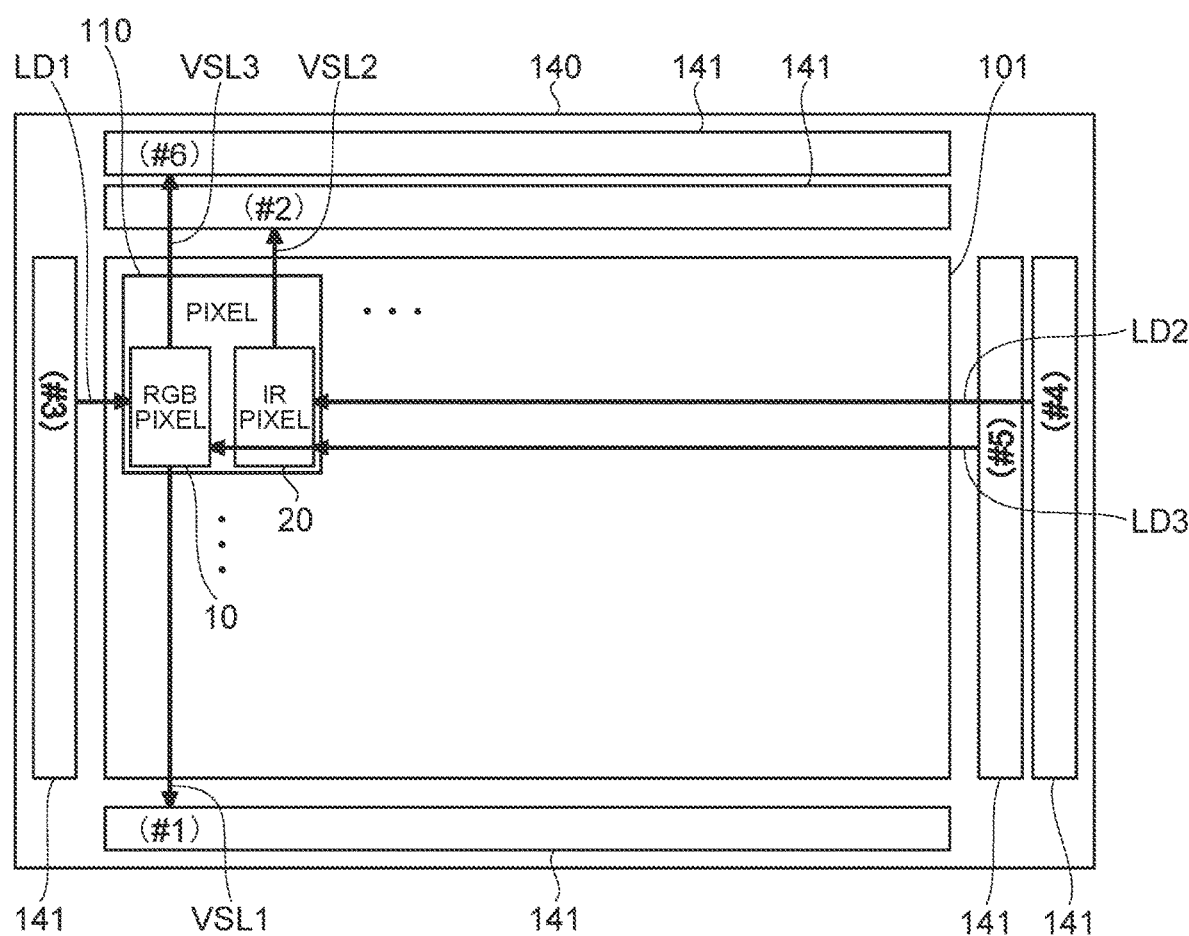
FIG. 25 is a diagram depicting a plan layout example of a pixel chip according to a seventh example the first embodiment.
Figure 26:
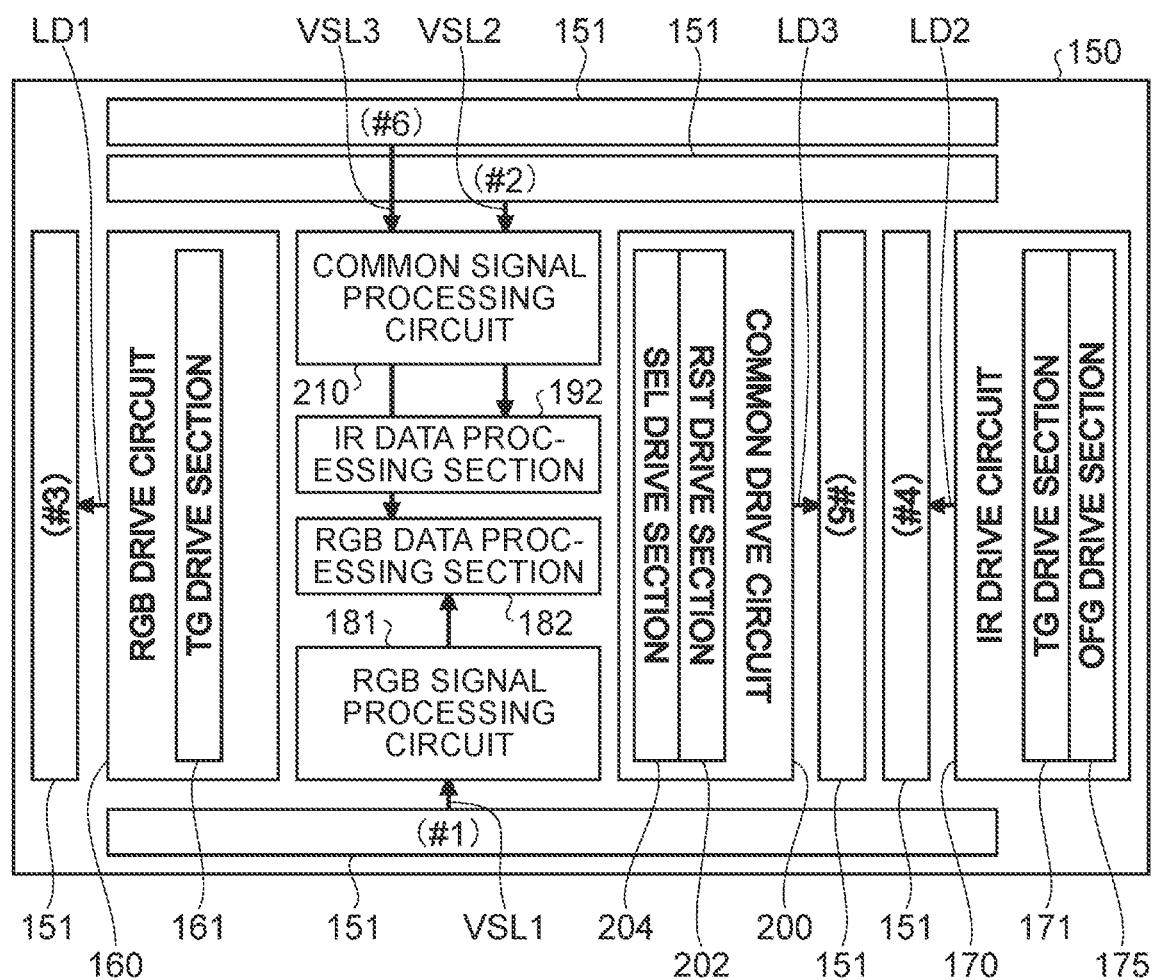
FIG. 26 is a diagram depicting a plan layout example of a circuit chip according to the seventh example the first embodiment.

In the seventh example, similarly to the fifth example and the sixth example, a case where a part of the driving system for the RGB pixel 10 and a part of the driving system for the IR pixel 20 are made common will be described. Note that, in the seventh example, a case where the sixth example is used as a base is exemplified, but the present invention is not limited to this, and other examples can be used as a base. FIGS. 25 and 26 are plan diagrams depicting layout examples according to the seventh example, FIG. 25 depicts a plan layout example of the pixel chip 140, and FIG. 26 depicts a plan layout example of the circuit chip 150.

(Pixel Chip 140)

As depicted in FIG. 25, in the seventh example, the RGB pixel 10 of each unit pixel 110 is connected to either the vertical signal line VSL1 connected to the connecting section 141 disposed on the lower end side in the plane of the drawing or a vertical signal line VSL3 connected to the connecting section 141 disposed on the upper end side in the plane of the drawing. The vertical signal line VSL1 extends in the column direction, for example, and is electrically routed to the side of the circuit chip 150 via the connecting section 141 disposed at the lower end of the pixel chip 140. On the other hand, the vertical signal line VSL3 extends in the column direction, for example, and is electrically routed to the side of the circuit chip 150 via the connecting section 141 disposed at the upper end of the pixel chip 140.

Which of the vertical signal line VSL1 and the vertical signal line VSL3 the RGB pixel 10 is connected to may be determined based on, for example, a wavelength component (that is, the type of the color filter 31 assigned to each RGB pixel 10) to be detected by each RGB pixel 10. For example, in a case where the array of the color filters 31 is configured in the Bayer array, the RGB pixels 10 that detect the red (R) wavelength component and the RGB pixels 10 that detect the blue (B) wavelength component may be connected to the vertical signal line VSL1, and the RGB pixels 10 that detect the green (G) wavelength component may be connected to the vertical signal line VSL3. However, the connection relationship is not limited to such a connection relationship, and various modifications can be made, for example, the RGB pixels 10 in the odd-numbered columns or the odd-numbered rows are connected to the vertical signal line VSL1, and the RGB pixels 10 in the even-numbered columns or the even-numbered rows are connected to the vertical signal line VSL3, or the RGB pixels 10 in the lower half in the pixel array section 101 are connected to the vertical signal line VSL1, and the RGB pixels 10 in the upper half are connected to the vertical signal line VSL3.

(Circuit Chip 150)

As depicted in FIG. 26, in the seventh example, similarly to the sixth example, the pixel drive circuit 102 includes the RGB drive circuit 160, the IR drive circuit 170, and a common drive circuit 200. On the other hand, the signal processing circuit 103 includes the RGB signal processing circuit 181 and the common signal processing circuit 210. The data processing unit 108 includes the RGB data processing unit 182 and the IR data processing unit 192. The common signal processing circuit 210 can correspond to, for example, another example of the second readout section in the claims.

The pixel signals from a part of the RGB pixels 10 are input to the common signal processing circuit 210 via the vertical signal line VSL3. In addition, a pixel signal from the IR pixel 20 is also input to the common signal processing circuit 210. The common signal processing circuit 210 generates a digital color image signal from the analog pixel signal input from the vertical signal line VSL3 and inputs the digital color image signal to the RGB data processing unit 182, and generates a digital monochrome image signal from the analog pixel signal input from the vertical signal line VSL2 and inputs the digital monochrome image signal to the IR data processing unit 192.

As described above, in the seventh example, reading from the RGB pixel 10 is dispersed to the RGB signal processing circuit 181 and the common signal processing circuit 210. As a result, the readout operation for the plurality of RGB pixels 10 can be executed in parallel, in a manner that the reading speed of the color image can be improved.

Note that, in the seventh example, a case where reading from the RGB pixels 10 is parallelized has been exemplified, but the present invention is not limited to this, and reading from the IR pixels 20 may be parallelized.

1.11.8 Eighth Example

Figure 27:
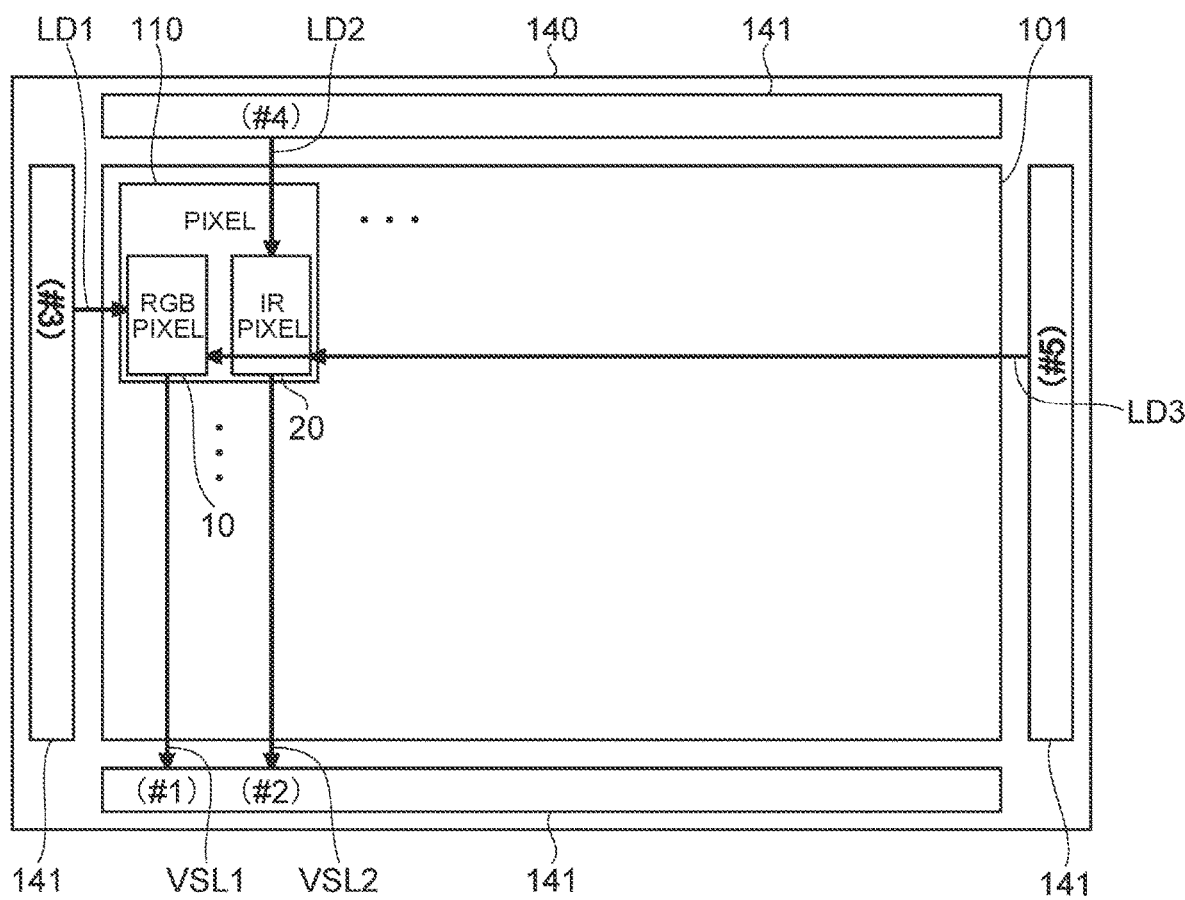
FIG. 27 is a diagram depicting a plan layout example of a pixel chip according to an eighth example the first embodiment.
Figure 28:
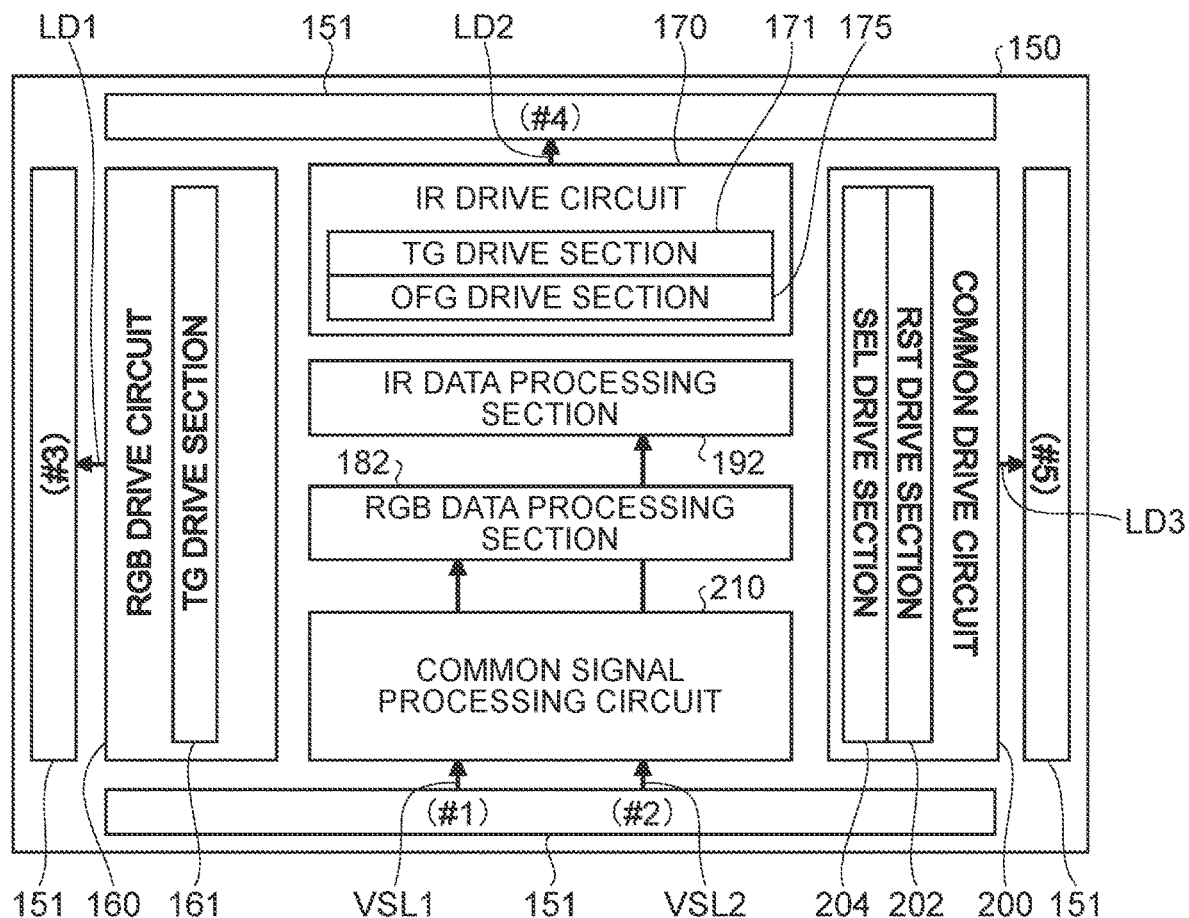
FIG. 28 is a diagram depicting a plan layout example of a circuit chip according to the eighth example the first embodiment.

In the eighth example, a case where a part of the readout system for the RGB pixel 10 and a part of the readout system for the IR pixel 20 are made common, and a part of the driving system for the RGB pixel 10 and a part of the driving system for the IR pixel 20 are made common will be described. Note that, in the eighth example, a case where the commonality of the readout system is based on the fourth example, and the commonality of the driving system is based on the sixth example will be exemplified, but the present invention is not limited to this, and other examples can be used as the base. FIGS. 27 and 28 are plan diagrams depicting layout examples according to the seventh example, FIG. 27 depicts a plan layout example of the pixel chip 140, and FIG. 28 depicts a plan layout example of the circuit chip 150.

(Pixel Chip 140)

As depicted in FIG. 27, in the plan layout of the pixel chip 140 according to the seventh example, in a layout similar to the plan layout according to the sixth example described with reference to FIG. 23, the RGB drive lines LD1 is drawn out from the connecting section 141 disposed at the left end of the pixel chip 140, the IR drive line LD2 is drawn out from the connecting section 141 disposed at the upper end, and the common drive line LD3 is drawn out from the connecting section 141 disposed at the right end. Note that, in the seventh example, the switch circuit 131 in the fourth example is omitted, but as described with reference to FIG. 19, the switch circuit 131 may be provided for the vertical signal lines VSL1 and VSL2.

(Circuit Chip 150)

As depicted in FIG. 28, in the fourth example, the RGB drive circuit 160 is disposed on the left side of the circuit chip 150, the IR drive circuit 170 is disposed on the upper center, the common drive circuit 200 is disposed on the right side, and the common signal processing circuit 210, the RGB data processing unit 182, and the IR data processing unit 192 are disposed on the lower center.

As described above, in the configuration in which a part of the readout system for the RGB pixel 10 and the IR pixel 20 is made common, in a case where a part of the driving system for the RGB pixel 10 and the IR pixel 20 is further is common, the connecting section 151 connected to the RGB drive circuit 160, the connecting section 151 connected to the IR drive circuit 170, the connecting section 151 connected to the common drive circuit 200, and the connecting section 151 connected to the common signal processing circuit 210 can be dispersed in four sides of the circuit chip 150. As a result, it is possible to reduce the density of wirings and connection terminals, and thus, it is possible to suppress characteristic deterioration due to coupling between wirings and the like.

In addition, in the seventh example, similarly to the fourth example, by sharing the common signal processing circuit 210 between the RGB pixel 10 and the IR pixel 20, it is possible to reduce the occupied area of the signal processing circuit 103 in the circuit chip 150.

Furthermore, in the seventh example, similarly to the sixth example, since a part of the RGB drive circuit 160 and the IR drive circuit 170 is made common, it is possible to improve the simultaneity between the drive control for the RGB pixels 10 and the drive control for the IR pixels. As a result, it is possible to suppress the temporal deviation between the color image obtained from the RGB pixel 10 and the monochrome image (IR image) obtained from the IR pixel 20.

Furthermore, since a part of the driving system and a part of the readout system are made common, the occupied area of the pixel drive circuit 102 and the signal processing circuit 103 in the circuit chip 150 can be reduced.

1.11.9 Ninth Example

Figure 29:
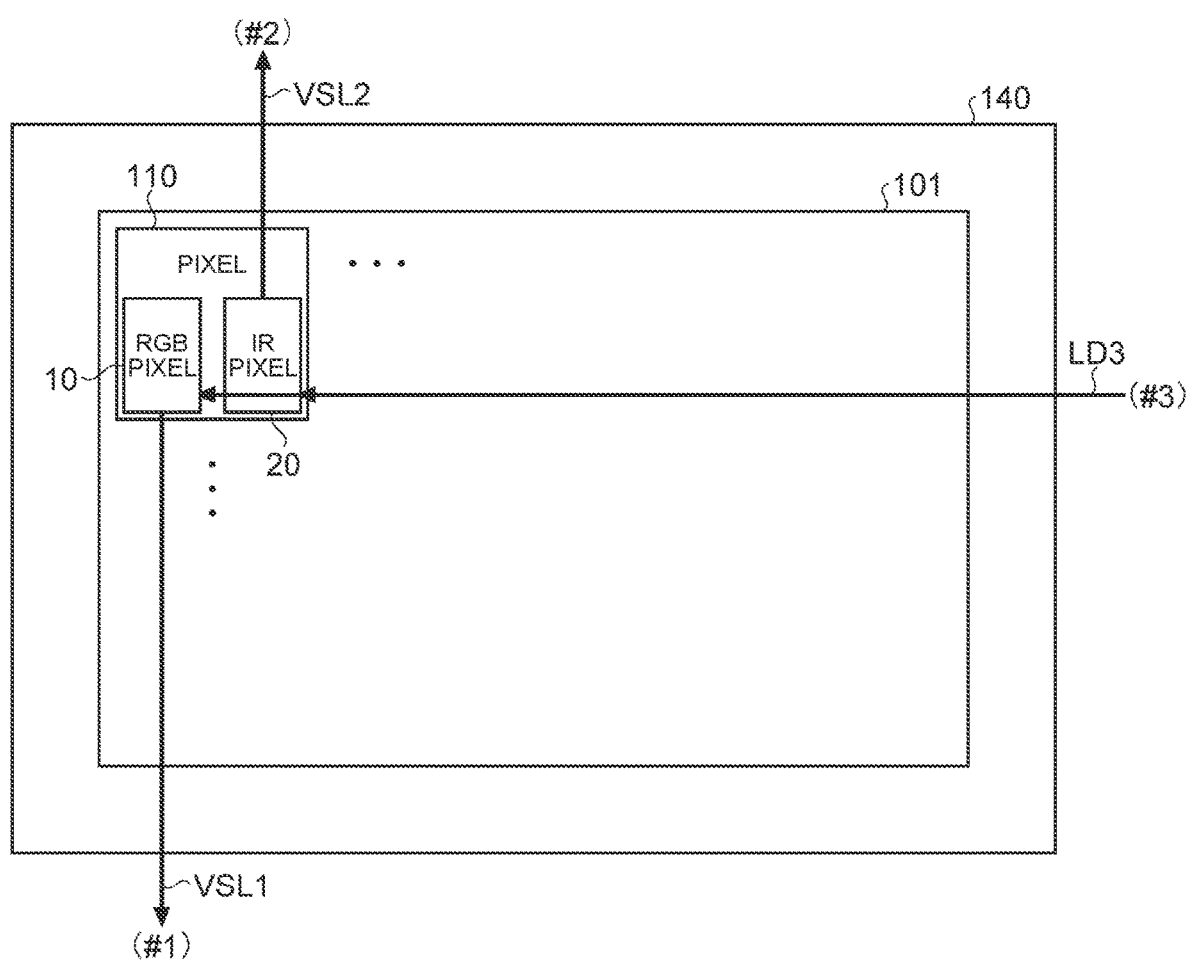
FIG. 29 is a diagram depicting a plan layout example of a pixel chip according to a ninth example the first embodiment.
Figure 30:
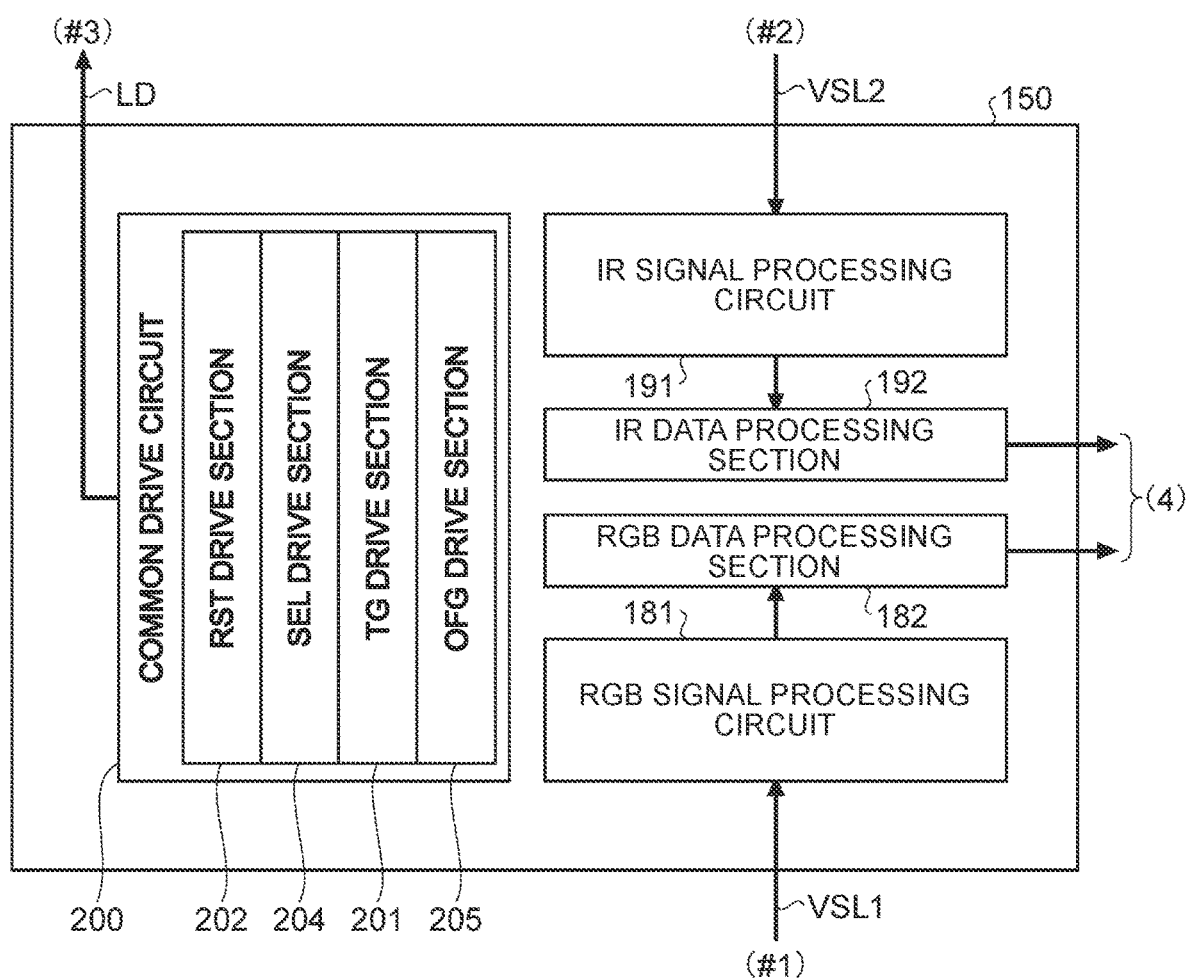
FIG. 30 is a diagram depicting a plan layout example of a circuit chip according to the ninth example the first embodiment.

In the ninth example, a case where the driving system for the RGB pixel 10 and the driving system for the IR pixel 20 are made common will be described. Note that, in the ninth example, the readout system for the RGB pixel 10 and the readout system for the IR pixel 20 may be provided separately. In addition, in the ninth example, a case where the first example is used as a base is exemplified, but the present invention is not limited to this, and other examples can be used as a base. FIGS. 29 and 30 are plan diagrams depicting layout examples according to the ninth example, FIG. 29 depicts a plan layout example of the pixel chip 140, and FIG. 30 depicts a plan layout example of the circuit chip 150.

(Pixel Chip 140)

As depicted in FIG. 29, in the plan layout of the pixel chip 140 according to the ninth example, in a layout similar to the plan layout according to the first example described with reference to FIG. 13, the RGB drive line LD1 and the IR drive line LD2 are replaced with the common drive line LD3 shared by the RGB pixels 10 and the IR pixels 20.

(Circuit Chip 150)

As depicted in FIG. 30, in the ninth example, the pixel drive circuit 102 includes the common drive circuit 200 shared by the RGB pixels 10 and the IR pixels 20. In the present example, the common drive circuit 200 includes a TG driving unit 201 that supplies a transfer control signal to the transfer gate 11 of the RGB pixel 10 and the transfer transistor 21 of the IR pixel 20, the RST driving unit 202 that supplies a reset control signal to the reset transistor 12 of the RGB pixel 10 and the reset transistor 22 of the IR pixel 20, the SEL driving unit 204 that supplies a selection control signal to the selection transistor 14 of the RGB pixel 10 and the selection transistor 24 of the IR pixel 20, and an OFG driving unit 205 that supplies a discharge control signal to the discharge transistor 25 of the IR pixel 20.

As described above, in the ninth example, the RGB drive circuit 160 and the IR drive circuit 170 are made common. As a result, it is possible to further improve the simultaneity between the drive control for the RGB pixels 10 and the drive control for the IR pixels, and thus, it is possible to suppress the temporal deviation between the color image obtained from the RGB pixel 10 and the monochrome image (IR image) obtained from the IR pixel 20.

In addition, since the RGB drive circuit 160 and the IR drive circuit 170 are made common, the circuit scale of the pixel drive circuit 102 can be greatly reduced as compared with a case where the RGB drive circuit 160 and the IR drive circuit 170 are individually provided. This makes it possible to further reduce the occupied area of the pixel drive circuit 102 in the circuit chip 150.

1.11.10 10th Example

Figure 31:
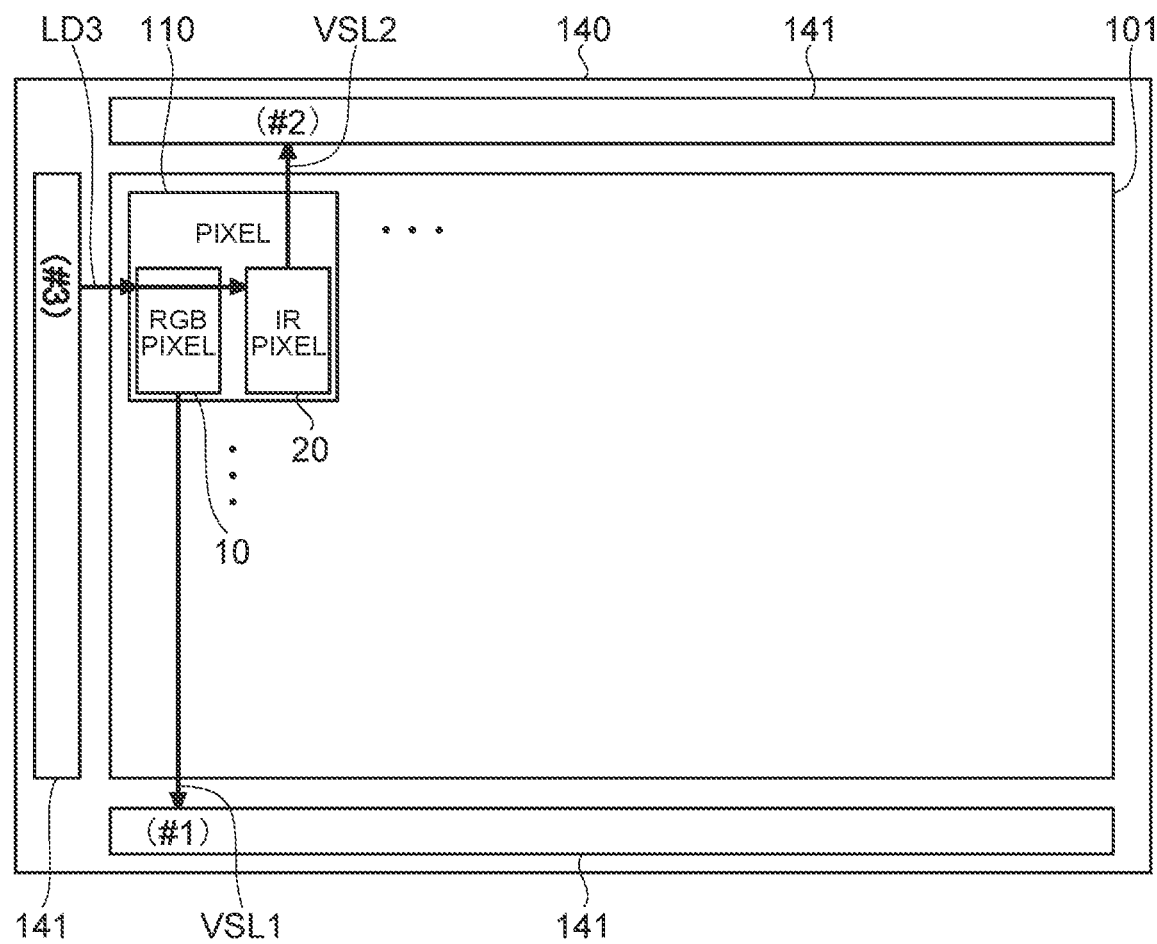
FIG. 31 is a diagram depicting a plan layout example of a pixel chip according to a 10th example the first embodiment.
Figure 32:
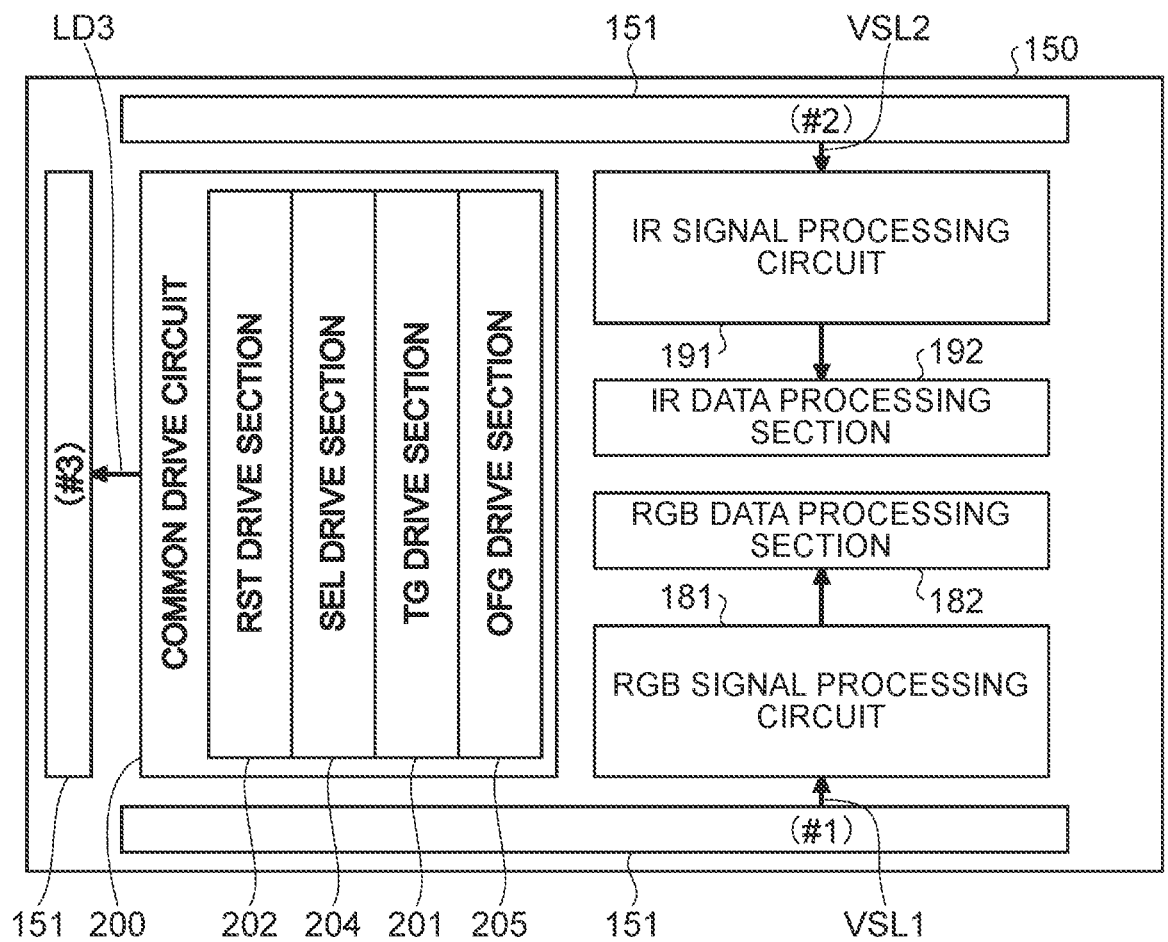
FIG. 32 is a diagram depicting a plan layout example of a circuit chip according to the 10th example the first embodiment.

In the 10th example, a plan layout in which the connecting sections 141 and 151 are disposed on the pixel chip 140 and the circuit chip 150 in the plan layout exemplified in the ninth example is exemplified. FIGS. 31 and 32 are plan diagrams depicting layout examples according to the 10th example, FIG. 31 depicts a plan layout example of the pixel chip 140, and FIG. 32 depicts a plan layout example of the circuit chip 150.

(Pixel Chip 140)

As depicted in FIG. 31, in the 10th example, for example, the common drive line LD3 may be connected to the connecting section 141 disposed at the left end of the pixel chip 140, the vertical signal line VSL1 may be connected to the connecting section 141 disposed at the lower end of the pixel chip 140, and the vertical signal line VSL2 may be connected to the connecting section disposed at the upper end of the pixel chip 140. However, the present invention is not limited to this, and the vertical signal lines VSL1 and VSL2 and the common drive line LD3 may extend in the column direction or may extend in the row direction. In addition, the vertical signal lines VSL1 and VSL2 and the common drive line LD3 may extend from the same direction or may extend from different directions.

(Circuit Chip 150)

As depicted in FIG. 30, the connecting section 151 in the circuit chip 150 may be disposed to correspond to the arrangement of the connecting section 141 in the pixel chip 140. Such a correspondence relationship may be similar for other examples.

1.11.11 11th Example

Figure 33:
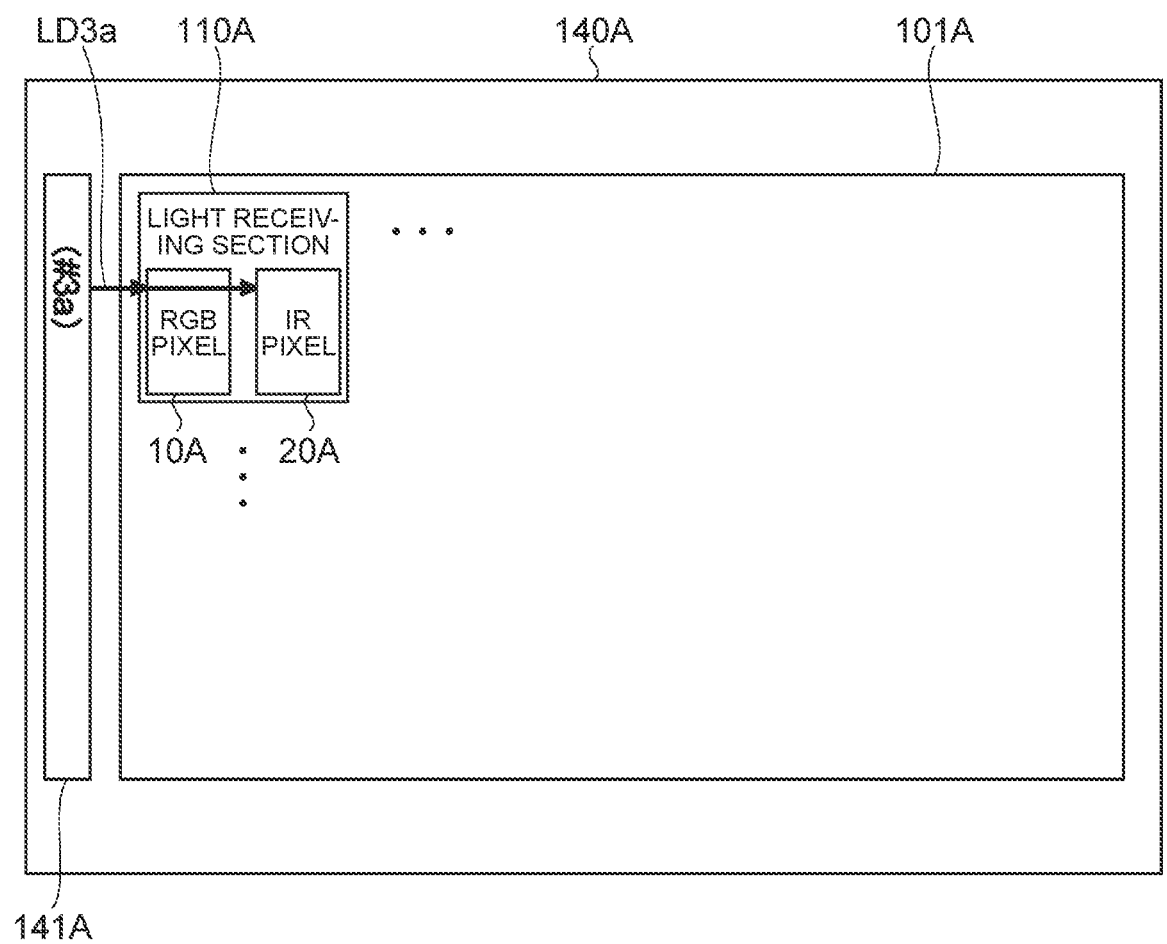
FIG. 33 is a diagram depicting a plan layout example of an upper layer pixel chip according to an 11th example the first embodiment.

In the first example to the 10th example described above, the case where the image sensor 100 is a two-layer stacked chip formed by bonding the pixel chip 140 and the circuit chip 150 has been exemplified. However, the stacked structure of the image sensor 100 is not limited to two layers, and may be one layer or three or more layers. Therefore, in the 11th example, a case where the image sensor 100 is a three-layer stacked chip will be described. Note that, in the 11th example, a case where the 10th example is used as a base is exemplified, but the present invention is not limited to this, and other examples can be used as a base. FIGS. 33 and 35 are plan diagrams depicting layout examples according to the 11th example, FIG. 33 depicts a plan layout example of an upper layer pixel chip 140A, FIG. 34 depicts a plan layout example of a lower layer pixel chip 140B, and FIG. 35 depicts a plan layout example of the circuit chip 150.

(Pixel Chip)

Figure 34:
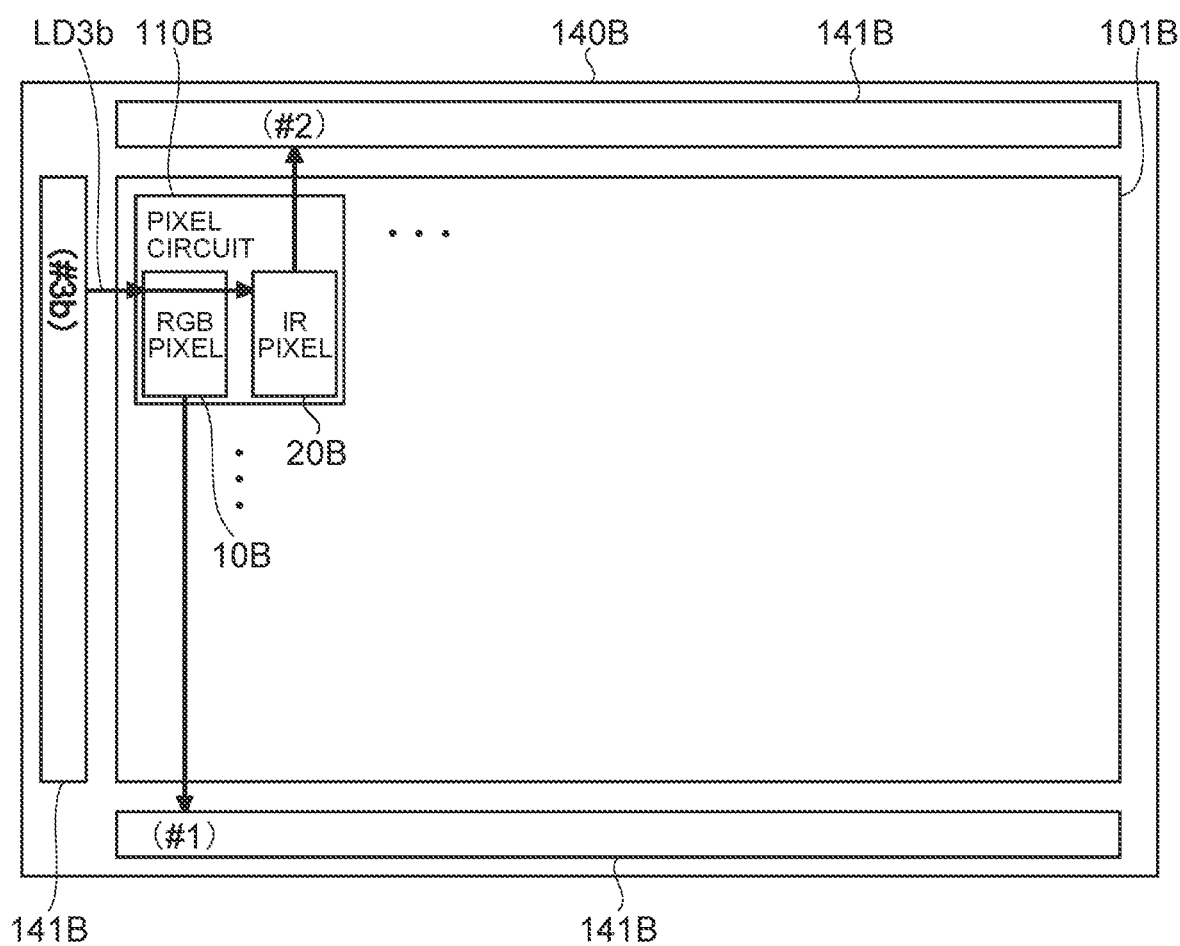
FIG. 34 is a diagram depicting a plan layout example of a lower layer pixel chip according to an 11th example the first embodiment.
Figure 35:
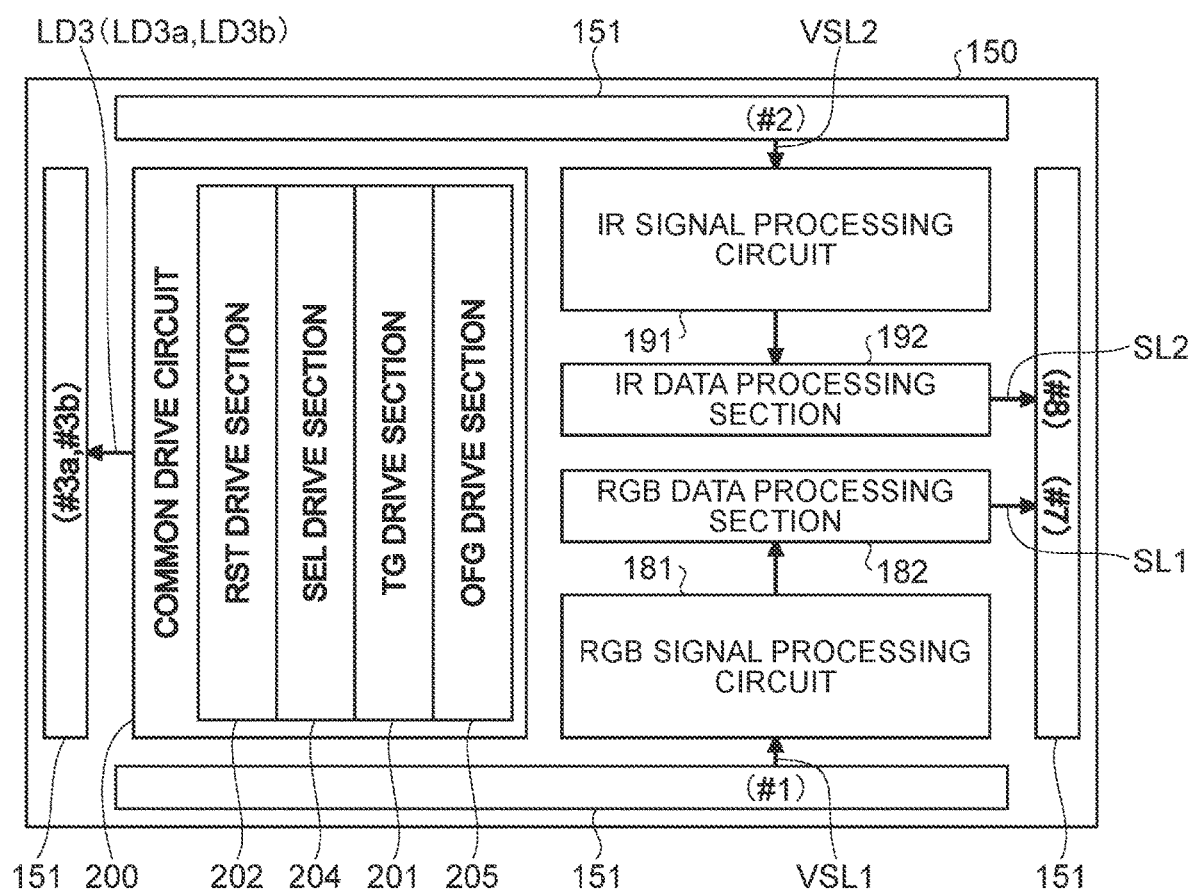
FIG. 35 is a diagram depicting a plan layout example of a circuit chip according to the 11th example the first embodiment.

As depicted in FIGS. 33 and 34, in the 11th example, the pixel chip 140 has a two-layer structure in which the upper layer pixel chip 140A disposed on the light incident surface side and the lower layer pixel chip 140B disposed on the circuit chip 150 side are bonded.

Upper Layer Pixel Chip 140A

In the upper layer pixel chip 140A, for example, a light receiving section 110A in each unit pixel 110 is disposed. The array of the light receiving sections 110A may have a two-dimensional lattice shape similarly to the array of the unit pixels 110 in the pixel array section 101.

The light receiving section 110A can include, for example, the photoelectric conversion section PD1 and the transfer gate 11 of the RGB pixel 10, and the photoelectric conversion section PD2 and the transfer transistor 21 of the IR pixel 20 in the configuration of the unit pixel 110 depicted in FIG. 4. That is, an RGB pixel 10A in FIG. 33 may include the photoelectric conversion section PD1 and the transfer gate 11, and an IR pixel 20A may include the photoelectric conversion section PD2, the transfer transistor 21, and the discharge transistor 25.

The transfer gate 11 of the RGB pixel 10A and the transfer transistor 21 and the discharge transistor 25 of the IR pixel 20A are connected to a drive line LD3a of the common drive line LD3 via a connecting section 141A disposed at the left end of the upper layer pixel chip 140A.

Lower Layer Pixel Chip 140B

In the lower layer pixel chip 140B, for example, a pixel circuit 110B in each unit pixel 110 is disposed. The array of the pixel circuit 110B may have a two-dimensional lattice shape similarly to the array of the unit pixels 110 in the pixel array section 101.

The pixel circuit 110B can include, for example, the reset transistor 12, the floating diffusion region FD1, the amplification transistor 13, and the selection transistor 14 of the RGB pixel 10, and the reset transistor 22, the floating diffusion region FD2, the amplification transistor 23, and the selection transistor 24 of the IR pixel 20 in the configuration of the unit pixel 110 depicted in FIG. 4. That is, an RGB pixel 10B in FIG. 34 can include the reset transistor 12, the floating diffusion region FD1, the amplification transistor 13, and the selection transistor 14, and an IR pixel 20B can include the reset transistor 22, the floating diffusion region FD2, the amplification transistor 23, and the selection transistor 24.

A drive line LD3b of the common drive line LD3 is connected to the reset transistor 12 of the RGB pixel 10B and the reset transistor 22 of the IR pixel 20B via a connecting section 141B disposed at the left end of the lower layer pixel chip 140B. Similarly, the drive line LD3b is connected to the selection transistor 14 of the RGB pixel 10B and the selection transistor 24 of the IR pixel 20B via the connecting section 141B.

In addition, the vertical signal lines VSL1 and VSL2 for reading out a pixel signal from the RGB pixel 10 and the IR pixel 20, respectively, may be provided in the lower layer pixel chip 140B. For example, the vertical signal line VSL1 for reading out the pixel signal from the RGB pixel 10 may be connected to the connecting section 141B disposed at the lower end of the lower layer pixel chip 140B, and the vertical signal line VSL2 for reading out the pixel signal from the IR pixel 20 may be connected to the connecting section 141B disposed at the upper end of the lower layer pixel chip 140B.

(Circuit Chip 150)

The plan layout of the circuit chip 150 according to the 11th example may be, for example, similar to the plan layout of the circuit chip 150 exemplified in the 10th example. Note that the common drive lines LD3 extending from the common drive circuit 200 include the drive lines LD3a and LD3b.

As described above, in the 11th example, the photoelectric conversion section PD1 and the transfer gate 11 in the RGB pixel 10, the reset transistor 12, the floating diffusion region FD1, the amplification transistor 13, and the selection transistor 14 are separately disposed in the upper layer pixel chip 140A and the lower layer pixel chip 140B. As a result, since the light receiving surface of the photoelectric conversion section PD1 in the upper layer pixel chip 140A can be enlarged, the effective light receiving area for incident light can be enlarged to improve the photoelectric conversion efficiency (quantum efficiency), and the resolution of the RGB pixel 10 can be increased. Similarly, the photoelectric conversion section PD2, the transfer transistor 21, and the discharge transistor 25 in the IR pixel 20, and the reset transistor 22, the floating diffusion region FD2, the amplification transistor 23, and the selection transistor 24 are separately disposed in the upper layer pixel chip 140A and the lower layer pixel chip 140B. Therefore, the photoelectric conversion efficiency can be improved, and the resolution can be increased.

In addition, in the present example, in a case where both of all the RGB pixels 10 and the IR pixels 20 in the pixel array section 101 are configured by the all-pixel simultaneous driving method (so-called global shutter method), the types of transistors constituting the pixel circuit 110B can be made uniform by the RGB pixels 10 and the IR pixels 20, and thus, it is also possible to simplify the wiring layout of the common drive line LD3.

(Modification)

Figure 36:
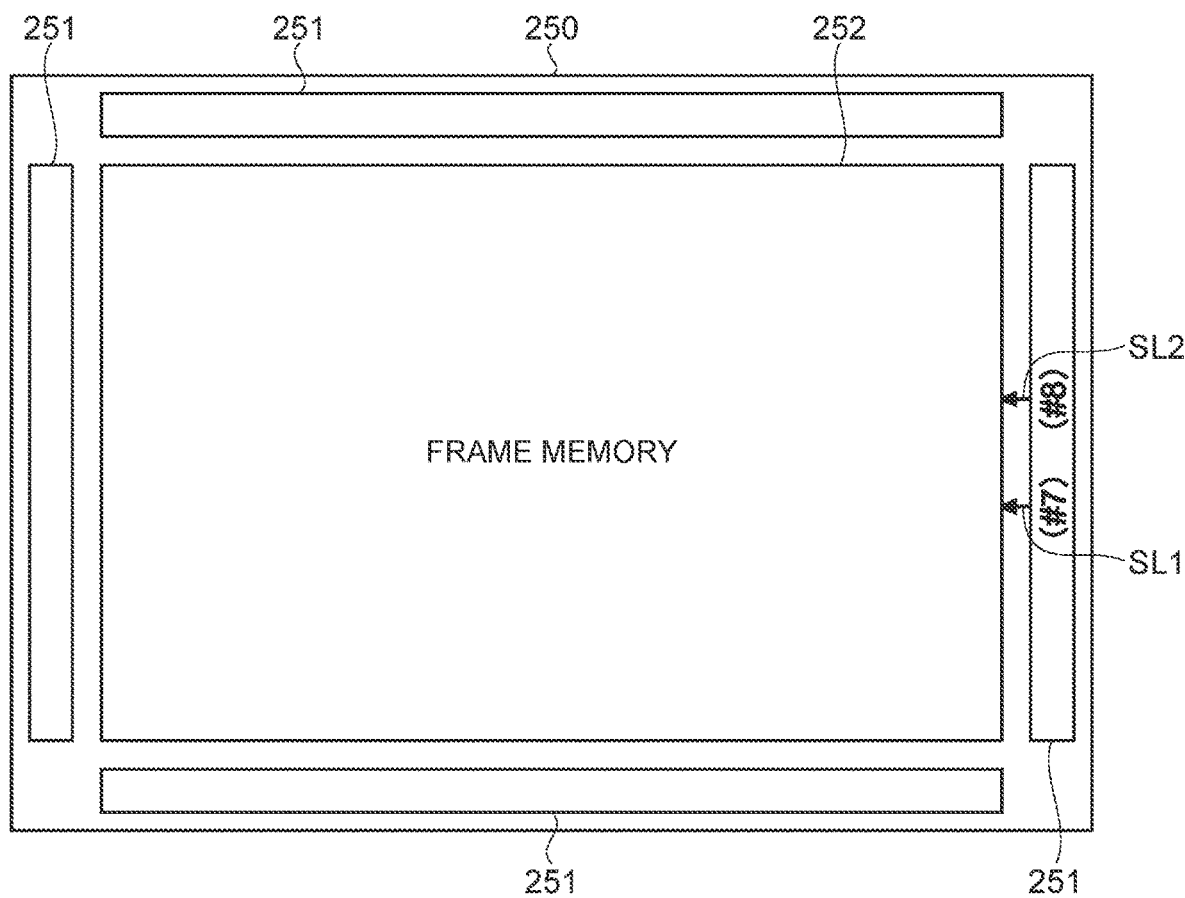
FIG. 36 is a diagram depicting a plan layout example of a circuit chip according to a modification of the 11th example the first embodiment.

Note that, in the 11th example, a case where the pixel chip 140 has a two-layer structure and has a three-layer structure as a whole has been exemplified, but the present invention is not limited to this. For example, in addition to the pixel chip 140 and the circuit chip 150, it is also possible to have a three-layer structure in which a circuit chip 250 in which a frame memory 252 is disposed as depicted in FIG. 36 is added. In such a configuration, for example, the color image data processed by the RGB data processing unit 182 can be stored in the frame memory 252 via a signal line SL1, and the monochrome image data processed by the IR data processing unit 192 can be stored in the frame memory 252 via a signal line SL2.

As described above, by incorporating the frame memory 252 in the image sensor 100, it is possible to realize a high-performance image sensor capable of high-speed reading. In that case, the circuit chip 250 may be disposed between the pixel chip 140 and the circuit chip 150, or may be disposed on the opposite side to the pixel chip 140 with the circuit chip 150 sandwiched between. In addition, in a case where the image sensor 100 has a stacked structure of four or more layers, the circuit chips 150 and 250 may be disposed in any layer of the second and subsequent layers.

1.12 Action and Effect

As described above, according to the first embodiment, the photoelectric conversion section PD1 of the RGB pixel 10 and the photoelectric conversion section PD2 of the IR pixel 20 are disposed in the light incident direction. As a result, it is possible to improve coaxiality with respect to incident light between the RGB pixel 10 and the IR pixel 20, and thus, it is possible to suppress spatial deviation occurring between the color image and the monochrome image. As a result, it is possible to improve accuracy of a result obtained by integrally processing information (color image and monochrome image) acquired by different sensors.

In addition, in some examples, it is possible to read out pixel signals from the RGB pixel 10 and the IR pixel 20 in the same unit pixel 110 simultaneously or substantially simultaneously, and thus, it is possible to suppress a temporal deviation between the color image obtained from the RGB pixel 10 and the monochrome image (IR image) obtained from the IR pixel 20. As a result, it is also possible to improve accuracy of a result obtained by integrally processing information (color image and monochrome image) acquired by different sensors.

2. Second Embodiment

Next, a second embodiment will be described in detail with reference to the drawings. Note that, in the following description, the same configurations as those of the above-described embodiment are cited, and redundant description is omitted.

In the first embodiment described above, a case where one IR pixel 20 is associated with one RGB pixel 10 has been described as an example. On the other hand, in the second embodiment, a case where a plurality of RGB pixels 10 is associated with one IR pixel 20 will be described as an example.

2.1 Configuration Example of Pixel Array Section

First, a configuration example of the pixel array section 101 according to the present embodiment will be described. Note that, here, similarly to the first embodiment, a case where a unit pixel 310 includes an RGB pixel for acquiring a color image of three primary colors of RGB and an IR pixel for acquiring a monochrome image of infrared (IR) light will be described as an example. In addition, the RGB pixels 10 are arranged according to, for example, the Bayer array.

Figure 37:
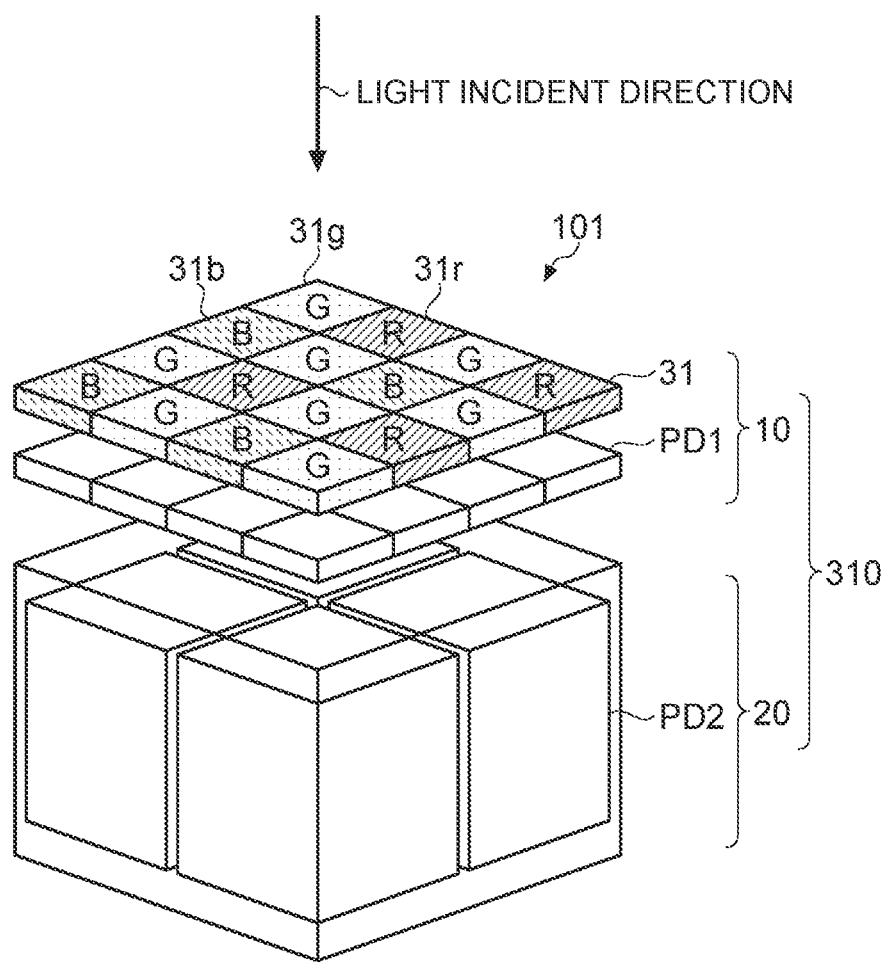
FIG. 37 is a schematic diagram depicting a schematic configuration example of a unit pixel according to a second embodiment.

FIG. 37 is a schematic diagram depicting a schematic configuration example of the pixel array section according to the present embodiment. As depicted in FIG. 37, the pixel array section 101 has a configuration in which unit pixels 310 having a structure in which one IR pixel 20 is disposed in the light incident direction with respect to four RGB pixels 10 arranged in two rows and two columns are arranged in a two-dimensional lattice shape. That is, in the present embodiment, one IR pixel 20 for four RGB pixels 10 positioned in the direction vertical to the arrangement direction (plane direction) of the unit pixels 310, and the light transmitted through four RGB pixels 10 positioned on the upstream side in the optical path of the incident light is configured to be incident on one IR pixel 20 positioned on the downstream side of four RGB pixels 10. Therefore, in the present embodiment, the optical axes of the incident light of the unit array of the Bayer array including four RGB pixels 10 and the IR pixel 20 coincide or substantially coincide with each other.

2.2 Circuit Configuration Example of Unit Pixel

Figure 38:
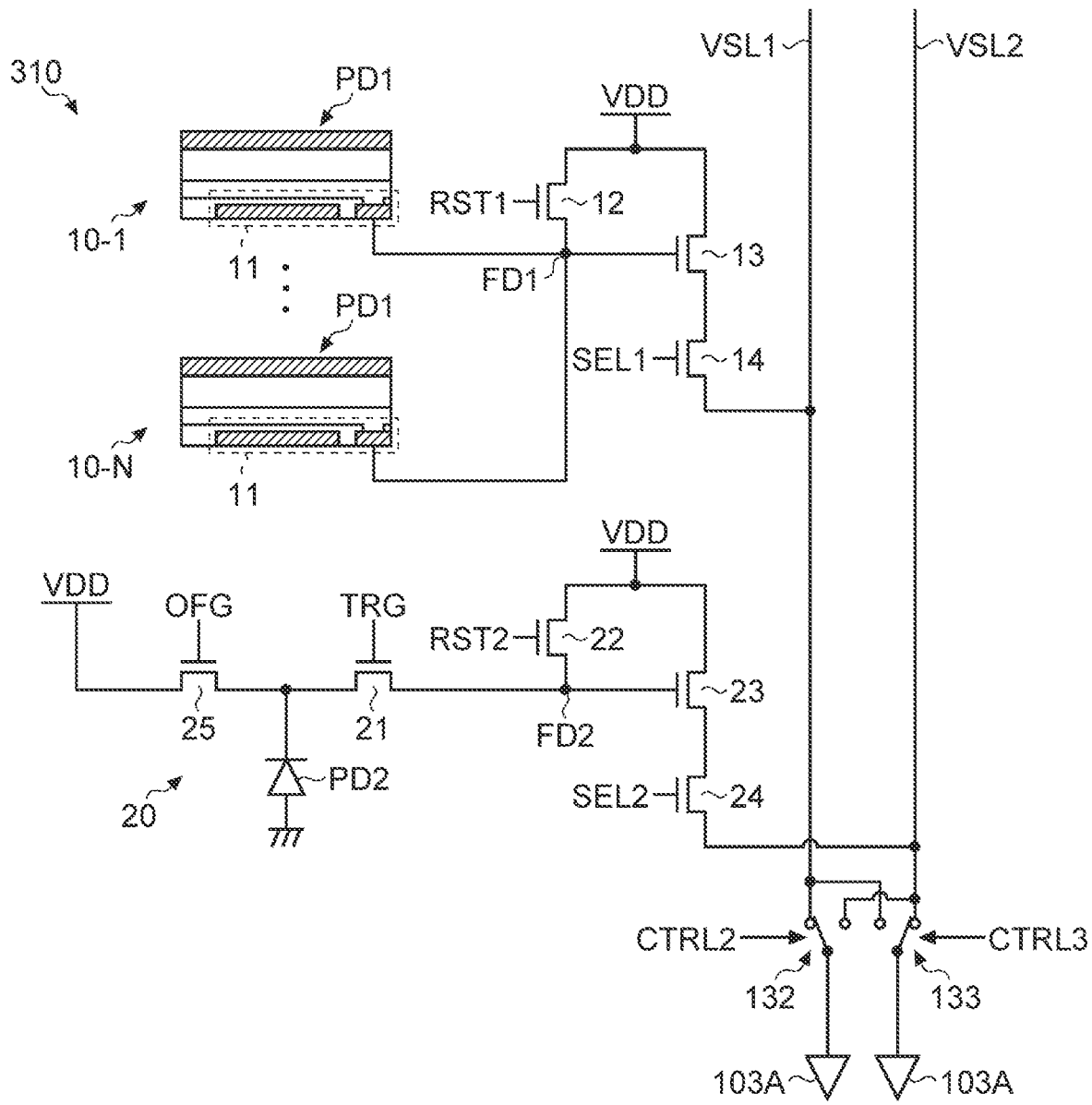
FIG. 38 is a circuit diagram depicting a schematic configuration example of a unit pixel according to the second embodiment.

FIG. 38 is a circuit diagram depicting a schematic configuration example of the unit pixel according to the present embodiment. Note that FIG. 38 is based on the unit pixel 110-2 according to the second modification described in the first embodiment with reference to FIG. 6, but is not limited to this, and may be based on any of the unit pixels 110 to 110-3.

As depicted in FIG. 38, the unit pixel 310 includes the plurality of RGB pixels 10-1 to 10-N (in FIG. 37, N is 4) and one IR pixel 20. As described above, in a case where one unit pixel 310 includes the plurality of RGB pixels 10, similarly to the third modification described with reference to FIG. 7 in the first embodiment, one pixel circuit (reset transistor 12, floating diffusion region FD1, amplification transistor 13, and selection transistor 14) can be shared by the plurality of RGB pixels 10 (pixel sharing). Therefore, in the present embodiment, the plurality of RGB pixels 10-1 to 10-N shares a pixel circuit including the reset transistor 12, the floating diffusion region FD1, the amplification transistor 13, and the selection transistor 14. That is, in the present embodiment, the plurality of photoelectric conversion sections PD1 and the transfer gate 11 are connected to the common floating diffusion region FD1.

2.3 Cross-Sectional Structure Example of Unit Pixel

Figure 39:
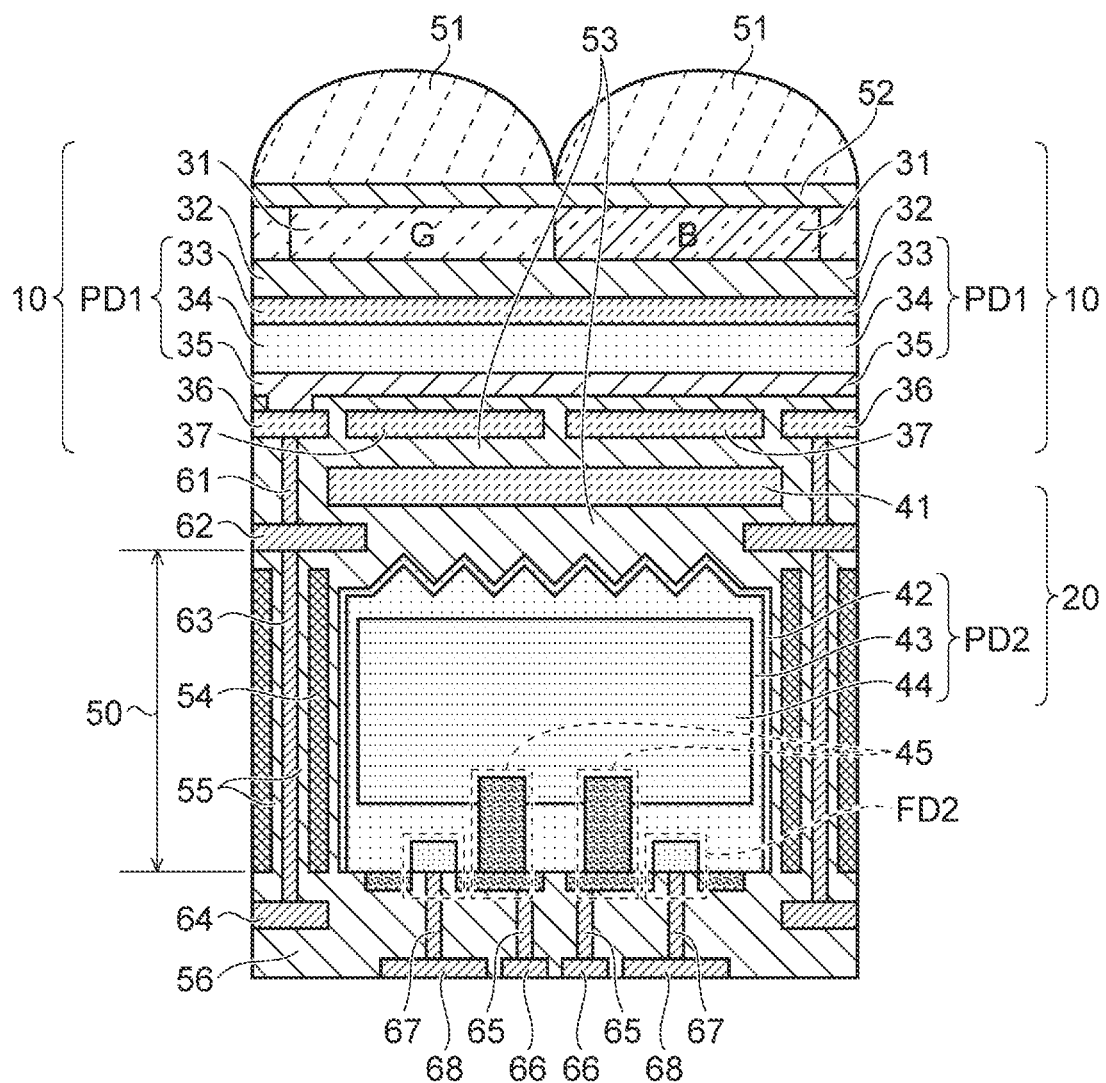
FIG. 39 is a cross-sectional diagram depicting a cross-sectional structure example of the image sensor according to the second embodiment.

FIG. 39 is a cross-sectional diagram depicting a cross-sectional structure example of the image sensor according to the present embodiment. Note that, in the present description, similarly to FIG. 37, a case where each unit pixel 310 includes four RGB pixels 10 arranged in two rows and two columns and one IR pixel 20 will be described as an example. In addition, in the following description, similarly to FIG. 8, a cross-sectional structure example will be described focusing on a semiconductor chip in which the photoelectric conversion sections PD1 and PD2 in the unit pixel 310 are formed. Furthermore, in the following description, structures similar to the cross-sectional structure of the image sensor 100 described with reference to FIG. 8 in the first embodiment are cited, and redundant description is omitted.

As depicted in FIG. 39, in the present embodiment, in a cross-sectional structure similar to the cross-sectional structure depicted in FIG. 8, the on-chip lens 51, the color filter 31, and the accumulation electrode 37 are divided into four in two rows and two columns (however, two out of four are depicted in FIG. 39.), configuring four RGB pixels 10. Note that the four RGB pixels 10 in each unit pixel 310 may constitute a basic array of the Bayer array.

2.4 Planar Structure Example

Figure 40:
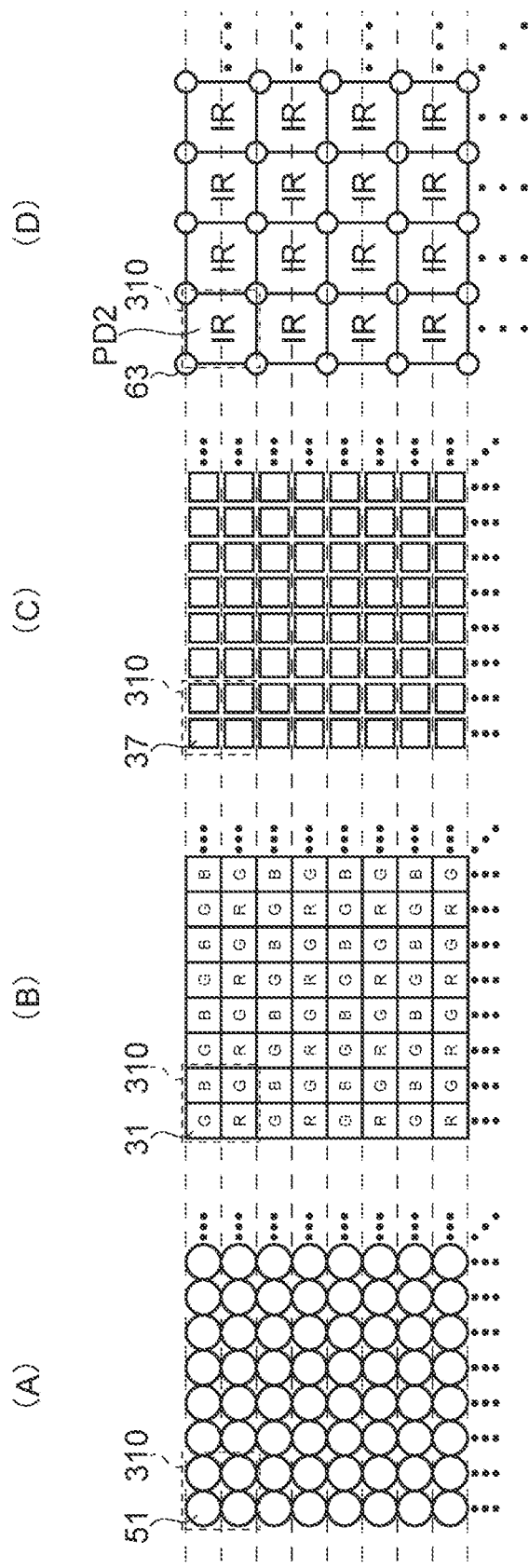
FIG. 40 is a diagram depicting a plan layout example of each layer of a pixel array section according to the second embodiment.

FIG. 40 is a diagram depicting a plan layout example of each layer of the pixel array section according to the present embodiment, in which (A) depicts a plan layout example of the on-chip lens 51, (B) depicts a plan layout example of the color filter 31, (C) depicts a plan layout example of the accumulation electrode 37, and (D) depicts a plan layout example of the photoelectric conversion section PD2. Note that, in FIG. 40, (A) to (D) depict plan layout examples of surfaces parallel to the element formation surface of the semiconductor substrate 50.

As depicted in (A) to (D) of FIG. 40, in the present embodiment, four on-chip lenses 51, four color filters 31, four accumulation electrodes 37, and one photoelectric conversion section PD2 are provided for one unit pixel 310. Note that, in the present description, one accumulation electrode 37 corresponds to one RGB pixel 10, and one photoelectric conversion section PD2 corresponds to one IR pixel 20.

As described above, in one unit pixel 110, by arranging the basic array of the Bayer array including four RGB pixels 10 and one IR pixel 20 along the traveling direction of the incident light, it is possible to improve coaxiality with respect to the incident light between each RGB pixel 10 and the IR pixel 20, and thus, it is possible to suppress spatial deviation occurring between the color image and the monochrome image. As a result, it is possible to improve accuracy of a result obtained by integrally processing information (color image and monochrome image) acquired by different sensors.

2.5 Modification of On-Chip Lens

Figure 41:
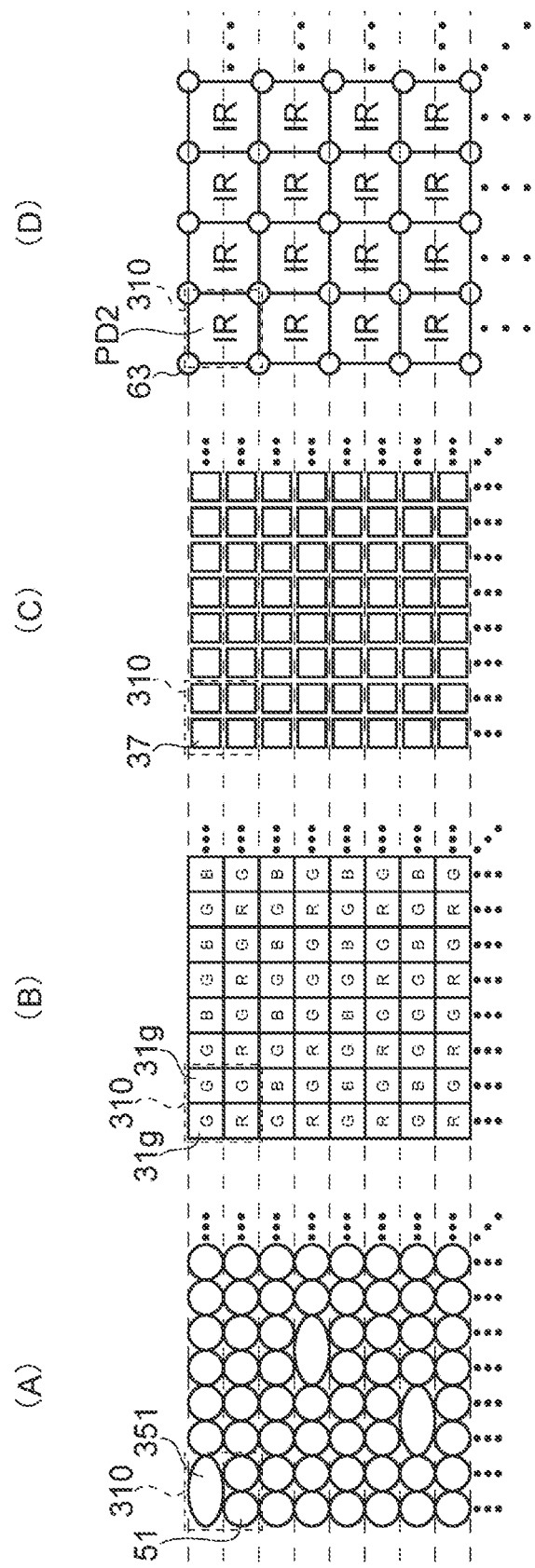
FIG. 41 is a diagram depicting a plan layout example of each layer of a pixel array section according to a modification of an on-chip lens of the second embodiment.

In the second embodiment described above, the case where one on-chip lens 51 is provided for one RGB pixel 10 has been exemplified, but the present invention is not limited to this, and one on-chip lens may be provided for the plurality of RGB pixels 10. FIG. 41 is a diagram depicting a plan layout example of each layer of a pixel array section according to a modification of the on-chip lens of the second embodiment, and similarly to FIG. 40, (A) depicts a plan layout example of the on-chip lens 51, (B) depicts a plan layout example of the color filter 31, (C) depicts a plan layout example of the accumulation electrode 37, and (D) depicts a plan layout example of the photoelectric conversion section PD2.

In the modification of the on-chip lens depicted in FIG. 41, as depicted in (A), the two on-chip lenses 51 arranged in the row direction in some unit pixels 310 among the plurality of unit pixels 310 are replaced with one on-chip lens 351 of 2×1 pixels straddling the two RGB pixels 10. In addition, as depicted in (B) of FIG. 41, in the two RGB pixels 10 sharing the on-chip lens 351, the color filter 31 that selectively transmits the same wavelength component is provided. In the example depicted in (B) of FIG. 41, in the upper left unit pixel 310, a color filter 31b that selectively transmits the blue (B) wavelength component originally in the Bayer array is replaced with a color filter 31g that selectively transmits the green (G) wavelength component, and thus, the color filters 31 of the two RGB pixels 10 sharing the on-chip lens 351 are unified to the color filter 31g.

Note that, for the RGB pixels 10 in which the color filters 31 are replaced in this manner, the pixel values of the wavelength components to be originally detected according to the Bayer array may be interpolated from, for example, the pixel values of surrounding pixels. For this pixel interpolation, various methods such as linear interpolation may be used.

In addition, in the modification of the on-chip lens, a case where the two on-chip lenses 51 arranged in the row direction are made common is exemplified, but the present invention is not limited to this, and various modifications such as a configuration in which the two on-chip lenses 51 arranged in the column direction are made common or a configuration in which all of the four on-chip lenses 51 included in one unit pixel 310 are replaced with one on-chip lens can be made. In that case, the color filter 31 that selectively transmits the same wavelength component may be used as the color filter 31 of the RGB pixels 10 that share the on-chip lens.

Furthermore, the sharing of the on-chip lens 51 between the adjacent RGB pixels 10 is not limited to the second embodiment, and can also be applied to the first embodiment.

2.6 Modification of Color Filter Array

In addition, in the above-described embodiment and its modifications, the Bayer array has been exemplified as the filter array of the color filters 31, but the present invention is not limited to this. For example, various filter arrays such as a 3×3 pixel color filter array adopted in an X-Trans (registered trademark) CMOS sensor, a 4×4 pixel quad Bayer array (also referred to as a Quadra array), and a 4×4 pixel color filter array (also referred to as a white RGB array) in which a white RGB color filter is combined with a Bayer array may be used.

Figure 42:
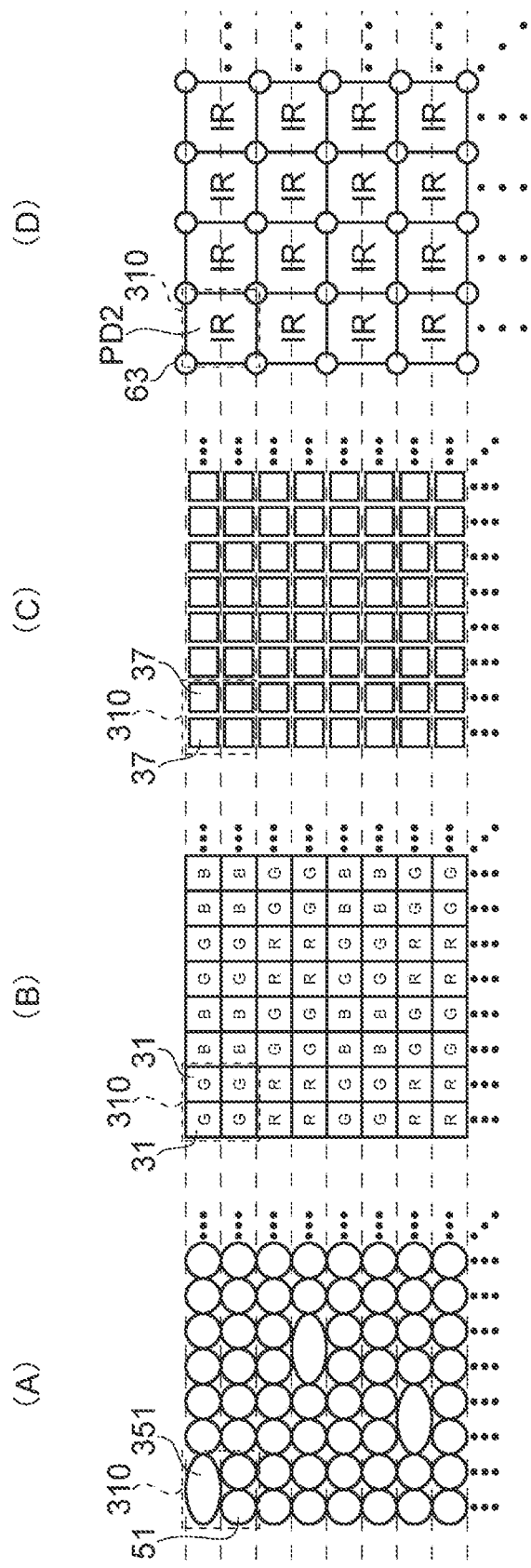
FIG. 42 is a diagram depicting a plan layout example of each layer of a pixel array section according to a modification of a color filter array of the second embodiment.

FIG. 42 is a diagram depicting a plan layout example of each layer of a pixel array section according to a modification of the color filter array of the second embodiment, and similarly to FIGS. 40 and 41, (A) depicts a plan layout example of the on-chip lens 51, (B) depicts a plan layout example of the color filter 31, (C) depicts a plan layout example of the accumulation electrode 37, and (D) depicts a plan layout example of the photoelectric conversion section PD2.

In the modification of the color filter array depicted in FIG. 42, as depicted in (B), a Quadra array of 4×4 pixels in total in which each color filter 31 in the Bayer array of 2×2 pixels is divided into 2×2 pixels is depicted as the color filter array. In such a Quadra array, as depicted in (A) of FIG. 42, even in a case where the on-chip lens 51 is made common by two adjacent RGB pixels 10, since the color filters 31 in these RGB pixels 10 are originally aligned as depicted in (B), it is not necessary to change the array of the color filters 31, and thus, there is no need to perform pixel interpolation.

2.7 Action and Effect

As described above, according to the second embodiment, four photoelectric conversion sections PD1 of four RGB pixels 10 and one photoelectric conversion section PD2 of one IR pixels 20 are disposed in the light incident direction. Even in such a configuration, similarly to the first embodiment, it is possible to improve coaxiality with respect to incident light between the RGB pixel 10 and the IR pixel 20, and thus, it is possible to suppress spatial deviation occurring between the color image and the monochrome image. As a result, it is possible to improve accuracy of a result obtained by integrally processing information (color image and monochrome image) acquired by different sensors.

In addition, similarly to the first embodiment, it is also possible to read out pixel signals from the RGB pixel 10 and the IR pixel 20 in the same unit pixel 110 simultaneously or substantially simultaneously, and thus, it is possible to suppress a temporal deviation between the color image obtained from the RGB pixel 10 and the monochrome image (IR image) obtained from the IR pixel 20. As a result, it is also possible to improve accuracy of a result obtained by integrally processing information (color image and monochrome image) acquired by different sensors.

Other configurations, operations, and effects may be similar to those of the first embodiment described above, and thus detailed description will be omitted here.

3. Application Example to Mobile Body

The technology according to the present disclosure can be applied to various products. For example, the technology according to the present disclosure may be realized by devices mounted on any type of mobile body such as an automobile, an electric car, a hybrid electric car, a motorcycle, a bicycle, a personal mobility, an airplane, a drone, a ship, and a robot.

Figure 43:
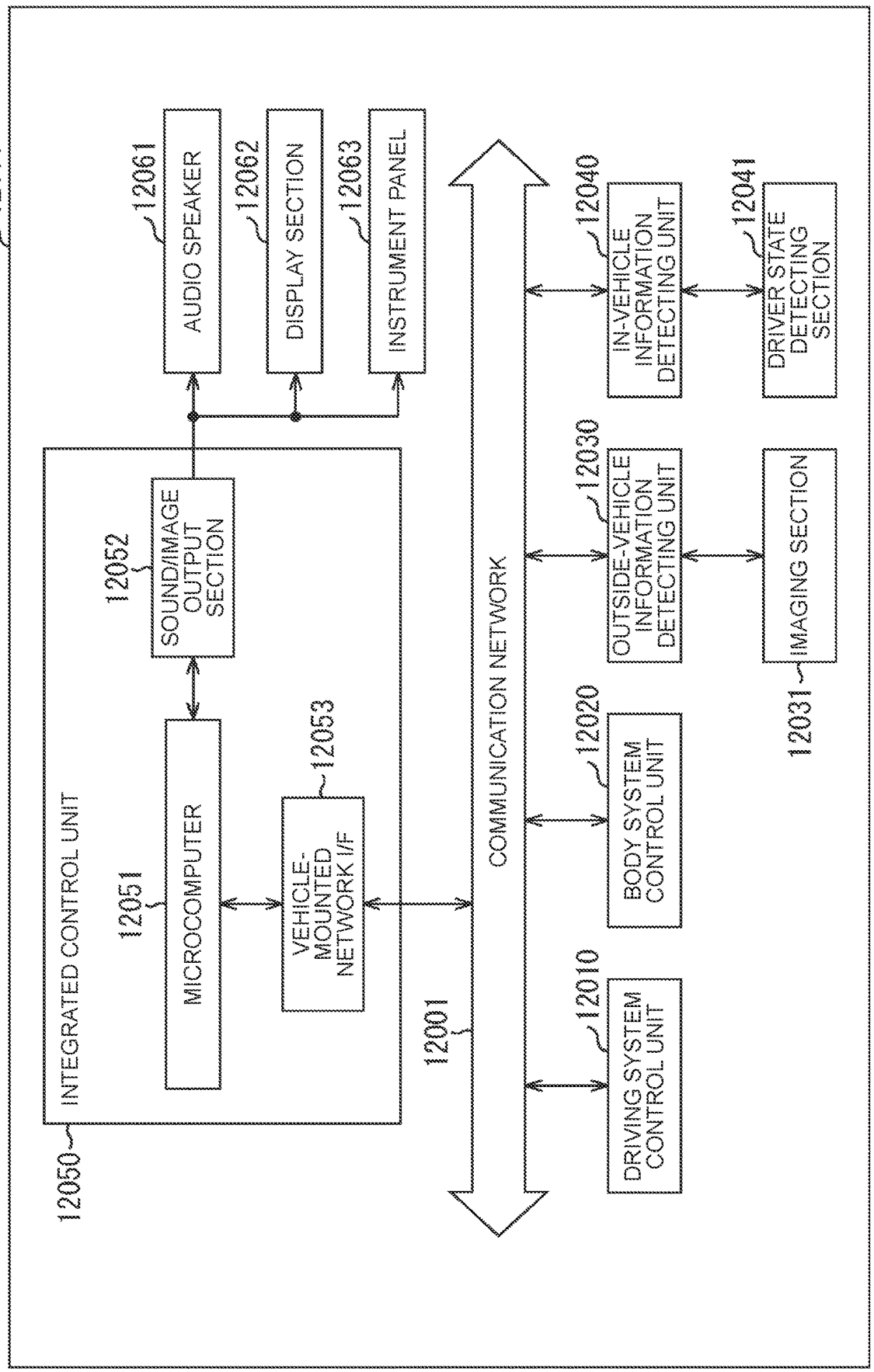
FIG. 43 is a block diagram depicting an example of schematic configuration of a vehicle control system.

FIG. 43 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 43, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 43, an audio speaker 12061, a display section 12062, and an instrument panel 12063 are illustrated as the output device. The display section 12062 may, for example, include at least one of an on-board display and a head-up display.

Figure 44:
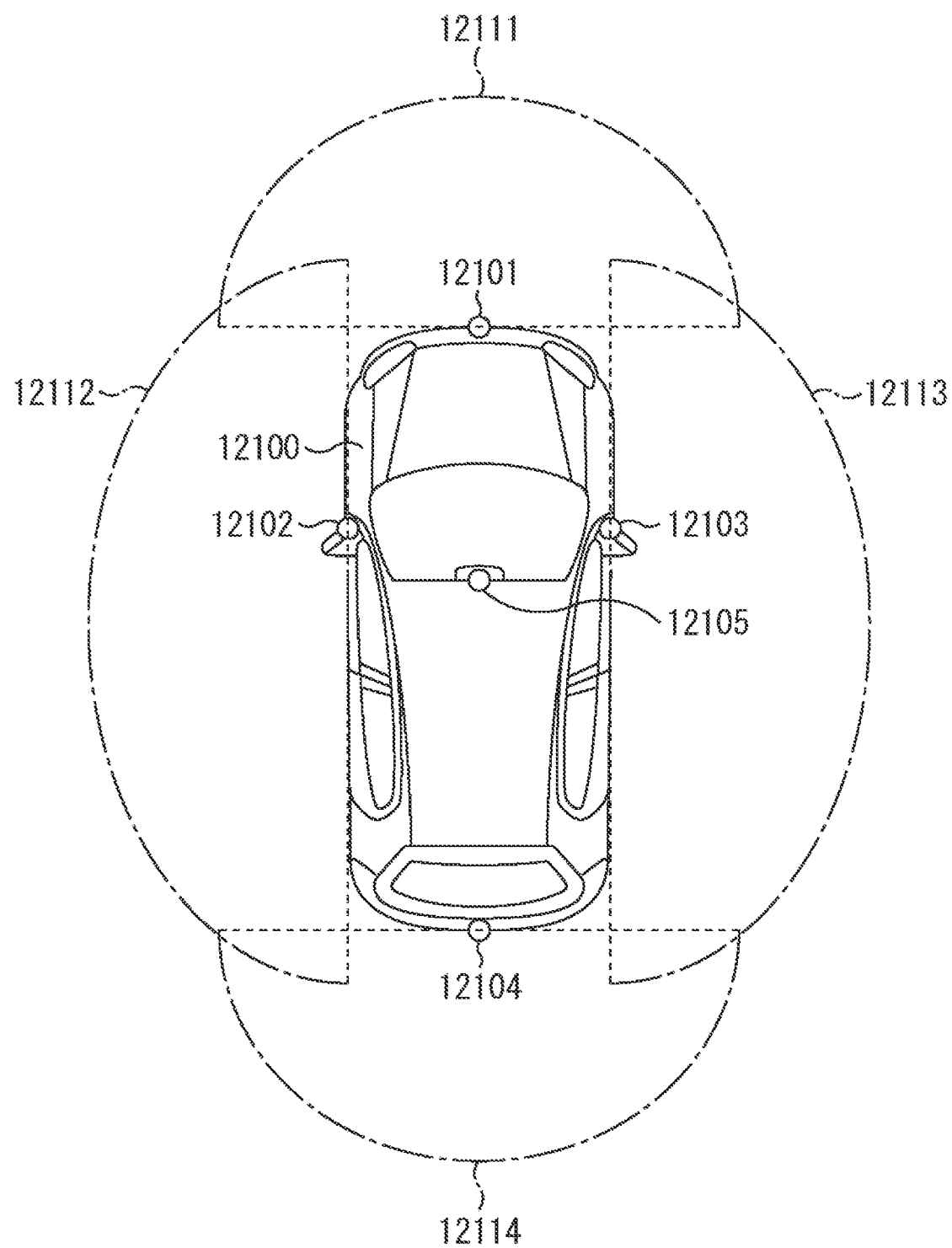
FIG. 44 is a diagram of assistance in explaining an example of installation positions of an outside-vehicle information detecting section and an imaging section.

FIG. 44 is a diagram depicting an example of the installation position of the imaging section 12031.

In FIG. 44, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 44 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure may be applied to, the imaging section 12031 among the above-described configurations. Specifically, the imaging sections 12101, 12102, 12103, 12104, 12105, and the like depicted in FIG. 44 may be mounted on the vehicle 12100. By applying the technology according to the present disclosure to the imaging sections 12101, 12102, 12103, 12104, 12105, and the like, it is possible to improve accuracy of a result obtained by integrally processing information (for example, color image and monochrome image) acquired by different sensors.

Although the embodiments of the present disclosure have been described above, the technical scope of the present disclosure is not limited to the above-described embodiments as it is, and various modifications can be made without departing from the gist of the present disclosure. In addition, components of different embodiments and modifications may be appropriately combined.

In addition, the effects of the embodiments described in the present specification are merely examples and are not limited, and other effects may be provided.

Note that the present technology can also have the configuration below.

(1)

A solid-state imaging device including:
a first sensor that detects light in a first wavelength band; and
a second sensor that detects light of a second wavelength band different from the first wavelength band, wherein
the first sensor includes a first pixel that detects light of the first wavelength band in incident light, and
the second sensor includes a second pixel that detects light in the second wavelength band that has transmitted through the first pixel among the incident light.

(2)

The solid-state imaging device according to (1), wherein
the first pixel includes a first photoelectric conversion section that photoelectrically converts the light of the first wavelength band,
the second pixel includes a second photoelectric conversion section that photoelectrically converts the light of the second wavelength band, and
the second photoelectric conversion section is disposed on a surface side of the first photoelectric conversion section opposite to a light incident surface of the first wavelength band.

(3) The solid-state imaging device according to (2), including:
a first chip including the first pixel and the second pixel; and
a second chip including a driving unit that drives the first pixel and the second pixel, and a readout section that reads out a pixel signal from the first pixel and the second pixel, wherein
the first chip and the second chip are stacked chips configured by being bonded to each other.

(4)

The solid-state imaging device according to (3), wherein
the first chip is a stacked chip configured by bonding a third chip including the first photoelectric conversion section and the second photoelectric conversion section and a fourth chip including a first pixel circuit connected to the first photoelectric conversion section and a second pixel circuit connected to the second photoelectric conversion section.

(5)

The solid-state imaging device according to (3) or (4), wherein
the driving unit includes
a first driving unit that supplies a control signal to the first pixel, and
a second driving unit that supplies a control signal to the second pixel, and
the readout section includes
a first readout section that reads out the first pixel signal generated by the first pixel, and
a second readout section that reads out the second pixel signal generated by the second pixel.

(6)

The solid-state imaging device according to (5), wherein
the first driving unit and the second driving unit are disposed in adjacent regions in the second chip, and
the first readout section and the second readout section are disposed in adjacent regions in the second chip.

(7)

The solid-state imaging device according to (5), wherein
the first readout section and the second readout section are disposed in adjacent regions close to a center of the second chip, and
the first driving unit and the second driving unit are separately disposed in two regions sandwiching the region in which the first readout section and the second readout section are disposed in the second chip.

(8)

The solid-state imaging device according to (5), wherein
the driving unit further includes a third driving unit that supplies a common control signal to the first pixel and the second pixel.

(9)
The solid-state imaging device according to (8), wherein
the first driving unit, the second driving unit, and the third driving unit are disposed in adjacent regions in the second chip, and
the first readout section and the second readout section are disposed in adjacent regions in the second chip.

(10)
The solid-state imaging device according to (8), wherein
two of the first driving unit to the third driving unit are disposed in adjacent regions in the second chip,
the first readout section and the second readout section are disposed in adjacent regions in the second chip and adjacent to the region where the two of the first driving unit to the third driving unit are disposed, and
a remaining one of the first driving unit to the third driving unit is disposed in a region opposite to the region where the two of the first driving unit to the third driving unit are disposed with a region where the first readout section and the second readout section are disposed in the second chip sandwiched between.

(11)
The solid-state imaging device according to (3) or (4), wherein
the driving unit supplies a common control signal to the first pixel and the second pixel, and
the readout section includes
a first readout section that reads out a first pixel signal generated by the first pixel, and
a second readout section that reads out a second pixel signal generated by the second pixel.

(12)
The solid-state imaging device according to (3) or (4), wherein
the driving unit includes
a first driving unit that supplies a control signal to the first pixel, and
a second driving unit that supplies a control signal to the second pixel, and
the readout section reads out a first pixel signal generated by the first pixel and a second pixel signal generated by the second pixel.

(13)
The solid-state imaging device according to (12), wherein
the readout section is disposed in an adjacent region close to the center of the second chip, and
the first driving unit and the second driving unit are separately disposed in two regions sandwiching the region in which the readout section is disposed in the second chip.

(14)
The solid-state imaging device according to (3) or (4), wherein
the driving unit includes
a first driving unit that supplies a control signal to the first pixel,
a second driving unit that supplies a control signal to the second pixel, and
a third driving unit that supplies a common control signal to the first pixel and the second pixel, and
the readout section includes
a first readout section that reads out a first pixel signal generated by a part of a plurality of the first pixels, and
a second readout section that reads out a first pixel signal generated by a rest of the plurality of first pixels and a second pixel signal generated by the second pixel.

(15)
The solid-state imaging device according to (14), wherein
the part of the plurality of first pixels is connected to the first readout section via a first signal line extending in a third direction in the first chip, and the rest is connected to the second readout section via a second signal line extending in a fourth direction opposite to the third direction.

(16)
The solid-state imaging device according to (3) or (4), wherein
the driving unit includes
a first driving unit that supplies a control signal to the first pixel,
a second driving unit that supplies a control signal to the second pixel, and
a third driving unit that supplies a common control signal to the first pixel and the second pixel, and
the readout section reads a first pixel signal generated by the first pixel and a second pixel signal generated by the second pixel.

(17)
The solid-state imaging device according to any one of (3) to (16), wherein
a first drive line that supplies a control signal output from the driving unit to the first pixel extends in a first direction in the first chip, and
a second drive line that supplies a control signal output from the driving unit to the second pixel extends in a second direction orthogonal to the first direction in the first chip.

(18)
The solid-state imaging device according to any one of (1) to (17), wherein
the first sensor includes a plurality of the first pixels for one second pixel in the second sensor.

(19)
The solid-state imaging device according to (3) or (4), further including:
a fifth chip including a frame memory that holds data output from the readout section, wherein
the fifth chip is bonded between the first chip and the second chip or on a side opposite to the first chip sandwiching the second chip.

(20)
An electronic apparatus including:
a solid-state imaging device according to any one of (1) to (19); and
a processor that processes first image data acquired by the first sensor and output from the solid-state imaging device and second image data acquired by the second sensor and output from the solid-state imaging device.

REFERENCE SIGNS LIST

1 ELECTRONIC APPARATUS
2 IMAGING LENS
3 STORAGE SECTION
4 PROCESSOR
10, 10-1 to 10-N, 10A, 10B RGB PIXEL
11 TRANSFER GATE
12, 22 RESET TRANSISTOR
13, 23 AMPLIFICATION TRANSISTOR
14, 24 SELECTION TRANSISTOR
20, 20-1 to 20-N, 20A, 20B IR PIXEL
25 DISCHARGE TRANSISTOR
31, 31r, 31g, 31b COLOR FILTER
32 SEALING FILM

33 TRANSPARENT ELECTRODE
34 PHOTOELECTRIC CONVERSION FILM
35 SEMICONDUCTOR LAYER
36 READOUT ELECTRODE
37 ACCUMULATION ELECTRODE
41 IR FILTER
42 p-WELL REGION
43 p-TYPE SEMICONDUCTOR REGION
44 n-TYPE SEMICONDUCTOR REGION
45 LONGITUDINAL TRANSISTOR
50 SEMICONDUCTOR SUBSTRATE
51, 351 ON-CHIP LENS
52 PLANARIZATION FILM
53 INSULATING LAYER
54 PIXEL ISOLATION SECTION
55 FIXED CHARGE FILM
56 INTERLAYER INSULATING FILM
61 to 68 WIRING
100 SOLID-STATE IMAGING DEVICE (IMAGE SENSOR)
101 PIXEL ARRAY SECTION
102 PIXEL DRIVE CIRCUIT
103 SIGNAL PROCESSING CIRCUIT
103A AD CONVERSION CIRCUIT
104 COLUMN DRIVE CIRCUIT
105 SYSTEM CONTROL SECTION
108 DATA PROCESSING UNIT
109 DATA STORAGE SECTION
110, 110-1 to 110-3, 310 UNIT PIXEL
110A LIGHT RECEIVING SECTION
110B PIXEL CIRCUIT
131, 132, 133 SWITCH CIRCUIT
140 PIXEL CHIP
141, 141A, 141B, 151, 251 CONNECTING SECTION
150, 250 CIRCUIT CHIP
160 RGB DRIVE CIRCUIT
161, 171, 201 TG DRIVING UNIT
162, 172, 202 RST DRIVING UNIT
164, 174, 204 SEL DRIVING UNIT
170 IR DRIVE CIRCUIT
175, 205 OFG DRIVING UNIT
181 RGB SIGNAL PROCESSING CIRCUIT
182 RGB DATA PROCESSING UNIT
191 IR SIGNAL PROCESSING CIRCUIT
192 IR DATA PROCESSING UNIT
200 COMMON DRIVE CIRCUIT
252 FRAME MEMORY
210 COMMON SIGNAL PROCESSING CIRCUIT
FD1, FD2 FLOATING DIFFUSION REGION
LD PIXEL DRIVE LINE
LD1 RGB DRIVE LINE
LD2 IR DRIVE LINE
LD3 COMMON DRIVE LINE
LD3a, LD3b DRIVE LINE
PD1, PD2 PHOTOELECTRIC CONVERSION SECTION
SL1, SL2 SIGNAL LINE
VSL, VSL1, VSL2, VSL3 VERTICAL SIGNAL LINE

The invention claimed is:

1. A solid-state imaging device comprising:
a first sensor that detects light in a first wavelength band;
a second sensor that detects light of a second wavelength band different from the first wavelength band, wherein
the first sensor includes a first pixel that detects light of the first wavelength band in incident light, and
the second sensor includes a second pixel that detects light in the second wavelength band that has transmitted through the first pixel among the incident light,
the first pixel includes a first photoelectric conversion section that photoelectrically converts the light of the first wavelength band,
the second pixel includes a second photoelectric conversion section that photoelectrically converts the light of the second wavelength band, and
the second photoelectric conversion section is disposed on a surface side of the first photoelectric conversion section opposite to a light incident surface of the first wavelength band;
a first chip including the first pixel and the second pixel; and
a second chip including a driving unit that drives the first pixel and the second pixel, and a readout section that reads out a pixel signal from the first pixel and the second pixel, wherein
the first chip and the second chip are stacked chips configured by being bonded to each other, and wherein
the driving unit includes
a first driving unit that supplies a control signal to the first pixel, and
a second driving unit that supplies a control signal to the second pixel, and
the readout section includes
a first readout section that reads out the first pixel signal generated by the first pixel, and
a second readout section that reads out the second pixel signal generated by the second pixel.

2. The solid-state imaging device according to claim 1, wherein
the first driving unit and the second driving unit are disposed in adjacent regions in the second chip, and
the first readout section and the second readout section are disposed in adjacent regions in the second chip.

3. The solid-state imaging device according to claim 1, wherein
the first readout section and the second readout section are disposed in adjacent regions close to a center of the second chip, and
the first driving unit and the second driving unit are separately disposed in two regions sandwiching the region in which the first readout section and the second readout section are disposed in the second chip.

4. The solid-state imaging device according to claim 1, wherein
the driving unit further includes a third driving unit that supplies a common control signal to the first pixel and the second pixel.

5. The solid-state imaging device according to claim 4, wherein
the first driving unit, the second driving unit, and the third driving unit are disposed in adjacent regions in the second chip, and
the first readout section and the second readout section are disposed in adjacent regions in the second chip.

6. The solid-state imaging device according to claim 4, wherein
two of the first driving unit to the third driving unit are disposed in adjacent regions in the second chip,
the first readout section and the second readout section are disposed in adjacent regions in the second chip and adjacent to the region where the two of the first driving unit to the third driving unit are disposed, and a remaining one of the first driving unit to the third driving unit is disposed in a region opposite to the region where the two of the first driving unit to the third driving unit are disposed with a region where the first readout section and the second readout section are disposed in the second chip sandwiched between.

7. The solid-state imaging device according claim 1, wherein
a first drive line that supplies the control signal output from the driving unit to the first pixel extends in a first direction in the first chip, and
a second drive line that supplies the control signal output from the driving unit to the second pixel extends in a second direction orthogonal to the first direction in the first chip.

8. The solid-state imaging device according to claim 1, wherein
the first sensor includes a plurality of the first pixels for one second pixel in the second sensor.

9. The solid-state imaging device according to claim 1, further including:
a fifth chip including a frame memory that holds data output from the readout section, wherein
the fifth chip is bonded between the first chip and the second chip or on a side opposite to the first chip sandwiching the second chip.

10. An electronic apparatus including:
a solid-state imaging device according to claim 1, and
a processor that processes first image data acquired by the first sensor and output from the solid-state imaging device and second image data acquired by the second sensor and output from the solid-state imaging device.

11. A solid-state imaging device comprising:
a first sensor that detects light in a first wavelength band;
a second sensor that detects light of a second wavelength band different from the first wavelength band, wherein
the first sensor includes a first pixel that detects light of the first wavelength band in incident light, and
the second sensor includes a second pixel that detects light in the second wavelength band that has transmitted through the first pixel among the incident light,
the first pixel includes a first photoelectric conversion section that photoelectrically converts the light of the first wavelength band,
the second pixel includes a second photoelectric conversion section that photoelectrically converts the light of the second wavelength band, and
the second photoelectric conversion section is disposed on a surface side of the first photoelectric conversion section opposite to a light incident surface of the first wavelength band;
a first chip including the first pixel and the second pixel; and
a second chip including a driving unit that drives the first pixel and the second pixel, and a readout section that reads out a pixel signal from the first pixel and the second pixel, wherein
the first chip and the second chip are stacked chips configured by being bonded to each other, and wherein
the driving unit supplies a common control signal to the first pixel and the second pixel, and
the readout section includes
a first readout section that reads out a first pixel signal generated by the first pixel, and
a second readout section that reads out a second pixel signal generated by the second pixel.

12. A solid-state imaging device comprising:
a first sensor that detects light in a first wavelength band;
a second sensor that detects light of a second wavelength band different from the first wavelength band, wherein
the first sensor includes a first pixel that detects light of the first wavelength band in incident light, and
the second sensor includes a second pixel that detects light in the second wavelength band that has transmitted through the first pixel among the incident light,
the first pixel includes a first photoelectric conversion section that photoelectrically converts the light of the first wavelength band,
the second pixel includes a second photoelectric conversion section that photoelectrically converts the light of the second wavelength band, and
the second photoelectric conversion section is disposed on a surface side of the first photoelectric conversion section opposite to a light incident surface of the first wavelength band;
a first chip including the first pixel and the second pixel; and
a second chip including a driving unit that drives the first pixel and the second pixel, and a readout section that reads out a pixel signal from the first pixel and the second pixel, wherein
the first chip and the second chip are stacked chips configured by being bonded to each other, and
wherein the driving unit includes
a first driving unit that supplies a control signal to the first pixel, and
a second driving unit that supplies a control signal to the second pixel, and
the readout section reads out a first pixel signal generated by the first pixel and a second pixel signal generated by the second pixel.

13. The solid-state imaging device according to claim 12, wherein
the readout section is disposed in an adjacent region close to the center of the second chip, and
the first driving unit and the second driving unit are separately disposed in two regions sandwiching the region in which the readout section is disposed in the second chip.

14. A solid-state imaging device comprising:
a first sensor that detects light in a first wavelength band;
a second sensor that detects light of a second wavelength band different from the first wavelength band, wherein
the first sensor includes a first pixel that detects light of the first wavelength band in incident light, and
the second sensor includes a second pixel that detects light in the second wavelength band that has transmitted through the first pixel among the incident light,
the first pixel includes a first photoelectric conversion section that photoelectrically converts the light of the first wavelength band,
the second pixel includes a second photoelectric conversion section that photoelectrically converts the light of the second wavelength band, and
the second photoelectric conversion section is disposed on a surface side of the first photoelectric conversion section opposite to a light incident surface of the first wavelength band;
a first chip including the first pixel and the second pixel; and
a second chip including a driving unit that drives the first pixel and the second pixel, and a readout section that reads out a pixel signal from the first pixel and the second pixel, wherein the first chip and the second chip are stacked chips configured by being bonded to each other, and wherein the driving unit includes a first driving unit that supplies a control signal to the first pixel, a second driving unit that supplies a control signal to the second pixel, and a third driving unit that supplies a common control signal to the first pixel and the second pixel, and the readout section includes a first readout section that reads out a first pixel signal generated by a part of a plurality of the first pixels, and a second readout section that reads out a first pixel signal generated by a rest of the plurality of first pixels and a second pixel signal generated by the second pixel.

15. The solid-state imaging device according to claim 14, wherein the part of the plurality of first pixels is connected to the first readout section via a first signal line extending in a third direction in the first chip, and the rest is connected to the second readout section via a second signal line extending in a fourth direction opposite to the third direction.

16. A solid-state imaging device comprising:

a first sensor that detects light in a first wavelength band;

a second sensor that detects light of a second wavelength band different from the first wavelength band, wherein the first sensor includes a first pixel that detects light of the first wavelength band in incident light, and the second sensor includes a second pixel that detects light in the second wavelength band that has transmitted through the first pixel among the incident light, the first pixel includes a first photoelectric conversion section that photoelectrically converts the light of the first wavelength band, the second pixel includes a second photoelectric conversion section that photoelectrically converts the light of the second wavelength band, and the second photoelectric conversion section is disposed on a surface side of the first photoelectric conversion section opposite to a light incident surface of the first wavelength band;

a first chip including the first pixel and the second pixel; and a second chip including a driving unit that drives the first pixel and the second pixel, and a readout section that reads out a pixel signal from the first pixel and the second pixel, wherein the first chip and the second chip are stacked chips configured by being bonded to each other, and wherein the driving unit includes a first driving unit that supplies a control signal to the first pixel, a second driving unit that supplies a control signal to the second pixel, and a third driving unit that supplies a common control signal to the first pixel and the second pixel, and the readout section reads a first pixel signal generated by the first pixel and a second pixel signal generated by the second pixel.

* * * * *